US009752932B2

(12) United States Patent
Fontecchio et al.

(10) Patent No.: US 9,752,932 B2
(45) Date of Patent: Sep. 5, 2017

(54) TUNABLE ELECTRO-OPTIC FILTER STACK

(75) Inventors: Adam K. Fontecchio, Downingtown, PA (US); Sameet K. Shriyan, Philadelphia, PA (US); Alyssa Bellingham, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 121 days.

(21) Appl. No.: 13/881,608

(22) PCT Filed: Oct. 29, 2011

(86) PCT No.: PCT/US2011/058483
§ 371 (c)(1),
(2), (4) Date: Jul. 9, 2013

(87) PCT Pub. No.: WO2012/058652
PCT Pub. Date: May 3, 2012

(65) Prior Publication Data
US 2014/0354996 A1    Dec. 4, 2014

Related U.S. Application Data

(60) Provisional application No. 61/408,184, filed on Oct. 29, 2010.

(51) Int. Cl.
*G01N 21/25* (2006.01)
*G01J 3/02* (2006.01)
(Continued)

(52) U.S. Cl.
CPC ............ *G01J 3/0237* (2013.01); *G01J 3/502* (2013.01); *G01J 3/51* (2013.01); *G02B 27/0103* (2013.01);
(Continued)

(58) Field of Classification Search
CPC . G01J 3/0237; G01J 3/502; G01J 3/51; G02B 27/0103; G02F 1/13342; G02F 1/13476; G03F 7/20; G03F 7/26
(Continued)

(56) References Cited

U.S. PATENT DOCUMENTS 3,702,992 A * 11/1972 Sakai .......................... 365/171
3,936,184 A     2/1976 Tanaka et al.
(Continued)

FOREIGN PATENT DOCUMENTS

EP          1338436       8/2003
JP        2005-229103     8/2005
(Continued)

OTHER PUBLICATIONS

Wenhai Liu et al. "Real-time hyperspectral imaging with volume holographic optical elements", Proceedings 2001 International Conference on Image Processing, vol. 2, pp. 1049-1052, Oct. 2001.*
(Continued)

*Primary Examiner* — Kara E Geisel
*Assistant Examiner* — Hina F Ayub
(74) *Attorney, Agent, or Firm* — Baker & Hostetler LLP

(57) ABSTRACT

A holographic polymer dispersed liquid crystal (HPDLC) tunable filter exhibits switching times of no more than 20 microseconds. The HPDLC tunable filter can be utilized in a variety of applications. An HPDLC tunable filter stack can be utilized in a hyperspectral imaging system capable of spectrally multiplexing hyperspectral imaging data acquired while the hyperspectral imaging system is airborne. HPDLC tunable filter stacks can be utilized in high speed switchable optical shielding systems, for example as a coating for a visor or an aircraft canopy. These HPDLC tunable filter stacks can be fabricated using a spin coating apparatus and associated fabrication methods.

17 Claims, 53 Drawing Sheets

(51) Int. Cl.
  *G02F 1/1334* (2006.01)
  *G02F 1/1347* (2006.01)
  *G01J 3/50* (2006.01)
  *G01J 3/51* (2006.01)
  *G02B 27/01* (2006.01)
  *G03F 7/20* (2006.01)
  *G03F 7/26* (2006.01)

(52) U.S. Cl.
  CPC ...... *G02F 1/13342* (2013.01); *G02F 1/13476* (2013.01); *G03F 7/20* (2013.01); *G03F 7/26* (2013.01); *G02F 2203/055* (2013.01)

(58) Field of Classification Search
  USPC .................................................. 356/300–334
  See application file for complete search history.

(56) References Cited

U.S. PATENT DOCUMENTS

| | | |
|---|---|---|
| 3,938,058 A | 2/1976 | Yamamoto |
| 3,975,082 A | 8/1976 | Winzer |
| 3,991,755 A | 11/1976 | Vernon et al. |
| 4,026,278 A | 5/1977 | Ricketts et al. |
| 4,050,802 A | 9/1977 | Tanaka et al. |
| 4,141,359 A | 2/1979 | Jacobsen et al. |
| 4,172,333 A | 10/1979 | Towsend |
| 4,225,216 A | 9/1980 | Boyd et al. |
| 4,250,878 A | 2/1981 | Jacobsen et al. |
| 4,260,429 A | 4/1981 | Moyer |
| 4,292,092 A | 9/1981 | Hanak |
| 4,322,133 A | 3/1982 | Uede et al. |
| 4,398,545 A | 8/1983 | Wilson |
| 4,408,862 A | 10/1983 | Takano et al. |
| 4,447,111 A | 5/1984 | Leib |
| 4,500,174 A * | 2/1985 | Conner ................. 359/267 |
| 4,556,051 A | 12/1985 | Maurer |
| 4,580,572 A | 4/1986 | Granek et al. |
| 4,583,547 A | 4/1986 | Granek et al. |
| 4,589,735 A | 5/1986 | Saunders |
| 4,606,613 A | 8/1986 | Urabe |
| 4,608,987 A | 9/1986 | Mills |
| 4,623,222 A | 11/1986 | Itoh et al. |
| 4,693,558 A | 9/1987 | Nakaho et al. |
| 4,723,656 A | 2/1988 | Kiernan et al. |
| 4,729,377 A | 3/1988 | Granek et al. |
| 4,729,638 A | 3/1988 | Shirai |
| 4,734,558 A | 3/1988 | Nakano et al. |
| 4,792,208 A | 12/1988 | Ulman et al. |
| 4,796,971 A | 1/1989 | Robello et al. |
| 4,820,933 A | 4/1989 | Hong et al. |
| 4,825,877 A | 5/1989 | Kempe |
| 4,832,427 A | 5/1989 | Nanba et al. |
| 4,848,878 A | 7/1989 | Lee et al. |
| 4,878,743 A | 11/1989 | Aikawa et al. |
| 4,886,339 A | 12/1989 | Scozzafava et al. |
| 4,900,127 A | 2/1990 | Robello et al. |
| 5,008,043 A | 4/1991 | Robello et al. |
| 5,011,284 A * | 4/1991 | Tedesco et al. .......... 356/301 |
| 5,029,979 A | 7/1991 | Robello et al. |
| 5,046,803 A | 9/1991 | Colak |
| 5,056,895 A | 10/1991 | Kahn |
| 5,070,509 A | 12/1991 | Meyers |
| 5,075,043 A | 12/1991 | Robello et al. |
| 5,093,874 A | 3/1992 | Hawkins et al. |
| 5,120,621 A | 6/1992 | Ramsbottom |
| 5,128,799 A | 7/1992 | Byker |
| 5,168,378 A | 12/1992 | Black et al. |
| 5,179,565 A | 1/1993 | Tsuchiya et al. |
| 5,212,585 A | 5/1993 | Ning |
| 5,220,317 A | 6/1993 | Lynam et al. |
| 5,245,453 A | 9/1993 | Hatano et al. |
| 5,298,017 A | 3/1994 | Theeuwes et al. |
| 5,307,186 A | 4/1994 | Izumi et al. |
| 5,307,187 A | 4/1994 | Sunohara et al. |
| 5,309,464 A | 5/1994 | Ko |
| 5,381,507 A | 1/1995 | Robello et al. |
| 5,384,578 A | 1/1995 | Lynam et al. |
| 5,410,630 A | 4/1995 | Robello et al. |
| 5,543,251 A | 8/1996 | Taylor |
| 5,559,330 A | 9/1996 | Murashita |
| 5,592,314 A | 1/1997 | Ogasawara et al. |
| 5,617,436 A | 4/1997 | Lo |
| 5,640,021 A | 6/1997 | Lee et al. |
| 5,640,274 A | 6/1997 | Iwama et al. |
| 5,646,815 A | 7/1997 | Owens et al. |
| 5,649,061 A | 7/1997 | Smyth |
| 5,668,901 A | 9/1997 | Keck et al. |
| 5,681,402 A | 10/1997 | Ichinose et al. |
| 5,721,630 A | 2/1998 | Horner et al. |
| 5,725,970 A | 3/1998 | Martin et al. |
| 5,751,452 A | 5/1998 | Tanaka et al. |
| 5,751,467 A | 5/1998 | Byker |
| 5,759,291 A | 6/1998 | Ichinose et al. |
| 5,760,853 A | 6/1998 | Yamashita |
| 5,786,555 A | 7/1998 | Saito et al. |
| 5,805,367 A | 9/1998 | Kanazawa |
| 5,818,983 A | 10/1998 | Yoshimura et al. |
| 5,875,012 A | 2/1999 | Crawford et al. |
| 5,899,856 A | 5/1999 | Schoendorfer et al. |
| 5,942,157 A | 8/1999 | Sutherland et al. |
| 5,953,204 A | 9/1999 | Suhara et al. |
| 5,982,529 A | 11/1999 | Chapnik et al. |
| 6,014,247 A | 1/2000 | Winter et al. |
| 6,023,364 A | 2/2000 | Kobayashi et al. |
| 6,069,313 A | 5/2000 | Kay |
| 6,079,665 A * | 6/2000 | Nella .................... F41G 7/2226 244/3.16 |
| 6,088,321 A | 7/2000 | Yamaji et al. |
| 6,094,292 A * | 7/2000 | Goldner et al. ............. 359/265 |
| 6,116,800 A * | 9/2000 | Wang .................... B43K 21/08 401/55 |
| 6,130,732 A | 10/2000 | Crawford et al. |
| 6,145,551 A | 11/2000 | Jayaraman et al. |
| 6,146,351 A | 11/2000 | Kempe |
| 6,215,920 B1 | 4/2001 | Whitehead et al. |
| 6,238,381 B1 | 5/2001 | Tapper |
| 6,266,560 B1 | 7/2001 | Zhang et al. |
| 6,285,486 B1 | 9/2001 | Kobayashi et al. |
| 6,288,104 B1 | 9/2001 | Gericke et al. |
| 6,291,677 B1 | 9/2001 | Vasudevan et al. |
| 6,294,582 B1 | 9/2001 | Jerussi |
| 6,313,396 B1 | 11/2001 | Glenn |
| 6,317,189 B1 | 11/2001 | Yuan et al. |
| 6,324,053 B1 | 11/2001 | Kamijo |
| 6,327,413 B1 | 12/2001 | Kinoshita |
| 6,333,458 B1 | 12/2001 | Forrest et al. |
| 6,338,882 B1 | 1/2002 | Dultz et al. |
| 6,341,057 B1 | 1/2002 | Nissen et al. |
| 6,357,904 B1 | 3/2002 | Kawashima |
| 6,381,482 B1 | 4/2002 | Jayaraman et al. |
| 6,385,355 B1 | 5/2002 | Nashimoto et al. |
| 6,392,338 B1 | 5/2002 | Hori et al. |
| 6,404,074 B2 | 6/2002 | Saito et al. |
| 6,404,789 B1 | 6/2002 | Kopp et al. |
| 6,414,235 B1 | 7/2002 | Luch |
| 6,436,613 B1 | 8/2002 | Fallahi et al. |
| 6,437,903 B1 | 8/2002 | Kozhukh |
| 6,472,594 B1 | 10/2002 | Ichinose et al. |
| 6,472,817 B1 | 10/2002 | Kawase |
| 6,515,218 B1 | 2/2003 | Shimizu et al. |
| 6,525,759 B2 | 2/2003 | Kawai |
| 6,525,847 B2 | 2/2003 | Popovich et al. |
| 6,538,775 B1 | 3/2003 | Bowley et al. |
| 6,556,137 B1 | 4/2003 | Oka et al. |
| 6,559,555 B1 | 5/2003 | Saitou et al. |
| 6,580,094 B1 | 6/2003 | Yamazaki et al. |
| 6,613,977 B1 | 9/2003 | Fowler |
| 6,661,034 B2 | 12/2003 | Kawase |
| 6,667,134 B1 | 12/2003 | Sutherland et al. |
| 6,667,215 B2 * | 12/2003 | Theiss et al. ................. 438/299 |
| 6,674,136 B1 | 1/2004 | Ohtani |
| 6,687,040 B2 | 2/2004 | Kimura |
| 6,689,316 B1 | 2/2004 | Blyth et al. |

(56) References Cited

U.S. PATENT DOCUMENTS

| | | |
|---|---|---|
| 6,692,718 B1 | 2/2004 | Osawa |
| 6,697,035 B2 | 2/2004 | Sugahara et al. |
| 6,706,961 B2 | 3/2004 | Shimizu et al. |
| 6,750,471 B2 | 6/2004 | Bethune et al. |
| 6,753,994 B1 * | 6/2004 | Russell .............. 359/254 |
| 6,754,408 B2 | 6/2004 | Toda et al. |
| 6,766,082 B2 | 7/2004 | Hirabayashi et al. |
| 6,778,236 B1 | 8/2004 | Crawford et al. |
| 6,785,036 B1 | 8/2004 | Berneth et al. |
| 6,791,024 B2 | 9/2004 | Toyomura |
| 6,808,523 B2 | 10/2004 | Fujisaka et al. |
| 6,809,343 B2 | 10/2004 | Yamazaki et al. |
| 6,816,140 B2 | 11/2004 | Fujieda |
| 6,819,386 B2 | 11/2004 | Roosendaal et al. |
| 6,821,457 B1 | 11/2004 | Natarajan et al. |
| 6,830,594 B2 | 12/2004 | Shinozaki et al. |
| 6,842,573 B2 | 1/2005 | Birnbach |
| 6,868,854 B2 | 3/2005 | Kempe |
| 6,879,618 B2 | 4/2005 | Cok et al. |
| 6,882,477 B1 | 4/2005 | Schattenberg et al. |
| 6,882,517 B2 | 4/2005 | Tano et al. |
| 6,888,305 B2 | 5/2005 | Weaver |
| 6,895,138 B2 | 5/2005 | Toda et al. |
| 6,901,175 B2 | 5/2005 | Baxter et al. |
| 6,906,911 B2 | 6/2005 | Ikeda et al. |
| 6,940,092 B2 | 9/2005 | Yoshida et al. |
| 6,946,597 B2 | 9/2005 | Sager et al. |
| 6,950,220 B2 | 9/2005 | Abramson et al. |
| 6,950,453 B2 | 9/2005 | Biswas et al. |
| 6,960,841 B2 | 11/2005 | Saitou et al. |
| 6,961,105 B2 | 11/2005 | Chang et al. |
| 7,018,563 B1 | 3/2006 | Sutherland et al. |
| 7,024,094 B2 | 4/2006 | Kimura |
| 7,030,556 B2 | 4/2006 | Adachi et al. |
| 7,047,080 B2 | 5/2006 | Palanker et al. |
| 7,079,730 B2 | 7/2006 | Fallahi et al. |
| 7,082,236 B1 | 7/2006 | Moore |
| 7,088,490 B2 | 8/2006 | Nakaho et al. |
| 7,091,411 B2 | 8/2006 | Falk et al. |
| 7,092,046 B2 | 8/2006 | Feoktistov et al. |
| 7,095,041 B2 | 8/2006 | Cho et al. |
| 7,180,649 B2 | 2/2007 | Morrison et al. |
| 7,183,050 B2 | 2/2007 | Krull |
| 7,233,250 B2 | 6/2007 | Forster |
| 7,235,331 B2 | 6/2007 | Noda et al. |
| 7,250,930 B2 | 7/2007 | Hoffman et al. |
| 7,279,751 B2 | 10/2007 | Ueda et al. |
| 7,279,752 B2 | 10/2007 | Yamazaki et al. |
| 7,279,833 B2 | 10/2007 | Adachi et al. |
| 7,312,976 B2 | 12/2007 | Kazaryan et al. |
| 7,316,789 B2 | 1/2008 | Lu |
| 7,327,509 B2 | 2/2008 | Nakaho |
| 7,352,500 B2 | 4/2008 | Jagt et al. |
| 7,369,295 B2 | 5/2008 | Morita et al. |
| 7,382,602 B2 | 6/2008 | Sakata et al. |
| 7,394,140 B2 | 7/2008 | Patel et al. |
| 7,394,648 B2 | 7/2008 | Kondo et al. |
| 7,412,281 B2 | 8/2008 | Shen et al. |
| 7,424,782 B2 | 9/2008 | Cheskin |
| 7,428,395 B2 | 9/2008 | Takahashi et al. |
| 7,436,577 B2 | 10/2008 | Moriyama et al. |
| 7,443,650 B2 | 10/2008 | Nedoshivin et al. |
| 7,454,103 B2 | 11/2008 | Parriaux |
| 7,462,774 B2 | 12/2008 | Roscheisen et al. |
| 7,463,198 B2 | 12/2008 | Deaett et al. |
| 7,476,222 B2 | 1/2009 | Sun et al. |
| 7,477,938 B2 | 1/2009 | Sun et al. |
| 7,477,939 B2 | 1/2009 | Sun et al. |
| 7,477,940 B2 | 1/2009 | Sun et al. |
| 7,477,941 B2 | 1/2009 | Sun et al. |
| 7,479,133 B2 | 1/2009 | Sun et al. |
| 7,480,530 B2 | 1/2009 | Sun et al. |
| 7,486,989 B2 | 2/2009 | Sun et al. |
| 7,495,146 B2 | 2/2009 | Crisp |
| 7,504,953 B2 | 3/2009 | Forster |
| 7,507,228 B2 | 3/2009 | Sun et al. |
| 7,507,903 B2 | 3/2009 | Luch |
| 7,528,907 B2 | 5/2009 | Sung |
| 7,539,533 B2 | 5/2009 | Tran |
| 7,558,622 B2 | 7/2009 | Tran |
| 7,567,209 B2 | 7/2009 | Tanaka et al. |
| 7,586,035 B2 | 9/2009 | Gaudiana et al. |
| 7,599,652 B2 | 10/2009 | Takagami |
| 7,601,942 B2 | 10/2009 | Underwood et al. |
| 7,605,327 B2 | 10/2009 | Roscheisen et al. |
| 7,618,267 B2 | 11/2009 | Konno et al. |
| 7,622,667 B2 | 11/2009 | Chittibabu et al. |
| 7,633,179 B2 | 12/2009 | Kobayashi |
| 7,635,600 B2 | 12/2009 | Zhang et al. |
| 7,635,810 B2 | 12/2009 | Luch |
| 7,643,201 B2 | 1/2010 | Nakaho et al. |
| 7,643,874 B2 | 1/2010 | Nitzan et al. |
| 7,645,933 B2 | 1/2010 | Narkis et al. |
| 7,651,647 B1 | 1/2010 | Strange et al. |
| 7,657,297 B2 | 2/2010 | Simpson et al. |
| 7,662,176 B2 | 2/2010 | Skiba et al. |
| 7,664,476 B2 | 2/2010 | Yanagida |
| 7,672,719 B2 | 3/2010 | Skiba et al. |
| 7,771,495 B2 | 8/2010 | Kobayashi et al. |
| 7,771,799 B2 | 8/2010 | Kobayashi et al. |
| 7,787,169 B2 | 8/2010 | Abramson et al. |
| 7,794,629 B2 | 9/2010 | Youngs |
| 2001/0016283 A1 | 8/2001 | Shiraishi et al. |
| 2001/0019434 A1 | 9/2001 | Popovich et al. |
| 2002/0130988 A1 | 9/2002 | Crawford et al. |
| 2002/0145792 A1 | 10/2002 | Jacobson et al. |
| 2003/0071048 A1 | 4/2003 | Felder et al. |
| 2003/0123056 A1 * | 7/2003 | Barnes et al. .............. 356/300 |
| 2003/0169557 A1 | 9/2003 | Noguchi et al. |
| 2003/0191275 A1 | 10/2003 | Leonte et al. |
| 2004/0008391 A1 * | 1/2004 | Bowley .............. G02B 5/203 359/3 |
| 2004/0137204 A1 | 7/2004 | Sutehrland et al. |
| 2004/0227940 A1 * | 11/2004 | Mitchell .............. G01J 3/18 356/328 |
| 2005/0018960 A1 | 1/2005 | De Bougrenet De La Tocnaye et al. |
| 2005/0036677 A1 * | 2/2005 | Ladjevardi .............. G01N 21/84 382/162 |
| 2005/0046936 A1 * | 3/2005 | Dixon .............. G02B 26/101 359/385 |
| 2005/0052609 A1 | 3/2005 | Pan et al. |
| 2005/0099930 A1 | 5/2005 | Volodin et al. |
| 2005/0140837 A1 | 6/2005 | Crawford et al. |
| 2005/0227146 A1 | 10/2005 | Ghantous et al. |
| 2005/0250052 A1 | 11/2005 | Nguyen |
| 2005/0259217 A1 * | 11/2005 | Lin .............. G02F 1/13342 349/196 |
| 2006/0061762 A1 * | 3/2006 | Dwight et al. .............. 356/301 |
| 2006/0126143 A1 | 6/2006 | Ezura et al. |
| 2006/0239171 A1 | 10/2006 | Ooi et al. |
| 2007/0020561 A1 | 1/2007 | Hisada et al. |
| 2008/0239420 A1 | 10/2008 | McGrew |
| 2008/0281014 A1 | 11/2008 | Momose et al. |
| 2008/0297980 A1 | 12/2008 | Bourcier et al. |
| 2009/0190286 A1 | 7/2009 | Tian et al. |
| 2009/0272946 A1 | 11/2009 | Lu |
| 2010/0014216 A1 | 1/2010 | Cadek et al. |
| 2010/0073605 A1 | 3/2010 | Masutani et al. |
| 2010/0119815 A1 | 5/2010 | Kim |
| 2010/0151318 A1 | 6/2010 | Lopatin et al. |
| 2010/0203391 A1 | 8/2010 | Lopatin et al. |
| 2010/0216026 A1 | 8/2010 | Lopatin et al. |
| 2010/0231997 A1 | 9/2010 | Fontecchio et al. |
| 2011/0062430 A1 * | 3/2011 | van Veggel et al. .......... 257/40 |
| 2011/0199563 A1 | 8/2011 | Fontecchio et al. |
| 2011/0208462 A1 * | 8/2011 | Maier .............. G01J 3/02 702/104 |

(56) References Cited

U.S. PATENT DOCUMENTS

2013/0244121 A1 9/2013 Gogotsi et al.
2013/0341509 A1* 12/2013 Nelson et al. ............... 250/330

FOREIGN PATENT DOCUMENTS

| WO | WO 94/09441 | 4/1994 |
|---|---|---|
| WO | WO 01/16023 | 3/2001 |
| WO | WO 01/37244 | 5/2001 |
| WO | WO 2005/110592 | 11/2005 |
| WO | WO 2009/023449 A1 | 2/2009 |
| WO | WO 2009/156775 | 12/2009 |
| WO | WO 2010/045308 | 4/2010 |
| WO | WO 2010/091352 | 8/2010 |
| WO | WO 2012/037445 | 3/2012 |
| WO | WO 2012/058652 | 5/2012 |
| WO | WO 2013/027006 A1 | 2/2013 |

OTHER PUBLICATIONS

T.J. Bunning, "Holographic Polymer-Dispersed Liquid Crystals (H-PDLCs)", Ann. Rev. Mater. Sci., vol. 30, pp. 83-115, 2000.*
Sutherland et al. "Electrically switchable volume gratings in polymer-dispersed liquid crystals", Appl. Phys. Lett. 64, 1074 (1994).*
U.S. Appl. No. 13/828,520, filed Mar. 14, 2013, Fontecchio et al.
U.S. Appl. No. 13/823,336, filed May 23, 2013, Gogotsi et al.
"The Future of ITO: Transparent Conductor and ITO Replacement Markets", http://www.researchandmarkets.com/search.asp?q=The%20Future%20of%20ITO:%20Transparent%20Conductor%20and%20ITO%20Replacement%20Markets, NanoMarkets, Mar. 2008, 1 page.
Bowley et al., "Reflection from dual-domains in a holographically formed polymer dispersed liquid crystal material", Appl. Phys. Lett., May 1999, 74(21), 3096-3098.
Brenner, D.W. et al., "A second-generation reactive empirical bond order (REBO) potential energy expression for hydrocarbons", Phys. Condens. Matter., Feb. 2002, 14(4), 783-802.
Bushueva et al., "Double layer supercapacitor properties of onion-like carbon materials," Phys. Stat. Sol. (b), Oct. 2008, 245(10), 2296-2299.
Du Pasquier et al., "A comparative study of Li-ion battery, supercapacitor and nonaqueous asymmetric hybrid devices for automotive applications," Journal of Power Sources, Mar. 2003, 115(1), 171-178.
Fontecchio et al., "Diffuse renditions of spatially pixelated and temporally multiplexed H-PDLCs for full color reflective displays", SID Symposium Digest of Technical Papers, Jun. 2001, 32(1), 348-351.
Fontecchio et al., "Multiplexed holographic polymer dispersed liquid crystals", J. Opt. Technol., Sep. 2001, 68(9), 652-656.
Fox et al., "Holographically formed polymer dispersed liquid crystal films for transmission mode spectrometer applications", Appl. Opt., Sep. 2007, 46(25), 6277-6282.
Huang et al., "Curvature effects in carbon nanomaterials: Exohedral versus endohedral supercapacitors," J. Mater. Res., Aug. 2010, 25(8), 1525-1531.
In et al., "Origami fabrication of nanostructured, three-dimensional devices: electrochemical capacitors with carbon electrodes", Appl. Phys. Lett., Feb. 2006, 88, 083104-1-083104-3.
International Patent Application No. PCT/US2011/051903: International Search Report and Written Opinion dated Mar. 21, 2012, 18 pages.
International Patent Application No. PCT/US2011/058483: International Search Report and Written Opinion dated Apr. 25, 2012, 14 pages.
Kaempgen et al., "Printable thin film supercapacitors using single-walled carbon nanotubes", Nano. Lett., Apr. 2009, 9(5), 1872-1876.
Kaiser et al., "Chirped switchable reflection grating in holographic polymer-dispersed liquid crystal for spectral flattening in free space optical communication systems", Appl. Opt., Nov. 2004, 43(32), 5996-6000.

Kinoshita, K., "Electrochemical Uses of Carbon," Electrochemistry Encyclopedia, available at http://electrochem.cwru.edu/encycl/art-c01-carbon.htm, Jan. 2001, 12 pages.
Kuznetsov et al., "Effect of explosion conditions on the structure of detonation soots: ultradisperse diamond and onion carbon," Carbon, 1994, 32(5), 873-882.
Kuznetsov, V.L., et al. "Onion-like carbon from ultra-disperse diamond," Chem. Phys. Lett., May 1994, 222(4), 343-348.
Lin et al., "Microelectrode Study of Pore Size, Ion Size, and Solvent Effects on the Charge/Discharge Behavior of Microporous Carbons for Electrical Double-Layer Capacitors", Journal of the Electrochemical Society, 2009, 156(1), A7-A12.
Osswald, S., et al., "Control of sp2/sp3 carbon ratio and surface chemistry of nanodiamond powders by selective oxidation in air", J. Am. Chem. Soc., Sep. 2006, 128(35), 11635-11642.
Park et al., "Pseudocapacitive Behavior of Carbon Nanoparticles Modified by Phosphomolybdic Acid," Journal of the Electrochemical Society, Sep. 2009, 156(11), A921-A926.
Pech et al., "Ultrahigh-power micrometre-sized supercapacitors based on onion-like carbon," Nature Nanotechnology, Aug. 2010, 5(9), 651-654.
Pech, D. et al., "Elaboration of a microstructured inkjet-printed carbon electrochemical capacitor", J. Power Sources, Feb. 2010, 195(4), 1266-1269.
Plonska-Brzezinska et al., "Electrochemical Properties of Small Carbon Nano-Onion Films," Electrochemical and Solid-State Letters, Jan. 2010, 13(4), K35-K38.
Portet et al., "Electrochemical characterizations of carbon nanomaterials by the cavity microelectrode technique," Electrochimica Acta, Nov. 2008, 53(26), 7675-7680.
Portet et al., "Electrochemical performance of carbon onions, nanodiamonds, carbon black and multiwalled nanotubes in electrical double layer capacitors," Carbon, Nov. 2007, 45(13), 2511-2518.
Qi et al., "Holographically formed polymer dispersed liquid crystal displays", Displays, Dec. 2004, 25(5), 177-186.
Qi et al., "Temporally multiplexed holographic polymer dispersed liquid crystals", Appl. Phys. Lett., Mar. 2003, 82(11), 1652-1654.
Rai, "Study of Spectral Sensing using Electro-Optic Films", Thesis Submitted to the Faculty Drexel University, Sep. 2009, 180 pages.
Shriyan et al., "Multilayer Stacking Technique for Holographic Polymer Dispersed Liquid Crystals", Applied Physics Letters, 93, 261113, 2008, 3 pages.
Wang et al., "Facile Synthesis of Ordered Mesoporous Carbons with High Thermal Stability by Self-Assembly of Resorcinol-Formaldehyde and Block Copolymers under Highly Acidic Conditions", Langmuir, Jun. 2008, 24(14), 7500-7505.
Yoo et al., "Plastic Electronics Could Slash the Cost of Solar Panels", Princeton University, Apr. 14, 2010, 3 pages.
Zheng et al., "Carbon with an onion-like structure obtained by chlorinating titanium carbide," Journal of Materials Chemistry, Apr. 2000, 10(5), 1039-1041.
Geis et al. "30 to 50 ns Liquid Crystal Optical Switches", Proc. SPIE, 2010,7618 paper 76180J, 5 pages.
Jakubiak et al., "Holographic Photopolymerization for Fabrication of Electrically Switchable Inorganic-Organic Hybrid Photonic Structures", Proc. SPIE, 2003, 4991, 89-97.
Kamanina et al. "Fullerene-Doped Polymer Dispersed Liquid Crystals" Holographic Recording and Optical Limiting Effect, Proc. SPIE, 2001, 4347, 487-492.
Massenot "Etude, Modelisation et realization de composants diffractants: contribution a l'etude de materiaux accordables et application a l'enregistrement holographique des filters resonants" Theses, Feb. 2006 , 171 pages.
NECF Meeting Abstracts, 33rd New England Complex Fluids Meeting, 14 pages, Nov. 28, 2007, see Rai et al. "Fabrication technique for broadening reflected wavelengths of thin film holograms" abstract 26.
Shriyan et al. "Electro-optical Effect of Oxidized Multiwalled Carbon Nanotube Doping on Holographic Polymer Dispersed Liquid Crystal Films", Proc. SPIE, 7414, article 741407, 2009, 8 pages.

(56) References Cited

OTHER PUBLICATIONS

Woo et al. "Dual Effects of Fullerene Doped to Holographic Polymer Dispersed Liquid Crystals" J Poly. Sci. A:Poly. Chem., 2007, 45, 5590-5596.

Yaroshchuk et al., "Electro-Optics and Structure of Polymer Dispersed Liquid Crystals Doped With Nanoparticles of Inorganic Materials" Opt. Mater., 29, 2007,1097-1102.

Bowley et al, "Improving The Voltage Response of Holographically-Formed Polymer Dispersed Liquid Crystals (H-PDLCs)", Molecular Crystals and Liquid Crystals Science and Technology, 359, Jan. 1, 2001, 647-659.

Bunning et al, "Holographic Polymer-Dispersed Liquid Crystals (H-PDLCs)", Annual Review of Materials Science, 30(1), Aug. 1, 2000, 83-115.

International Patent Application No. PCT/US2014/025922: International Search Report dated Nov. 11, 2014, 20 pages.

Rai et al., "Abstract J35.00007: Broadband Wavelength Spanning Holographic Polymer Dispersed Liquid Crystals", http://web.archive.org/web/20070702163724/http://meetings.aps.org/Meeting/MAR08/Event!77340, Jun. 2007, 1 pg.

Pu et al. "Exposure Schedules for Multiplexing Holograms in Photopolymer Films", Opt. Eng., Oct. 1996, vol. 35(10) 2824-2829.

Rai et al, "Fabrication Technique for Broadening Reflected Wavelengths of Thin Film Holograms" NECF Meeting Abstracts, 33rd New England Complex Fluids Meeting Nov. 28, 2007, abstract 26.

Rai et al., "Fabrication Technique for Increased Interaction Wavelengths of Thin-Film Holograms", ECE Department, Drexel University, Philadelphia, PA, Patent Complex Fluid Workshop Presentation, Nov. 30, 2007, 2 pages.

Sutherland, et al., "Bragg Gratings in an Acrylate Polymer Consisting of Periodic Polymer-Dispersed Liquid-Crystal Planes", Chem. Mater., Jun. 9, 1993, vol. 5(10), 1533-1538.

Vilfan et al, "Surface-Induced Order and Diffusion in 5CB Liquid Crystal Confined to Porous Glass", Magnetic Resonance Imaging, 2001, 19, 433-438.

Ermold, "Holographic Optical Elements with Electro-optic Control", Drexel University, Oct. 2006, 167 pages.

Ferrari et al., "Effect of size polydispersity in polymer-dispersed liquid-crystal films", Journal of Applied Physics, 2008, 103, 084505-084505-4.

Fox et al., "Liquid crystal polymer composite films for reconfigurable photomasking applications", Applied Physics Letters, 2007, 91, 141119-141119-3.

Natarajan et al., "Switchable Holographic Polymer-Dispersed Liquid Crystal Reflection Gratings Based on Thiol-Ene Photopolymerization", Chemistry of Materials, 2003, 15, 2477-2484.

\* cited by examiner

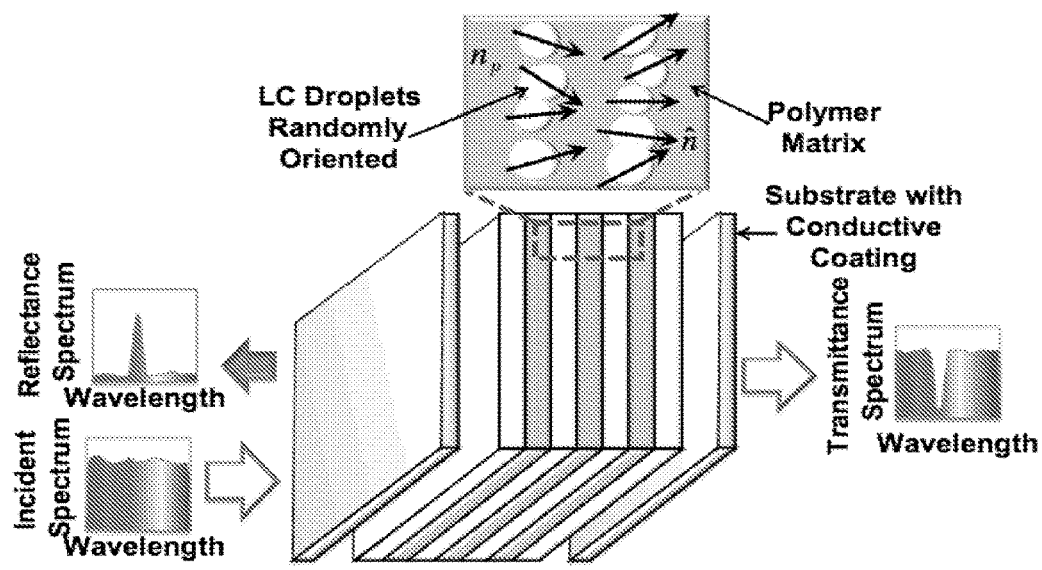
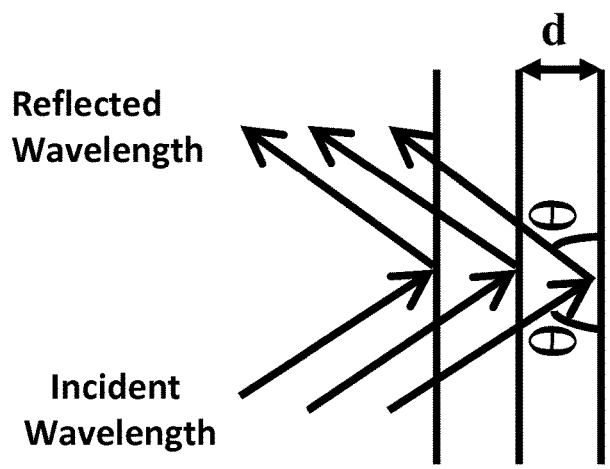
FIGURE 5a

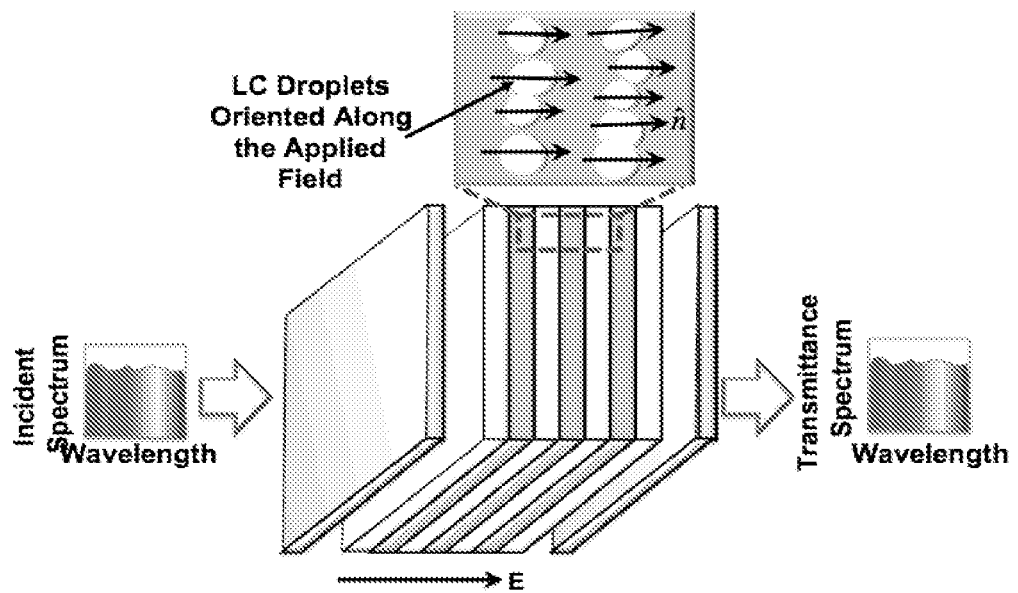
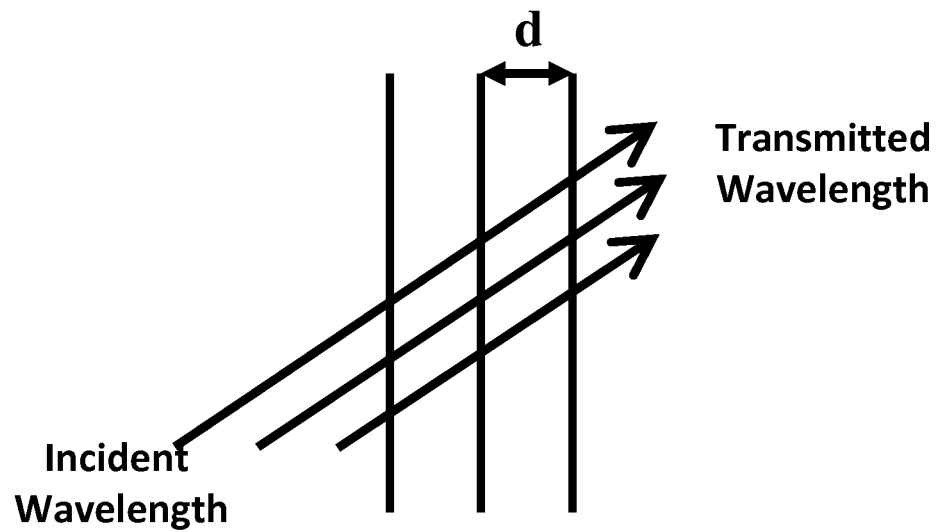
FIGURE 5b

| CHARACTERISTIC | ACHIEVED VALUE |
|---|---|
| Wavelength range (nm) | 296 (510 – 806) |
| Wavelength resolution (nm) | ≤ 10 |
| Filter throughput (%) | 60 |
| Clear aperture (mm) | 20 |
| Response time (ms) | 0.02 |

Performance Characteristics

FIGURE 17

| SAMPLE | NOTCH WAVELENGTH (NM) | PASSBAND WIDTH (NM) | REFLECTION EFFICIENCY (%) | SWITCHING VOLTAGE (V) |
|---|---|---|---|---|
| B1-1 | 516 | 19 | 43 | 234 |
| B1-2 | 541 | 18 | 44 | 289 |
| B1-3 | 558 | 19 | 45 | 211 |
| B1-4 | 576 | 18 | 40 | 195 |
| B1-5 | 587 | 18 | 48 | 180 |
| B1-6 | 599 | 18 | 45 | 222 |

Acrylate Based HPDLC Filter Elements

FIGURE 19

Filter Response Time

Dynamic Reflection Efficiency At Various Modulation Frequencies

| SAMPLE | NOTCH WAVELENGTH (NM) | PASSBAND WIDTH (NM) | REFLECTION EFFICIENCY (%) | SWITCHING VOLTAGE (V) |
|---|---|---|---|---|
| B2-1 | 510 | 15 | 37 | 250 |
| B2-2 | 522 | 16 | 47 | 234 |
| B2-3 | 536 | 16 | 44 | 199 |
| B2-4 | 550 | 16 | 43 | 230 |
| B2-5 | 570 | 21 | 38 | 165 |
| B2-6 | 581 | 17 | 41 | 195 |
| B1-7 | 590 | 17 | 41 | 220 |

Arcylate Based HPDLC Tunable Filter Stack

FIGURE 22

Reflection efficiency as a Function of Switching Voltage for Acrylate Based Filters Wavelength Comparison of Transmission Change For Unbiased And Biased Acrylate Filter

| SAMPLE | NOTCH WAVELENGTH (nm) | PASSBAND WIDTH (nm) | REFLECTION EFFICIENCY (%) | SWITCHING VOLTAGE (V) |
|---|---|---|---|---|
| B3-1 | 620 | 12 | 30 | 100 |
| B3-2 | 695 | 12 | 28 | 100 |
| B3-3 | 723 | 12 | 31 | 116 |
| B3-4 | 778 | 14 | 28 | 116 |

Thiolene Based HPDLC Tunable Filter

FIGURE 25

Reflection Efficiency As A Function Of Switching Voltage For Thiolene Based Filters

| SAMPLE | NOTCH WAVELENGTH (nm) | PASSBAND WIDTH (nm) | REFLECTION EFFICIENCY (%) | SWITCHING VOLTAGE (V) |
|---|---|---|---|---|
| B5-T1 | 610 | 9.4 | 55 | 139 |
| B5-T2 | 616 | 10 | 55 | 139 |
| B5-T3 | 633 | 10 | 57 | 139 |
| B5-T4 | 653 | 9.9 | 44 | 131 |
| B5-T5 | 671 | 10.6 | 45 | 131 |

Thiolene Based HPDLC Tunable Filter With Increased Filter Length

FIGURE 27

Thiolene Filter Stack Response As A Function Of Switching Voltage

| SAMPLE | NOTCH WAVELENGTH (NM) | PASSBAND WIDTH (NM) | REFLECTION EFFICIENCY (%) | SWITCHING VOLTAGE (V) |
|---|---|---|---|---|
| B4-T1 | 685 | 12 | 56 | 131 |
| B4-T2 | 712 | 12 | 60 | 131 |
| B4-T3 | 737 | 13 | 56 | 139 |
| B4-T4 | 761 | 13 | 52 | 120 |
| B4-T5 | 790 | 13 | 57 | 120 |
| B4-T6 | 806 | 15 | 58 | 131 |

Thiolene Based HPDLC Tunable Filter Stack

FIGURE 29

Response of Thiolene Based HPDLC Tunable Filter Stack

Synchronous Output For Ten Filters With A Monochromatic Input

Synchronous Output For Ten Filters With A Monochromatic Input

| Sample # | Thickness (microns) | Notch wavelength (nm) | FWHM (nm) | Reflection efficiency* (%) | Switching voltage (V) |
|---|---|---|---|---|---|
| B9-T1 | 20 | 597 | 9 | 80.49 | 139 |
| B9-T2 | 20 | 603 | 9.2 | 74.81 | 147 |
| B9-T3 | 20 | 612 | 9.9 | 80.80 | 139 |
| B9-T4 | 20 | 620 | 11 | 86.14 | 147 |
| B9-T5 | 20 | 629 | 10.7 | 84.60 | 147 |
| B9-T6 | 20 | 642 | 10.5 | 81.84 | 139 |
| B9-T7 | 20 | 653 | 10.9 | 80.80 | 147 |
| B9-T8 | 20 | 662 | 11.6 | 79.64 | 147 |
| B9-T9 | 20 | 672 | 11.7 | 82.34 | 147 |
| B9-T10 | 20 | 681 | 11.9 | 79.83 | 147 |

FIGURE 35

| Sample # | Thickness (microns) | Notch wavelength (nm) | FWHM (nm) | Reflection efficiency* (%) | Switching voltage (V) |
|---|---|---|---|---|---|
| B8-T1 | 20 | 694 | 10.6 | 68.12 | 147 |
| B8-T2 | 20 | 703 | 11.3 | 69.13 | 147 |
| B8-T3 | 20 | 711 | 11.8 | 72.35 | 147 |
| B8-T4 | 20 | 725 | 11.1 | 70.27 | 154 |
| B8-T5 | 20 | 734 | 12.2 | 78.95 | 154 |
| B8-T6 | 20 | 746 | 12.5 | 78.21 | 154 |
| B8-T7 | 20 | 759 | 13.2 | 81.33 | 154 |
| B8-T8 | 20 | 770 | 12.7 | 78.48 | 154 |
| B8-T9 | 20 | 790 | 13.9 | 76.92 | 154 |
| B8-T10 | 20 | 804 | 14.1 | 75.64 | 154 |

FIGURE 36

TUNABLE ELECTRO-OPTIC FILTER STACK

CROSS-REFERENCE TO RELATED APPLICATIONS

This application is the National Stage of International Application No. PCT/US2011/058483, filed Oct. 29, 2011, which claims the benefit of U.S. Provisional Application No. 61/408,184, filed Oct. 29, 2010, the disclosures of which are incorporated herein by reference in their entireties. This application is related to U.S. patent application Ser. No. 12/721,161, filed Mar. 10, 2010, the disclosure of which is incorporated herein by reference in its entirety.

GOVERNMENT RIGHTS

This invention was made with government support under Grant No. DE-FG02-08ER86355 awarded by the Department of Energy (DOE). The government has certain rights in the invention.

BACKGROUND

Hyperspectral imaging allows the measurement of spectral characteristics of a scene of interest using a remote sensing system with a large number of spectral bands, each band with a spectral resolution of less than 10 nm. A hyperspectral imager is thus capable of producing a quasi-continuous spectrum of light which can define the chemical composition of elements of the scene of interest via their respective spectral signatures.

Known hyperspectral imagers that comprise tunable wavelength dispersing elements, or filters, lack the switching speed required to spectrally multiplex acquired hyperspectral imaging data. Typically in such hyperspectral imagers, each spectral resolution element is acquired in serially, and each spectral resolution element amounts to a small fraction of the total hyperspectral cube. The integration time associated with the serial acquisition of each spectral resolution element can lengthen the acquisition time required to acquire and assemble the hyperspectral cube.

The acquisition time exhibited by known tunable hyperspectral imagers makes them unsuitable for uses where rapid acquisition of the hyperspectral cube, for instance by spectrally multiplexing the hyperspectral imaging data, is necessary for optimum results. For example, acquisition of the hyperspectral cube via spectral multiplexing is desirable for hyperspectral imaging from a moving platform, such as an aircraft. This is because rapid acquisition of the hyperspectral cube minimizes artifacts caused by the motion of the airborne platform during the acquisition.

Therefore, what is desirable is a tunable wavelength dispersing element with high speed switching times, for instance switching times that enable spectral multiplexing of acquired hyperspectral imaging data.

SUMMARY

In accordance with one embodiment, a method includes applying a layer of a conductive material to a surface of a substrate. The method further includes dispersing the conductive material along the surface of the substrate by applying a first rotational force to the substrate. The method further includes applying a mixture comprising a liquid crystal and a polymer to the dispersed first layer of conductive material. The method further includes dispersing the mixture along the first layer of conductive material by applying a second rotational force to the substrate. The method further includes exposing the mixture to an interference pattern that causes the formation of at least one grating structure within the mixture.

In accordance with another embodiment, a hyperspectral imaging system includes a hyperspectral imager having a holographic polymer dispersed liquid crystal tunable filter. The hyperspectral imager is configured to spectrally multiplex hyperspectral imaging data acquired by the hyperspectral imager. The hyperspectral imaging system further includes a platform configured to carry the hyperspectral imager. The platform is configured to facilitate airborne collection of the hyperspectral imaging data.

In accordance with still another embodiment, a switchable optical shielding system includes a visor integrated with a holographic polymer dispersed liquid crystal tunable filter. The holographic polymer dispersed liquid crystal tunable filter is capable of switching between respective transparent and reflective states in no more than 20 microseconds.

In accordance with still another embodiment, a switchable optical shielding system includes a canopy mounted to an aircraft. At least a portion of the canopy is integrated with a holographic polymer dispersed liquid crystal tunable filter. The holographic polymer dispersed liquid crystal tunable filter is capable of switching between respective transparent and reflective states in no more than 20 microseconds.

BRIEF DESCRIPTION OF THE DRAWINGS

The foregoing summary, as well as the following detailed description of example embodiments of the application, will be better understood when read in conjunction with the appended drawings. For the purposes of illustrating the tunable electro-optic filter stack, there are shown in the drawings example embodiments. It should be understood, however, that the instant application is not limited to the precise arrangements and/or instrumentalities illustrated in the drawings, in which:

FIG. 5a depicts an example HPDLC tunable filter stack in an unswitched, reflective state;

FIG. 5b depicts the example HPDLC tunable filter stack illustrated in FIG. 5a in a switched, transparent state;

FIG. 17 is a table depicting performance characteristics of an example HPDLC tunable filter stack;

FIG. 19 is a table containing parameters and metrics associated with a plurality of example acrylate based HPDLC filter elements;

FIG. 22 is a table containing parameters and metrics of an example acrylate based HPDLC tunable filter stack;

FIG. 25 is a table containing parameters and metrics associated with an example thiolene based HPDLC tunable filter stack;

FIG. 27 is a table containing parameters and metrics associated with an example thiolene based HPDLC tunable filter stack comprising HPDLC filter elements having filter lengths of 20 microns;

FIG. 29 is a table illustrating the performance of an example thiolene based HPDLC tunable filter stack operating in the near-IR portion of the spectrum;

FIG. 35 is a table containing parameters and metrics associated with individual example thiolene based HPDLC filter elements in the 600-700 nm wavelength range;

FIG. 36 is a table containing parameters and metrics associated with individual example thiolene based HPDLC filter elements in the 700-800 nm wavelength range;

DETAILED DESCRIPTION

Figure 1:
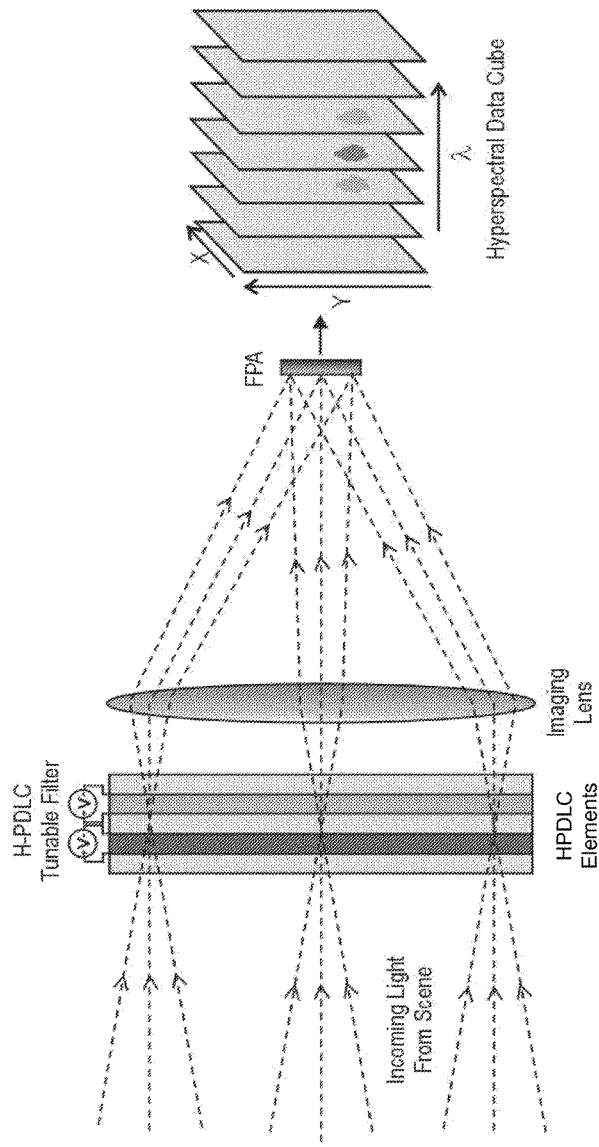
FIG. 1 is a depiction of an example HPDLC tunable filter stack in conjunction with a lens and a focal plane array.

An optical filter constructed with holographic polymer dispersed liquid crystal (HPDLC) elements, such as HPDLC films, can be configured to be switchable between a light scattering state, wherein at least one, such as a plurality of wavelengths of light incident upon the filter can be refracted and/or reflected by respective HPDLC elements of the filter, and a transparent or semitransparent state, wherein at least one, such as a plurality of wavelengths of light incident upon the filter can pass through the filter. Typical HPDLC filters are formed by exposing a homogenous blend of photopolymer and liquid crystals sandwiched between Indium Tin oxide (ITO) coated glass slides-spaced a few microns apart, to light. Polymerization induced phase separation results in randomly oriented nematic liquid crystal (LC) droplets trapped in the polymer matrix. The refractive index mismatch between the LC droplets and the polymer matrix results in light scattering in the Rayleigh regime.

In an example configuration, the herein described HPDLC tunable filter comprises a stack of HPDLC elements, wherein each element is designed for reflecting a particular Bragg wavelength. In accordance with an example embodiment, an HPDLC element can be fabricated, in part, by spin coating liquid crystals onto a glass or flexible substrate, as described in more detail below. Each HPDLC element in the stack can be individually biased between its respective scattering and transparent states through application of a voltage. In this way, the HPDLC tunable filter can be tuned, element by element, though the spectral range of the stack, allowing selected wavelengths of incident light to be transmitted through the stack. As described in more detail below, the HPDLC tunable filters described herein exhibit extremely fast bias switching speeds, thereby allowing for a variety of real world applications, for example use in hyperspectral imaging, as described in more detail below.

In accordance with one embodiment, an HPDLC tunable filter is formed by exposing a prepolymer mixture to a holographic interference pattern generated using coherent laser beams. Diffusion kinetics of the polymer force the liquid crystals (LC)s into the dark regions of the interference pattern where they remain trapped as nematic droplets. This results in a Bragg grating structure whose refractive index varies periodically with the thickness of the cell. Depending on the fabrication geometry either diffraction or reflection gratings can be fabricated.

In operation, application of an electric field (E-field) across the HPDLC tunable filter causes a reorientation torque across respective LC droplets such that the LC droplets substantially align along the direction of the applied E-field. This alignment essentially causes the LC droplets to align such that the ordinary refractive indices of the birefringent nematic LC droplets substantially match that of the surrounding polymer matrix, hence rendering respective HPDLC elements of the filter transparent or semitransparent relative to their corresponding frequencies of light.

Figure 2:
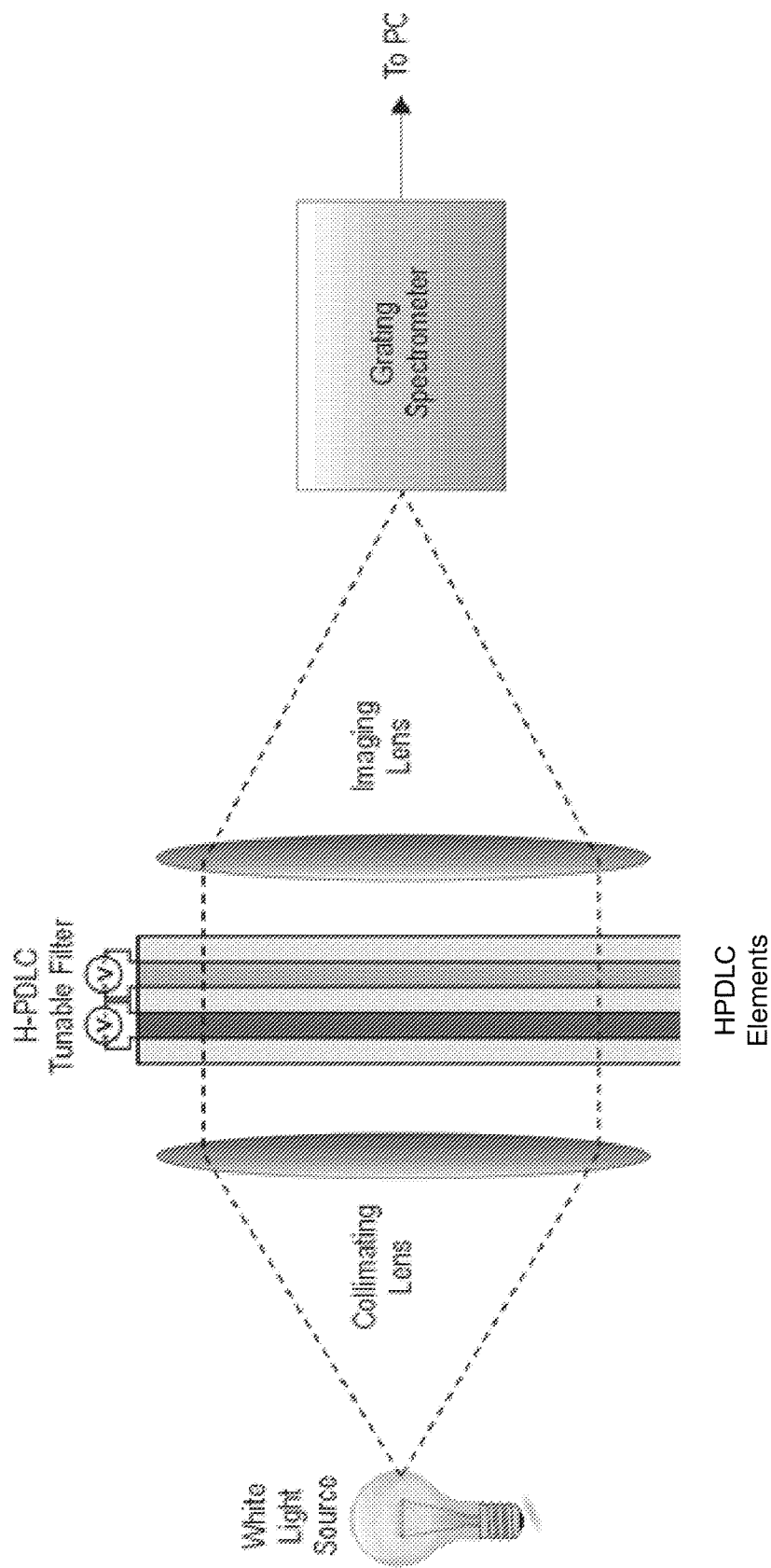
FIG. 2 depicts the example HPDLC tunable filter stack illustrated in FIG. 1, in conjunction with a pair of lenses and a grating spectrometer.
Figure 3:
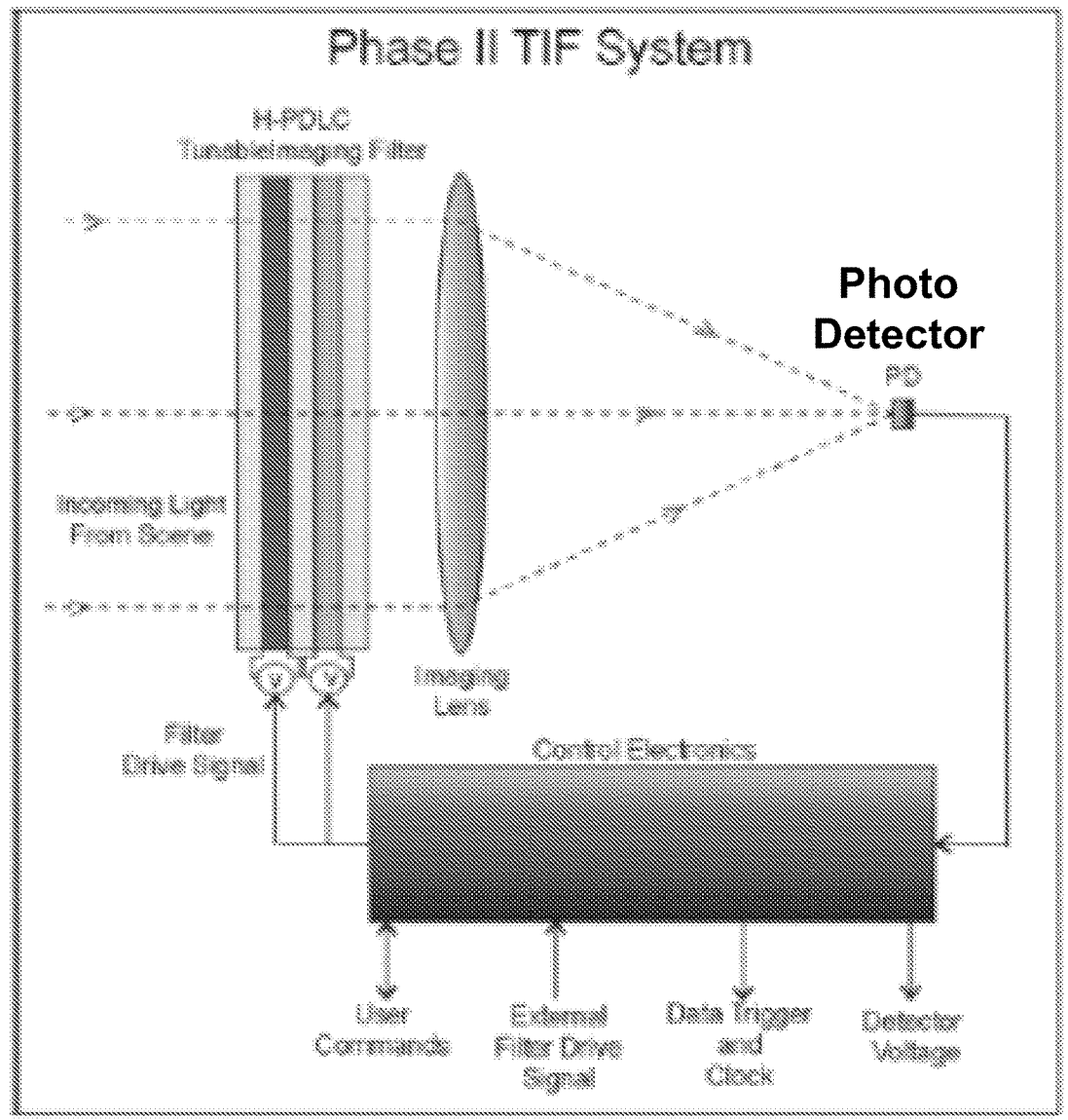
FIG. 3 depicts another example HPDLC tunable filter stack in conjunction with a lens, a photo detector, and control electronics.
Figure 4B:
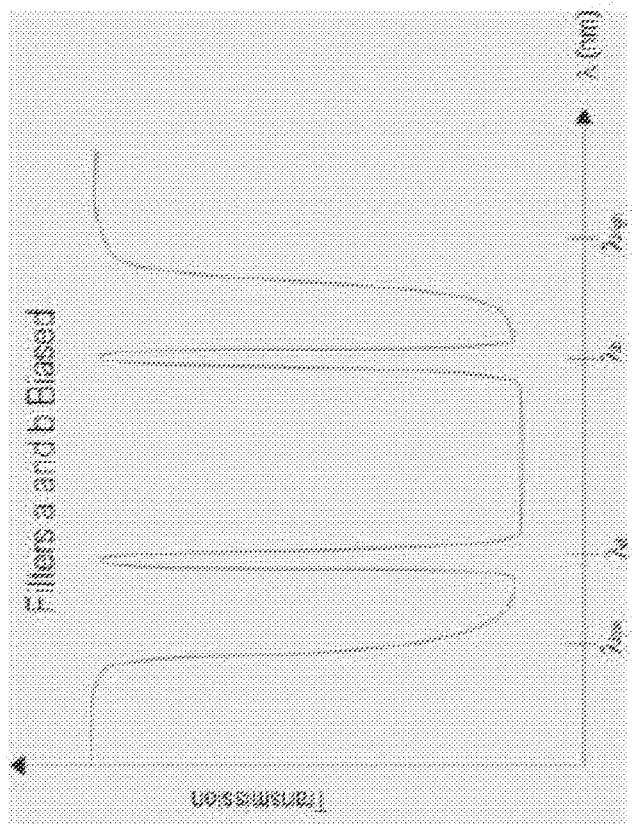
FIGS. 4a and 4b depict spectral characteristics exhibited by an example HPDLC tunable filter stack.
Figure 4A:
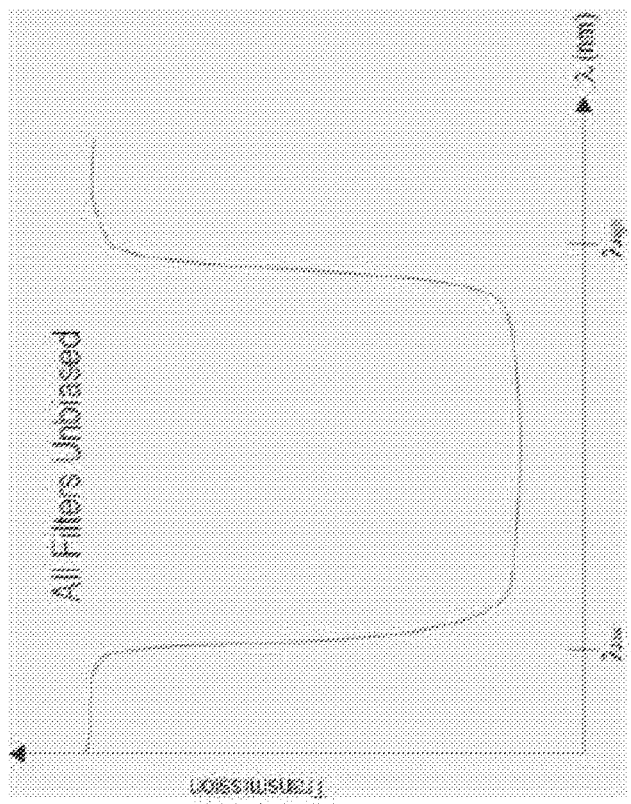

FIG. 1 depicts an example HPDLC tunable filter system. The illustrated HPDLC tunable filter system can include a number of components, such as an HPDLC tunable filter stack, an imaging lens, and focal plane array. In accordance with the illustrated embodiment, light from a scene of interest is incident upon the HPDLC stack comprising a series of HPDLC elements (e.g., HPDLC thin films) each designed for a different Bragg wavelength. The HPDLC tunable filter can be used with the imaging lens and the focal plane array (FPA), for example, to acquire hyperspectral imaging data from the scene of interest. In such a scenario, the HPDLC tunable filter system operates as a hyperspectral imaging system. The hyperspectral imaging data acquired can be used to assemble a hyperspectral data cube associated with the scene of interest, as described in more detail below. Moreover, the HPDLC tunable filter can be used, for example with the imaging lens and the focal plane array (FPA), in order to interface with imaging optics and/or other components that can be used with the HPDLC tunable filter system. For example, see FIG. 2, which depicts an example HPDLC tunable filter in conjunction with a grating spectrometer. FIG. 3 depicts another example HPDLC tunable filter in conjunction with a photo detector and control electronics.

In an example configuration, an HPDLC element is a periodic structure comprising alternating polymer and liquid crystal (LC) droplet layers which create a Bragg grating. The period of the layers determines the Bragg wavelength that is reflected; the number of layers determines the passband or spectral resolution about the Bragg wavelength. Applying a voltage across the structure causes the LC droplets to rapidly rotate state which alters the refractive index of the LC layers such that it matches that of the polymer layers; this effectively negates the Bragg grating such that the Bragg wavelength is no longer reflected and in fact transmits through the HPDLC element. The small size of the LC droplets supports an extremely high switching speed on the order of 20 microseconds (µs) to 10 nanoseconds (ns). A tunable filter is realized with a stack of HPDLC elements each designed for a different Bragg wavelength and separated by the passbands of the HPDLC elements.

FIGS. 4a-b and 5a-b depict example spectral characteristics of an example HPDLC tunable filter. When all elements are not biased (FIG. 4a), each Bragg condition is in place and all Bragg wavelengths are reflected by the stack, and thus there is no transmission of light through the stack. Applying a voltage across example elements, depicted as "a" and "b" in FIG. 4b, disrupts the Bragg condition in these elements, and allows spectral resolution elements a and b to pass. In operation, a voltage applied to all elements therefore results in full transparency across the spectral range, and the unbiasing of select elements results in the rejection of the corresponding Bragg wavelengths. In this way, the filter can be tuned, element by element, though the spectral range of the stack. Alternatively and as a result of the extremely fast switching speed, each HPDLC element can be modulated at a different frequency on the order of tens of kHz, thereby supporting the ability to synchronously detect and demodulate each wavelength with a high update rate of the entire hyperspectral cube. In other words, the HPDLC tunable filter can spectrally multiplex.

In an example embodiment, an HPDLC tunable filter stack can be fabricated by spin coating and photocuring individual layers of prepolymer mixture, alternated by layers of conducting polymers. In this fabrication technique, a layer of prepolymer mixed with liquid crystals is spin coated on a glass or flexible substrate, coated with a conducting polymer, with a thickness of 20 microns, for example, and then exposed to an interference pattern generated by a laser beam. A Bragg grating is formed in the sample post exposure which reflects a particular wavelength, hence forming a wavelength filter. Another layer of conductive polymer is spincoated or evaporated on top of this first layer, the conductive polymer layer configured for application of an electric field. The combination of the exposed HPDLC and conductive layer can be operated as a tunable filter, that is it can be switched, upon application of an electric field, between a reflecting state and a transparent or semitransparent state. Subsequent layers of HPDLC are spincoated on top of this layer, exposed to an interference pattern with different respective pitches, along with corresponding layers of conductive polymers, creating discrete HPDLC elements, sequentially to form a stack of HPDLC elements. The HPDLC element stack can be electrically controlled, for example by application of particular voltages, to reflect various wavelengths. In other words, each HPDLC filter element in the stack can be electro-optically controlled.

Typical HPDLC element stacking techniques require two Indium Tin Oxide (ITO) coated glass substrates to fabricate one HPDLC filter element, and multiple such filters elements can be affixed to one another in a filter stack using an index matching glue. Use of ITO is known to be very expensive and susceptible to mechanical fracture. The herein described spin coating fabrication technique bypasses utilizes conductive polymers to separate HPDLC elements within the stack, eliminating the need to sandwich individual HPDLC elements between ITO coated glass slides and the need to use index matching glue to construct the stack. The use of conductive polymers as intermediate layers dramatically reduces the optical path length of the HPDLC tunable filter stack without adversely affecting the electro-optic performance of the stack. Additionally, reduction in fresnel reflection due to elimination of the glass substrates can obviate the need to use anti-reflection coatings. Moreover, reduction in thickness of the composite stack reduces wavefront errors induced in the wavefront surface traversing through the stack. Small size makes it integratable in lab on-chip devices. As described in more detail below, the spin coating techniques described herein can be scaled to varying production needs as desired.

Figure 6:
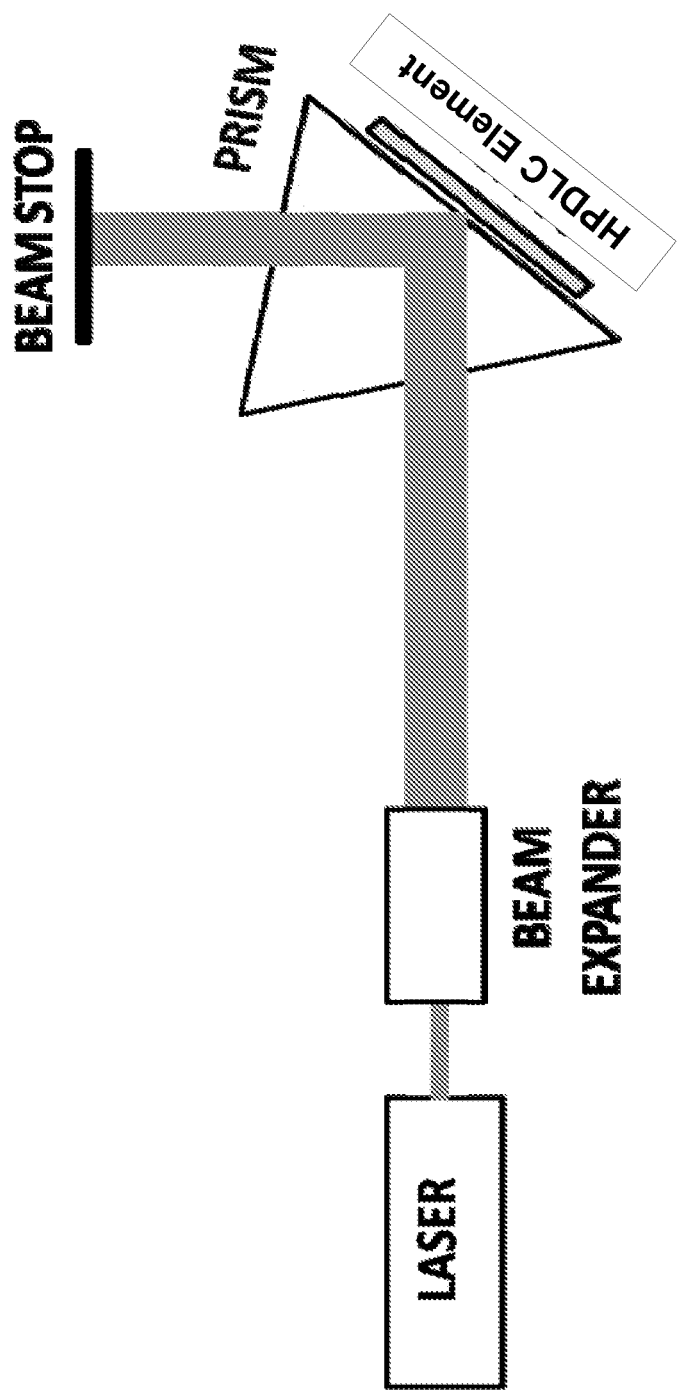
FIG. 6 depicts an example system and process for generating HPDLC elements.

FIG. 6 depicts an example system and process for generating HPDLC films. In an example embodiment utilizing the illustrated system, an HPDLC film can be created by starting with a homogeneous mixture of photosensitive monomer and micron sized LC droplets. The mixture can be exposed to an interference pattern, for instance a holographic interference pattern generated by directing light from a source onto a prism, and subsequently onto an HPDLC element. The light can be collimated (e.g., with a focus at infinity). In accordance with the illustrated embodiment, the light source is a laser light emitter. Characteristics of the beam of laser light can be tuned before the light reaches the HPDLC element, for example by passing the beam of light through a beam expander. While the HPDLC element is exposed to the interference pattern, LC droplets within the HPDLC element migrate to the low intensity regions of the interference pattern and photopolymerization of the monomer occurs in the high intensity regions of the interference pattern. The end result is a periodic structure of LC droplets and polymer layers. In their nominal state, the symmetry axis of the LC droplets are randomly oriented, which results in a refractive index mismatch between the LC layers and polymer layers, and creates a Distributed Bragg Grating Reflector (DBR). For normal incidence, the DBR reflects the Bragg wavelength, $\lambda_B$, $$\lambda_B = 2n\Lambda, \quad (1)$$

where n is the average refractive index of the grating and $\Lambda$ is the grating period, while passing all other wavelengths. Upon application of a bias voltage, the LC droplets align along the direction of the field, resulting in a refractive index match with the adjacent polymer layer due to birefringence of the LC material. This disrupts the Bragg condition and results in transmission of the Bragg wavelength along with all other wavelengths. The reflectivity, R, of the DBR is a function of the number of layers and refractive index difference, $$R = \left[ \frac{n_0 n_n^{(2N)} - n_s n_1^{(2N)}}{n_0 n_2^{(2N)} + n_s n_1^{(2N)}} \right]^2 \quad (2)$$

where $n_0$, $n_1$, $n_2$, and $n_s$ are the respective refractive indices of the surrounding medium, the alternating layers, and the substrate material, and N is the number of layers. The bandwidth (passband) of the DBR is a function of the refractive index difference, $$\Delta\lambda = \frac{4\lambda_B}{\pi} \cdot \sin^{-1}\left( \frac{n_2 - n_1}{n_2 + n_1} \right) \quad (3)$$

An HPDLC filter can be constructed by stacking a plurality of HPDLC elements, such as HPDLC films, each HPDLC element individually written to reflect a different Bragg wavelength across the desired operating waveband band. By disposing HPDLC elements adjacent to one another in the stack, for example in ascending order of Bragg wavelength, it is possible to construct an HPDLC filter through which no light will be transmitted, across the passband, in the nominal state (i.e., when no bias voltage is applied to the filter), since each HPDLC element will selectively reflect a given portion of the wavelength range. Biasing an individual HPDLC element within the stack, for example by applying an appropriate voltage, will result in transmission of the Bragg wavelength for that HPDLC element. Accordingly, an HPDLC filter constructed as described herein can be selectively tuned to pass at least one, such as a plurality of individual wavelengths, for example through the simultaneous application of voltages to respective ones of the HPDLC elements of the stack.

The small size of the LC droplets enables the HPDLC elements of the HPDLC filter stack to exhibit rapid switching response times, for example between the reflective and transparent states, for example, approaching 20 μs. Rapid switching response times allows imaging data collected through the HPDLC elements of the HPDLC filter to be spectrally multiplexed, or information to be collected for all the individuals wavelengths simultaneously (in parallel). These effects can be achieved by modulating each HPDLC element layer at a slightly different frequency and then synchronously detecting each information component. Alternatively, the detected waveform can be digitized and Fourier transformed (FFT) to retrieve the spectra, which can be more efficient for a system with a large number of HPDLC elements.

Figure 7:
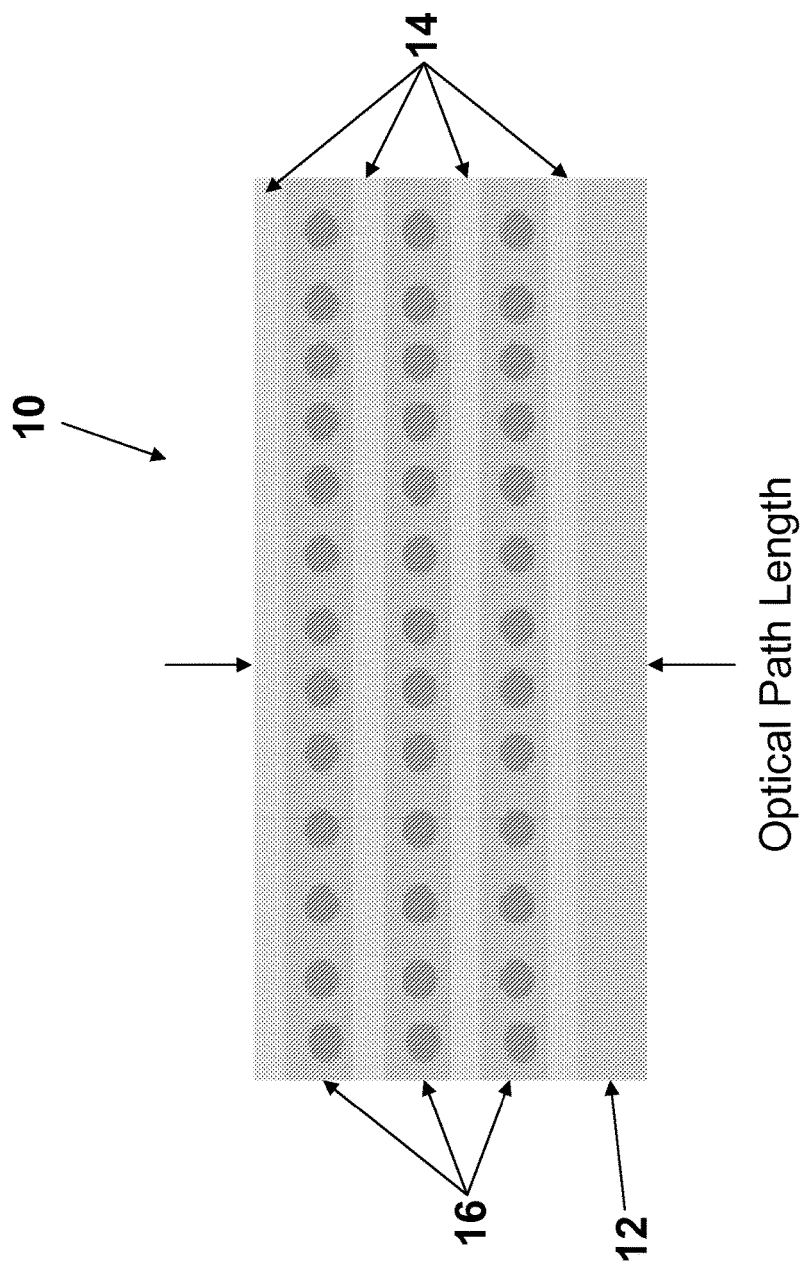
FIG. 7 is a diagram of an example HPDLC tunable filter stack.

FIG. 7 is depicts an example HPDLC tunable filter stack 10. In the example configuration depicted in FIG. 7, the HPDLC tunable filter stack 10 comprises a single glass substrate 12 and alternating conductive layers 14 and holographic polymer dispersed liquid crystal layers 16. The optical path length of the HPDLC tunable filter stack 10 is dramatically reduced relative to known HPDLC element stacks that comprise substrates sandwiching each respective HPDLC element because only one substrate 12 is used as a stage to support multiple HPDLC elements. The number of discrete HPDLC elements that comprise the stack 10 can be an appropriate number. For example, in an example configuration, the number of HPDLC elements is equal to or greater than 40.

Figure 8:
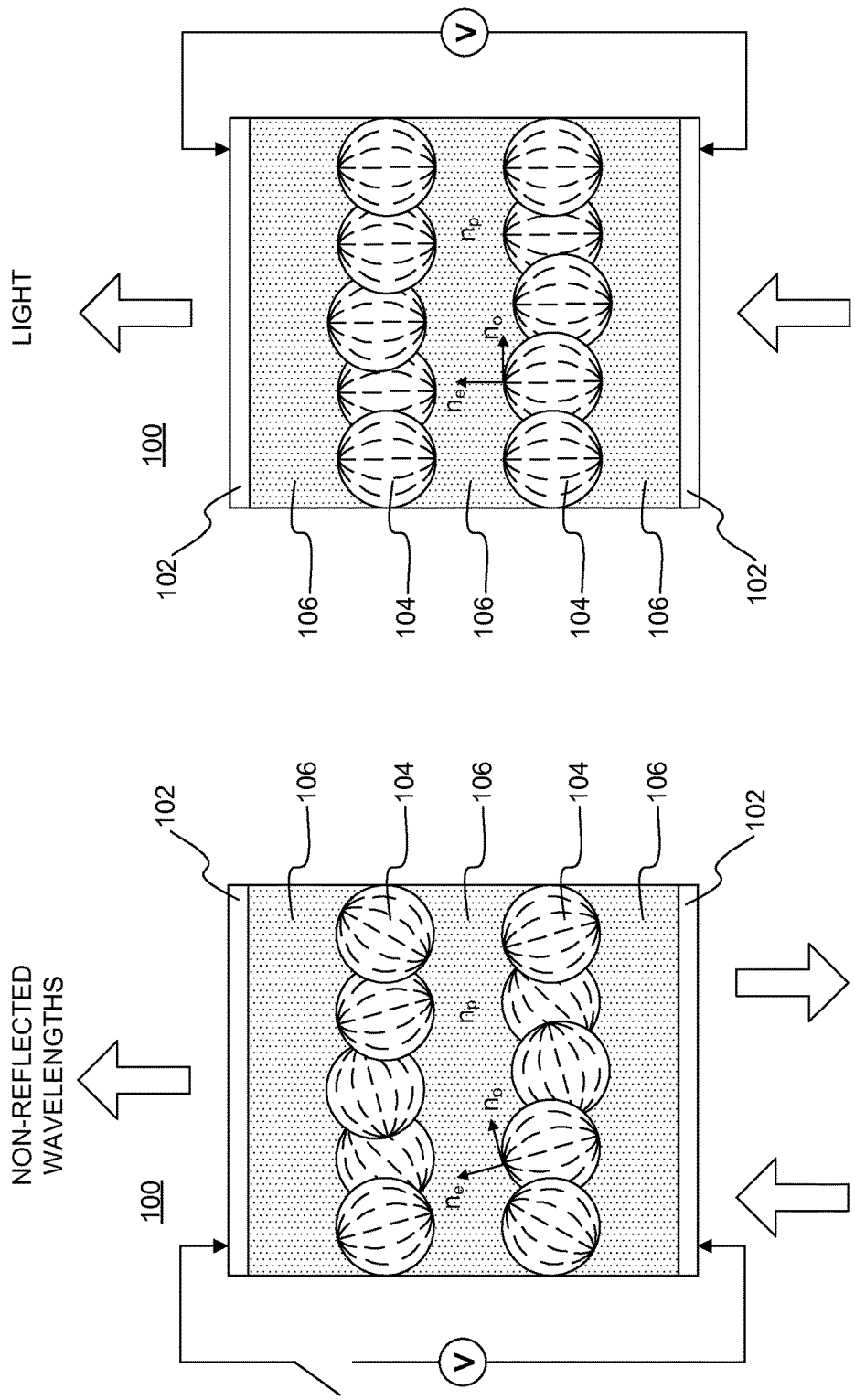
FIGS. 8a and 8b depict an example HPDLC element in unbiased and biased states, respectively.

FIGS. 8a-b depict an example HPDLC element in the form of HPDLC thin film 100. The HPDLC film 100 contains phase separated compositions formed under holographic conditions. The film 100 may comprise a pre-polymer mixture made up of low molecular weight liquid crystals and a photo-curable monomer. An initiator(s) may be added to sensitize the pre-polymer mixture to a particular wavelength of laser light that will be used during the formation process. A layer of the pre-polymer mixture may be placed between AR-ITO coated glass substrates 102 spaced, for example, 5 μm apart.

In an example formation process the pre-polymer mixture may be irradiated with one or more holographic interference patterns generated by one or more laser light beams. The holographic interference patterns produce high-light-intensity, or bright, regions and dark regions in the pre-polymer mixture. Irradiation of the pre-polymer mixture initiates polymerization of the monomer, which in turn induces a phase separation between the polymer and liquid crystals. The rate of polymerization may be approximately proportional to the square root of the light intensity for one-photon polymerization. Therefore, the rate of polymerization may be spatially dependent. During irradiation the monomer diffuses to the bright regions where it polymerizes. The liquid crystal remains in the dark regions and phase separates into small droplets in ordered, stratified layers. Polymer gelation locks the modulated structure indefinitely, resulting in liquid crystal droplet-rich areas where the dark fringes were, and essentially pure polymer regions where the light fringes were. As a result, a periodic array of liquid crystal droplets 104 and matrix polymer planes 106 may be produced, as depicted in FIG. 8a and FIG. 8b. The index modulation between the liquid crystal and polymer planes can be estimated from the index of refraction of the individual components. It should be noted that FIG. 8a and FIG. 8b are not to scale, that the number of layers of liquid crystal droplets and polymer depicted therein are merely examples, and that the scope of the instant disclosure should not be limited thereto. The reflection gratings formed may be post-cured with a UV blanket for an interval, for example 10 minutes, to react any unreacted monomers in the HPDLC medium.

The periodically repeating layers of polymer and liquid crystals comprise Bragg gratings. A Bragg grating typically reflects a narrow peak wavelength of light. The grating pitch, which is the width of one adjacent polymer and liquid crystal layer, may be determined by the following equation $$\Lambda = \frac{\lambda}{2n\sin\theta},$$

where $\lambda$ is the wavelength of the incident laser light, n is the effective refractive index of the polymer and liquid crystal composite, and $\theta$ is the angle with respect to the grating at which each of the laser beams is made incident on the pre-polymer mixture. The reflected Bragg peak wavelength, which can also be determined from the above equation, is directly proportional to the grating pitch. Accordingly, to create broadband reflecting gratings, the angle of incidence of the counter propagating beams may be taken into consideration in deciding the reflected wavelength of the HPDLC.

An electric field may be applied across an HPDLC medium to control the intensity of the wavelength of light reflected from the HPDLC. An electric field transforms the HPDLC from a wavelength selective device to an optically transparent or semitransparent state, as depicted in FIG. 8b. Thus, if no field is applied, as depicted in FIG. 8a, the HPDLC will reflect light at specific wavelengths corresponding to the Bragg grating(s) present in the HPDLC. When an electric field is applied, the liquid crystals in the HPDLC align with the direction of the field, making the HPDLC effectively transparent or semitransparent and allowing light to travel through the HPDLC medium. In an example embodiment, the HPDLC medium has a narrow peak reflection wavelength with a full width at half maximum (FWHM) varying typically from 5 to 20 nm and based on the thickness of the Bragg grating.

In an example embodiment, the liquid crystals may be made of dielectric nematic liquid crystals, which orient in the direction of an external electric field applied to the HPDLC. The refractive index of nematic liquid crystal along the optic axis is called the extraordinary refractive index, represented as $n_e$, and the refractive index perpendicular to it is called the ordinary refractive index, represented as $n_o$.

In an example HPDLC medium, in which the liquid crystal and polymer planes are oriented approximately parallel to the substrates, the operation of the Bragg gratings, serving as reflection gratings, are governed by the Bragg condition $$\lambda = 2\langle n \rangle d$$

for normal incidence. Here, d is the layer thickness and $\langle n \rangle$ is the average refractive index of the grating which can be approximated by $$\langle n \rangle \approx \phi_P n_P + \phi_{LC} n_{LC}$$

where $\phi_P$ and $\phi_{LC}$ are the volume fraction of the polymer and liquid crystal, respectively, and the average index of the liquid crystal may be given by $$n_{LC} = \sqrt{\frac{2n_o^2 + n_e^2}{3}}.$$

A large refractive index modulation between the liquid crystal rich planes and the surrounding polymer planes may yield high diffraction/reflection efficiency and low residual scattering when no field is applied. If the ordinary refractive index of the liquid crystal, $n_o$, matches the refractive index of the polymer, $n_g$, the HPDLC medium reverts to a transparent or semitransparent state (with the material optically homogeneous) upon the application of an electric field, as depicted in FIG. 8b.

In order to effectuate transfer of an HPDLC medium by releasing a glass substrate from an HPDLC sample, thereby facilitating grating surface metrology, the surfaces of the glass substrates are treated prior to holographic exposure with a release agent (e.g., surfactants such as Tween and Brix). Treatment with a release agent facilitates complete removal of an HPDLC medium. Following holographic exposure, one glass substrate may be released from the HPDLC medium and HPDLC medium removed. The grating film may then be adhered to an index-matched polymeric substrate coated with an index-matched conducting substrate using the same polymer employed in the grating matrix of the HPDLC medium (e.g., acrylated urethane). An example substrate suited for this purpose is poly-methyl-meth-acrylate (PMMA) coated with Baytron-P conducting polymer, but other substrates may be used. The remaining glass substrate may then be similarly replaced with a second polymeric substrate. If this process is repeated, an index matched completely polymeric HPDLC medium stack may be formed. In an example process, hardening polymers (e.g., Norland Optical Adhesive 63 and/or 68) may be added to the pre-polymer mixture, to increase the toughness of the resulting HPDLC medium.

HPDLC mediums formed using the methods and apparatus disclosed herein often demonstrate reflection efficiencies of 85-90%, switching fields of approximately 15-20 V/μm, and switching times less than 20 μs. Scattering intensities are typically less than $1 \times 10^{-7}$ dB outside the grating reflection peak. Wavelength shifts are typically less than $0.005\lambda$, which may be measured using, for example, a Zygo white light interferometer.

Various grating characteristics of HPDLC mediums may be analyzed to optimize performance. For example, the uniformity of the wavelength reflection peak can be determined. The exposed HPDLC medium may be analyzed using a spectra-radiometer to measure reflection properties of the gratings in multiple locations to ensure uniformity in the exposure process. Other parameters to be examined within each measurement may include wavelength peak, reflection intensity, spatial uniformity, and the like. In another example, the wavefront may be analyzed. Maintaining the wavefront properties of individual wave packets as they interact with the reflecting film ensures accurate measurement at the detector. In yet another example, HPDLC mediums may be examined using a white light interferometer, for example, to measure scatter. Scattering of reflected and transmitted light may result in stray measurements and noise at the detector. This scattering effect may be characterized and compared to scatter effects from existing reflective technologies in order to mitigate or minimize the effect. In yet another example, electro-optic switching properties of an HPDLC medium can be analyzed. This may be accomplished with the use of a spectra-radiometer and high-voltage (e.g., ~100V pp) switching setup, for example. When a high-frequency (e.g., 1 kHz) oscillating wave is applied to an HPDLC medium, the liquid crystal droplets align, effectively 'washing out' the Bragg grating. This enables partial switching of the entire grating, which can be used to 'grayscale' or vary the intensity of the grating. An HPDLC medium may be analyzed for uniformity in color purity, intensity, focal length and direction, and polarization during dynamic switching and grayscale switching.

Figure 9:
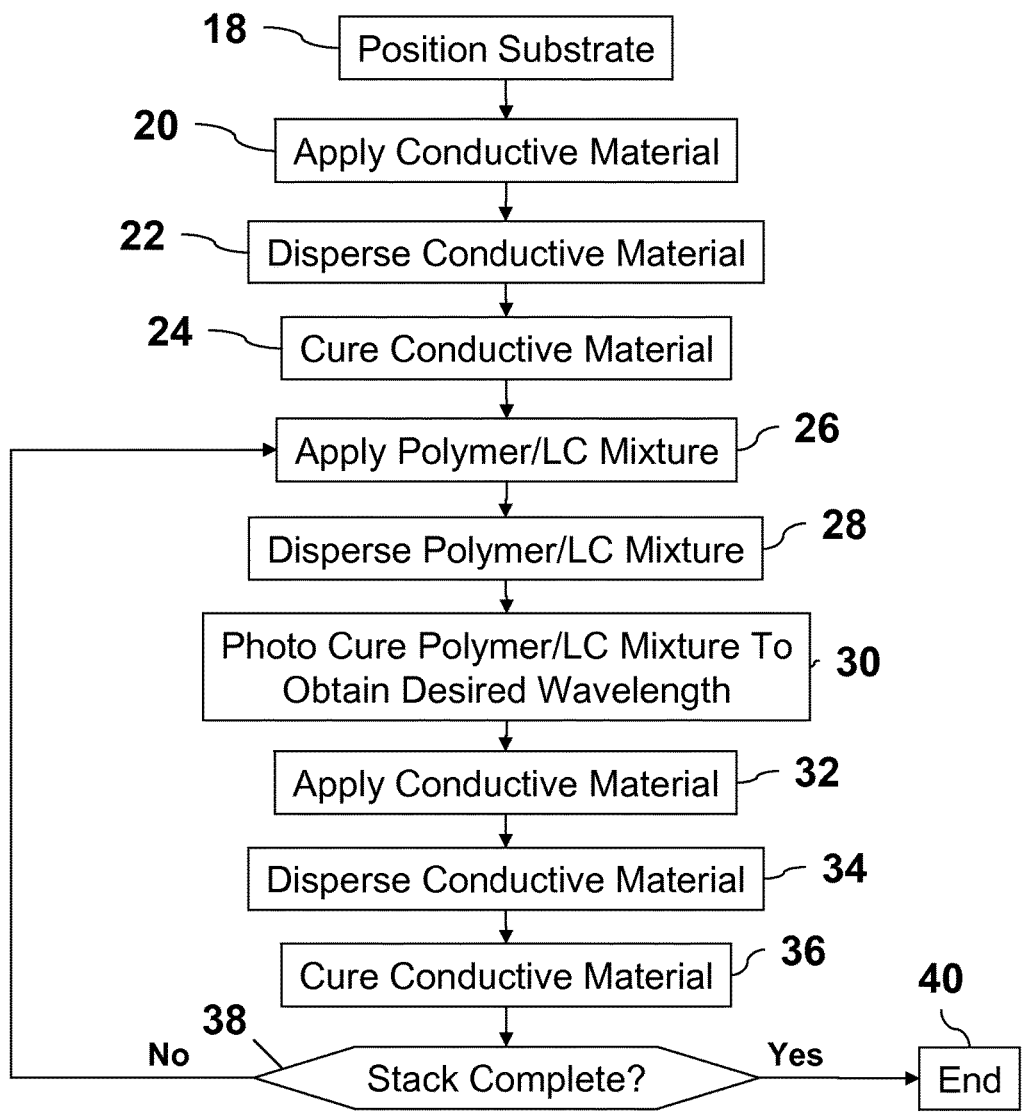
FIG. 9 is a flow diagram of an example process for fabrication an HPDLC tunable filter stack.
Figure 10:
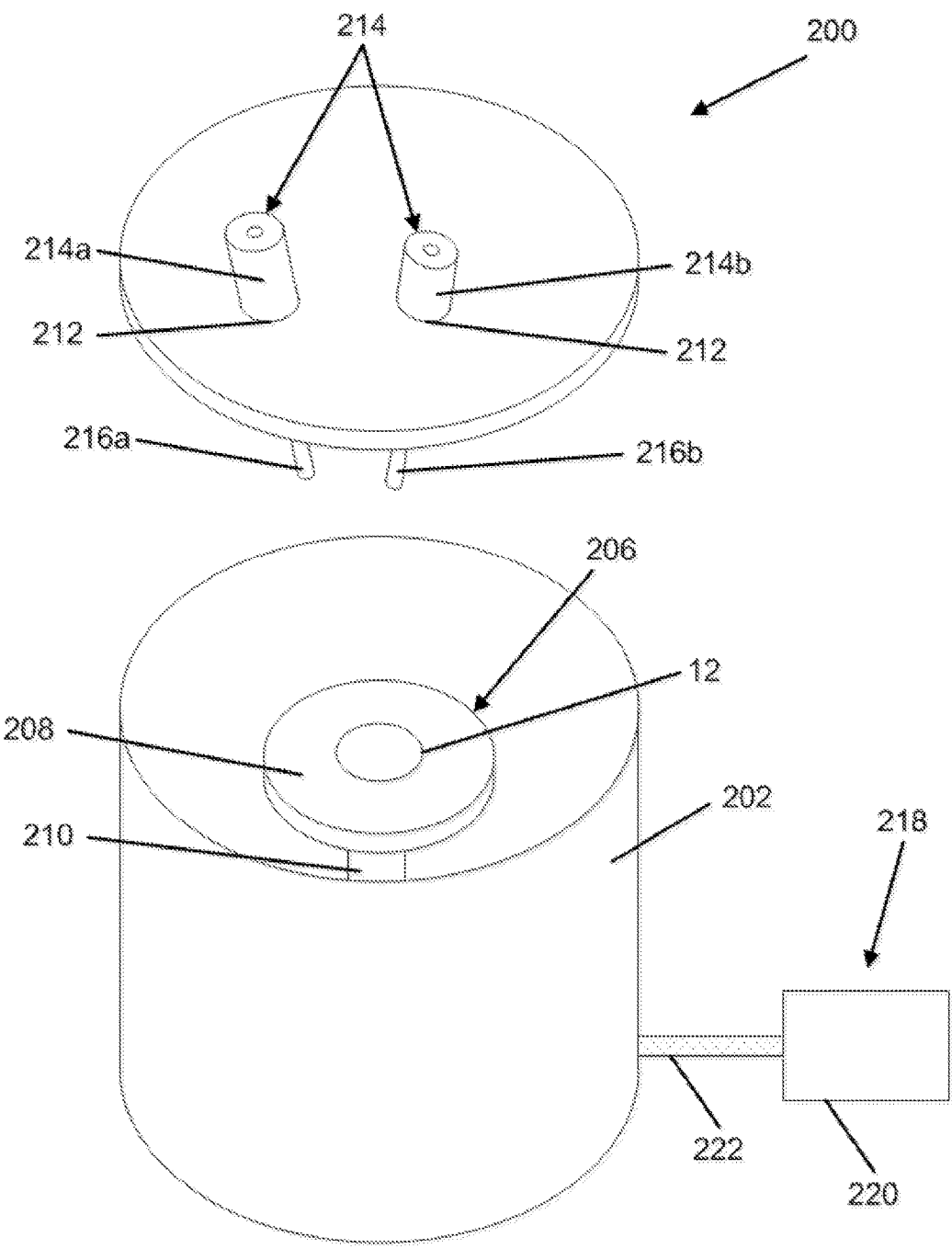
FIG. 10 is a perspective view of an example spin coating apparatus.

Referring now to FIGS. 9-10, an example method for fabricating an HPDLC element stack, for instance the HPDLC tunable filter stack 10 depicted in FIG. 7, is described. More specifically, FIG. 9 illustrates an example flow diagram for fabricating an HPDLC element stack. FIG. 10 illustrates an example spin coating apparatus 200 that can be utilized to fabricate an HPDLC element stack, such as the HPDLC tunable filter stack 10. Reference is made below of carrying out various steps of the fabrication method illustrated in FIG. 9 utilizing components of the spin coating apparatus 200. However, it should be appreciated that fabrication of the HPDLC tunable filter 10 via the steps of illustrated in FIG. 9 need not be carried out utilizing the spin coating apparatus 200, and that the HPDLC tunable filter 10 can alternatively be fabricated via the steps of illustrated in FIG. 9 and using any other suitable fabrications apparatus, as desired.

The illustrated spin coating apparatus, or spin coating system 200 comprises a vessel 202 having a detachable lid 204. The illustrated lid 204 is removable from the vessel 202, but could be alternatively configured as a lid 204 that is openable and closeable relative to the vessel 202, for example by hinging the lid 204 with respect to the opening at the top of the vessel 202. It should be appreciated that the spin coating system 200 is not limited to the illustrated cylindrically shaped vessel 202 and lid 204, and that the vessel 202 and lid 204 can be alternatively constructed defining any other suitable geometry as desired.

One or more additional components of the spin coating system 200 can be disposed within the vessel 202. For instance, the illustrated spin coating system 200 further comprises a rotatable stage 206 configured to be disposed into the vessel 202. In accordance with the illustrated embodiment, the stage 206 comprises a cylindrical platform 208 that is configured to have a substrate, such as the substrate 12, releasably secured thereto. The platform 208 is supported by the upper end of a rotatable shaft 210. The lower end of the shaft 210 can be coupled to a source of rotational force, such as a motor which can be disposed into the vessel 202 or located externally from the vessel 202 and coupled to the shaft 210 via a mechanical linkage. The motor can transmit a rotational force to the shaft 210, which in turn transmits the rotational force to the platform 208, thus causing the stage 206 to rotate. The speed of rotation (e.g., the RPM) and/or the direction of rotation of the stage 206 can be controlled, for instance via a motor speed control manually operated by a user of the spin coating system 200, electronically controlled, for instance by a software program, or by any combination thereof. In accordance with the illustrated embodiment, the stage 206 is substantially centered relative to the lower end of the vessel 202, but could be otherwise located within the vessel 202 as desired. The shaft 210 defines a height such that the platform 208 is accessible, for example to allow placement or removal of the substrate 12, when the lid 204 of the vessel is removed and/or open.

In accordance with the illustrated embodiment, the lid 204 defines at least one, such as a plurality of ports 212 extending therethrough. The lid 204 further comprises at least one, such as a plurality of dispensers 214, each dispenser 214 configured to be disposed within a corresponding one of the plurality of ports 212. Each of the dispensers 214 can be configured to dispense material into the vessel 202 and in particular onto the substrate 12. For instance, in accordance with the illustrated embodiment, a first dispenser 214a of the plurality can be configured to dispense the conductive polymer described elsewhere herein. A second dispenser 214b of the plurality can be configured to dispense the prepolymer mixture described elsewhere herein. The illustrated dispensers 214a, 214b, are disposed into corresponding ports 212 along respective trajectories that are offset with respect to the axis of rotation of the stage 208, such that respective tip 216a, 216b of each dispenser 214a, 214b, is disposed above substantially the center of the substrate 12. The dispensers 214a, 214b can be configured to dispense pre-determined amounts of their respective materials at pre-determined intervals, as described in more detail below. It should be appreciated that the spin coating system 200 is not limited to the illustrated number and/or placement of dispensers 214, and that the spin coating system 200 can alternatively be provided with any number and/or configuration of dispensers 214 as desired.

The spin coating system 200 can further comprise a light emitting assembly 218. Although the illustrated light emitting assembly 218 comprises a laser light emitter 220 configured to emit a laser beam 222, it should be appreciated that the light emitting assembly 218 can further comprise one or more devices configured to modify characteristics of the laser beam 222, such as beam expanders, lenses, beam splitters, or the like. It should be appreciated that the spin coating system 200 is not limited to a single light source as illustrated, and a plurality of light emitting assemblies 218 can be provided, as desired.

In accordance with the illustrated embodiment, the light emitting assembly 218 can be provided separate from the vessel 202, such that the beam 222 emitted by the light emitting assembly 218 is directed into an aperture extending into the vessel 202. Alternatively, the light emitting assembly 218 can be integral with the vessel 202 or the lid 204, as desired. In accordance with the illustrated embodiment, the laser beam 222 is redirected within the vessel, for example via the use of mirrors, beams splitters, or the like, such that the beam 222 is incident upon a prism, thereby creating an interference pattern to be created within material (e.g., prepolymer mixture) dispersed on the substrate 12, so as to form Bragg gratings, for example as described above with reference to FIG. 6.

Referring now to FIGS. 7, 9, and 10, at step 18, a substrate 12 is positioned. The substrate 12 can be positioned in any appropriate mechanism for fabricating the HPDLC tunable filter stack 10. For example, in accordance with the illustrated embodiment, the substrate 12 can be secured to the upper surface of the platform 208. The substrate 12 can comprise any appropriate material. For instance the substrate 12 can be glass, such as a 3 mm thick glass slide. At step 20, a layer of conductive material (e.g., conductive layer 14) is applied to the exposed surface of the substrate 12, for example by dispensing the conductive material from dispenser 214*a*. The conductive layer can comprise any appropriate material. For example, the conductive layer can comprise a conductive polymer. Example conductive polymers include PEDOT:PTS and PDOT:PSS.

At step 22, the conductive layer can be dispersed along the exposed, or upper surface of the substrate 12. For example, a portion of conductive material dispensed onto the substrate 12 by the dispenser 214*a* can be caused to disperse by applying a rotational force to the substrate 12. That is, the conductive material can be dispersed along the upper surface of the substrate 12 by rotating, or spinning the stage 208 at an appropriate speed. The rotational force can be applied to the substrate 12 by applying a rotational force to the stage 208, which in turn imparts the rotational force to the substrate 12 secured to the stage 208.

It may be desirable to vary the speed of rotation of the stage 208 during dispersal of the conductive material. For example, the stage 208 may be rotated at a first speed for a first interval of time, and rotated at a second speed for a second interval of time. The stage 208 can initially be rotated at a first pre-determined speed to cause an initial dispersal rate of the conductive material along the surface of the substrate 12. As the conductive material spreads radially further from the center of the substrate 12, the speed of rotation of the stage 208 can be increased, for instance to the second speed, to ensure that the conductive material continues to disperse at an even rate over the surface of the substrate 12, thereby ensuring a conductive material layer of substantially uniform thickness along the exposed surface of the substrate 12. In other words, the stage 208 can be rotated at a first speed for a first interval of time and at a second speed for a second interval of time. Alternatively, the speed at which the stage 208 is rotated can be uniform or varied between a first speed that is faster than a second speed, or the stage 208 can be rotated at more than two discrete speeds, such as three speeds, etc.

In an example embodiment, dispenser 214*a* can be configured to dispense a quantity of conductive material sufficient to be spun to an approximately 200 nm thick layer. Alternatively the conductive material can be applied to the substrate 12 and allowed to disperse on its own, without spinning the stage 208. At step 24, the conductive layer is cured. The conductive layer can be cured in any appropriate manner. For example, the conductive layer can be heated, the conductive layer can be allowed to evaporate on the exposed surface, the conductive layer can undergo controlled evaporation in a gas evaporation chamber, or the like. The stage 208 can come to rest during curing of the conductive layer, for example through application of a braking force counter to the direction of rotation, or by allowing the stage 208 to come to rest after ceasing application of the rotational force to the stage 208. Alternatively, application of the rotational force to the stage 208 can be maintained during curing of the conductive layer.

At step 26, a material comprising a prepolymer mixed with liquid crystals (e.g., the prepolymer mixture that, upon exposure, becomes holographic polymer dispersed liquid crystal layer 16) is applied to the exposed surface of the conductive layer (e.g., conductive layer 14), for example by dispensing the conductive material from dispenser 214*b*. At step 28, the prepolymer mixture is dispersed along the conductive layer. For example, a portion of prepolymer mixture dispensed onto the substrate 12 by the dispenser 214*b* can be caused to disperse by applying a rotational force to the substrate 208. That is, the conductive material can be dispersed along the upper surface of the substrate 12 by rotating, or spinning the stage 208 at an appropriate speed. The rotational force can be applied to the substrate 12 by applying a rotational force to the stage 208, which in turn imparts the rotational force to the substrate 12 secured to the stage 208. This second rotational force applied to the stage 208 to disperse the prepolymer mixture can be of the same or different magnitude as the first rotational force applied to the stage 208 at step 22 to cause dispersal of the conductive material.

It may be desirable to vary the speed of rotation of the stage 208 during dispersal of the prepolymer mixture. For example, the stage 208 may be rotated at a first speed for a first interval of time, and rotated at a second speed for a second interval of time. The stage 208 can initially be rotated at a first pre-determined speed to cause an initial dispersal rate of the prepolymer mixture along the surface of the conductive material layer. As the prepolymer mixture spreads radially further from the center of conductive material layer, the speed of rotation of the stage 208 can be increased, for instance to the second speed, to ensure that the prepolymer mixture continues to disperse at an even rate over the surface of the conductive material layer, thereby ensuring a prepolymer mixture layer of substantially uniform thickness along the exposed surface of the conductive material layer. In other words, the stage 208 can be rotated at a first speed for a first interval of time and at a second speed for a second interval of time. Alternatively, the speed at which the stage 208 is rotated can be uniform or varied between a first speed that is faster than a second speed, or the stage 208 can be rotated at more than two discrete speeds, such as three speeds, etc. The prepolymer mixture can thus be spun to form a coating of a polymer/LC, mixture material on the previous layer (e.g., the previously formed conductive layer 14). In an example embodiment, dispenser 214*b* can be configured to dispense a quantity of prepolymer mixture sufficient to be spun to an approximately 20 micron thick layer. Alternatively, the prepolymer mixture can be applied and allowed to spread on its own, without spinning the stage 208. As describe above, the stage 208 can come to rest between application of the first and second rotational forces.

At step 30, the prepolymer mixture is cured to form a polymer layer. For example, the prepolymer mixture can be exposed to a holographic interference pattern and photo-cured, as described above, to obtain an HPDLC element having the aforementioned optical properties associated with a specific wavelength. That is, exposure to the holographic interference pattern can cause a grating structure that reflects a particular wavelength, such as a Bragg grating, to be formed in the mixture (i.e., in the polymer layer). In accordance with the illustrated embodiment, the stage 208 is static during the curing process. Alternatively, the stage could continue spinning, and the interference pattern dynamically varied in accordance with creating the desired Bragg grating in the cured polymer layer.

At step 32, an additional layer of conductive material (e.g., conductive layer 14) can be applied to the exposed surface of the cured polymer layer (i.e., the mixture), such that the grating structure formed in the polymer layer is coated with the conductive material, such that an electric field (E-field) can be applied to the polymer layer. The additional, or second layer of conductive material can be applied as described above with reference to step 20. At step 34, the second layer of conductive material can be dispersed along the cured polymer layer, for example by applying a third rotational force to the stage 208 (i.e., spinning the stage 208) as described above with reference to step 22. At step 36, the dispersed additional layer of conductive material can be cured, for instance as described above with reference to step 24.

At step 38, it can be determined whether the HPDLC element stack is complete, that is if the HPDLC element stack comprises the desired number of alternating conductive and polymer layers. If, at step 38, it is determined that the HPDLC element stack is complete, the process ends at step 40, and a second substrate, such as a glass slide, can be affixed to the exposed layer of the HPDLC stack. If, at step 38, it is determined that the HPDLC element stack is not complete, the process proceeds to step 26 to fabricate additional conductive and polymer layers. By repeating steps 26 to 36, an HPDLC tunable filter can be fabricated. The characteristics of the resulting HPDLC tunable filter, for instance the spectrum of wavelengths that can be reflected by the filter, can be configured by exposing each polymer layer with an interference patterns designed to create an appropriate Bragg grating, during photocuring of each polymer layer, respectively.

The resulting HPDLC tunable filter can comprise an HPDLC tunable filter stack, more specifically a stack of HPDLC thin film filter elements. The HPDLC tunable filter stack can comprise alternating conducting and polymer layers, such that a first HPDLC thin film filter element abuts a first surface of an intervening conductive layer and a second HPDLC thin film filter element abuts an opposed second surface of the intervening conductive layer. The HPDLC thin film filter elements at opposed upper and lower ends of the stack can be disposed adjacent respective glass substrates, as described elsewhere herein, such that each HPDLC thin film filter element of the stack abuts a surface of a conductive element (e.g., a layer of conductive material) disposed adjacent to the HPDLC thin film filter element within the stack. Thus, the HPDLC tunable filter stack can comprise a stack of HPDLC tunable filter thin films and conductive elements.

Although the aforementioned fabrication techniques include spin coating and natural evaporation, it is to be understood that other appropriate fabrication techniques can be utilized. For example, a Langmuir trough can be utilized to fabricate films for the HPDLC tunable filter stack.

Figure 11:
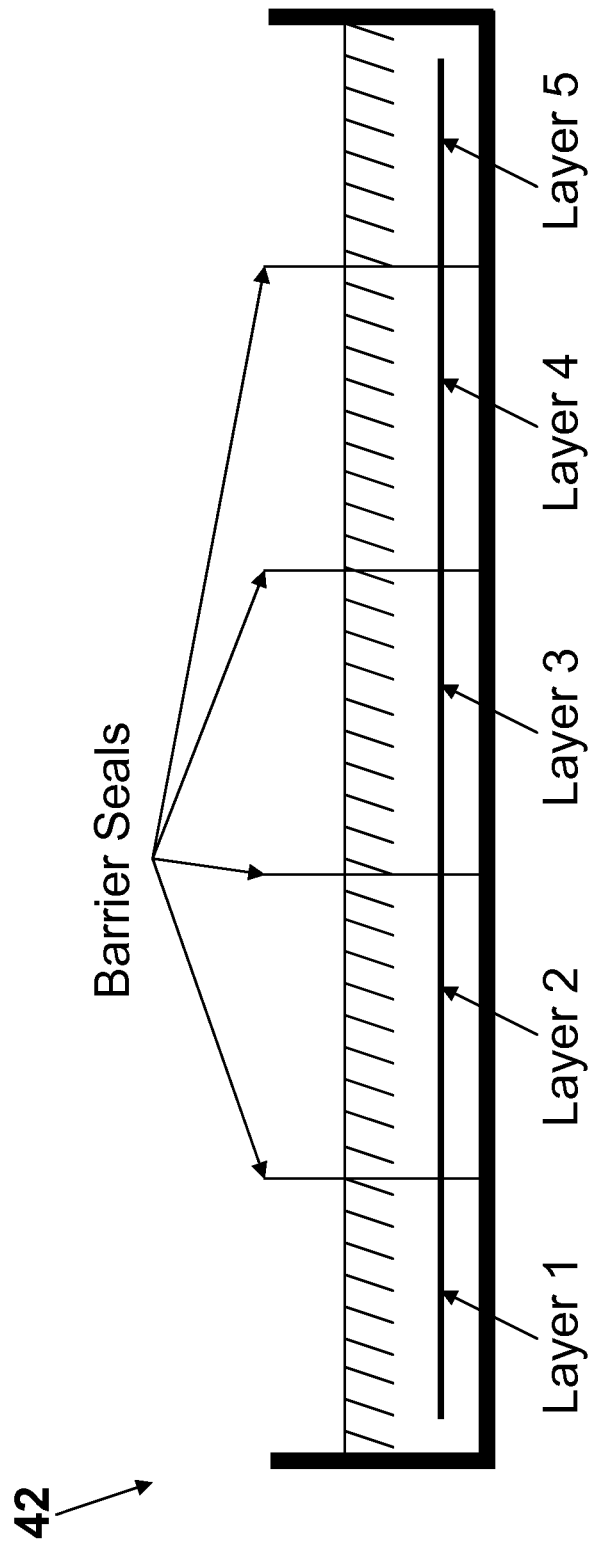
FIG. 11 is a depiction of an example Langmuir trough utilized to fabricate an HPDLC tunable filter stack.

It should be appreciated that the herein described HPDLC element stacks need not be created using the above described spin coating techniques, and that the HPDLC element stacks can alternatively be fabricated using other suitable processes. For example, FIG. 11 depicts fabricating an HPDLC tunable filter stack using a Langmuir trough 42. Layers of an HPDLC tunable filter stack to be fabricated, depicted as layer 1, layer 2, layer 3, layer 4, and layer 5, in FIG. 11, can be fabricated individually. Each layer fabrication compartment, confined by the bather seals (and the edge of the Langmuir trough for the end compartments), can be used to fabricate a desired type of layer. For example, the layer fabrication compartment in which layer 1 is placed can be filled with the appropriate conductive material and allowed to evaporate. The layer fabrication compartment in which layer 2 is placed can be filled with the appropriate polymer/LC mixture material and allowed to evaporate. The layer fabrication compartment in which layer 3 is placed can be filled with the conductive material and allowed to evaporate. The layer fabrication compartment in which layer 4 is placed can be filled with the appropriate polymer/LC mixture material and allowed to evaporate. And the layer fabrication compartment in which layer 5 is placed can be filled with the conductive material and allowed to evaporate. The appropriate polymer/LC mixture material layers can be exposed to respective interference patterns and optically cured to obtain respective desired Bragg gratings, and the resulting conductive and cured polymer layers can be positioned on a glass substrate to form an HPDLC tunable filter stack. For example, the layer sections can be folded to form a layered stack comprising alternate conductive layers and HPDLC layers, and can be placed on a glass substrate to form an HPDLC tunable filter stack.

Figure 12:
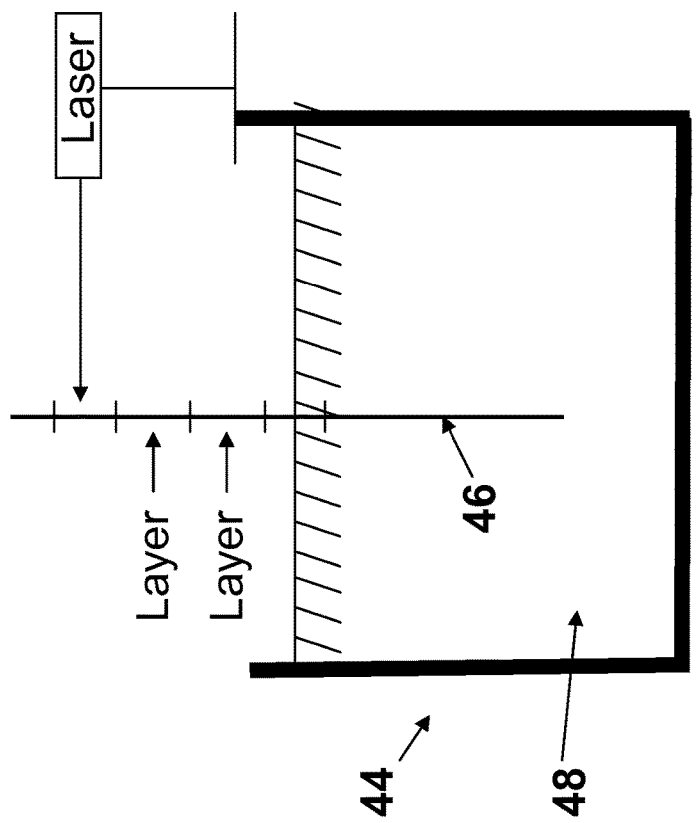
FIG. 12 is a depiction of another example Langmuir trough utilized to fabricate an HPDLC tunable filter stack.

FIG. 12 depicts an alternative example of fabricating an HPDLC tunable filter stack using a Langmuir trough 44. The Langmuir trough can be filled with an appropriate polymer/LC mixture material 48. A conductive layer 46 can be pulled through the material 48. As the conductive layer 46 is being pulled from the material 48, individual layer sections can be optically cured (as depicted by the laser in FIG. 12) to achieve a desired Bragg wavelength. For example, alternate layer sections can be optically cured. Upon completion of the optical curing of the desired number of layer sections, the layer sections can be folded to form a layered stack comprising alternate conductive layers and HPDLC layers, and can be placed on a glass substrate to form an HPDLC tunable filter stack.

Electrical and/or optical characteristics of HPDLC elements can be at least partially determined based upon, for example, the composition of the prepolymer mixture, the conductive polymer used in between polymer layers, and/or the equipment and techniques employed during fabrication of the HPDLC elements. For example, 30 to 50 mm clear aperture HPDLC elements exhibiting uniform reflection efficiency across the aperture area can be fabricated by passing the laser beam (e.g., laser beam 222) through a high power pinhole to achieve flat wavefronts and by expanding the beam waist to 50 mm using a high power beam expander. A high power single mode 533 nm laser with a peak tunable output of 10 W can be used as a source to achieve a uniform illumination of 200 mW/cm$^2$ across the aperture since the photo-polymerization of HPDLC is sensitive to gradients. The total internal reflection phenomenon from a prism can be the source of an interference pattern which can be recorded in the HPDLC element. Changing the angle of incidence of the beam on the prism enables fabrication of HPDLC elements configured to reflect at various wavelengths. HPDLC elements capable of reflecting in the range of 400 nm to 600 nm can be fabricated using a high power continuous wave (CW) laser radiating at 355 nm and HPDLC elements capable of reflecting in the range 600 nm to 800 nm can be fabricated using a high power CW laser radiating at 533 nm.

Further, HPDLC elements exhibiting reflection efficiencies 70% and beyond, and exhibiting minimized band scattering, can be fabricated. In an example embodiment, a reduction in off band scattering can be achieved by increasing reflection efficiency. For example, introducing a high dielectric anisotropy MLC 6240 000 ($\Delta\in=35$, $\gamma=65cp$) into the BL038 ($\Delta\in=16.9$, $\gamma=72cp$) LC system that phase separates into the LC rich regions forming smaller droplets than the critical size of scattering can in turn improve the reflection efficiency by increasing the index modulation between the LC rich and polymer rich regions. The reflection efficiency is given by:

$$\eta = \frac{|\kappa|^2 \sinh^2(sL)}{s^2 \cosh^2(sL) + \left(\frac{\Delta\beta}{2}\right) \sinh^2(sL)} \quad (4)$$

In the above equation (4) since efficiency is proportional to $$\kappa = \frac{2\pi n_1 n_o \Lambda}{\lambda^2}, \quad (5)$$

incrementing $\in$ in $n_1 = \sqrt{\in}\mu$ directly improves the reflection efficiency.

Additionally, reflection efficiency band scattering can be improved by fabricating a combination of alternating pure LC and polymer layers and HPDLC while maintaining polarization insensitivity using the aforementioned fabrication technique.

Figure 13:
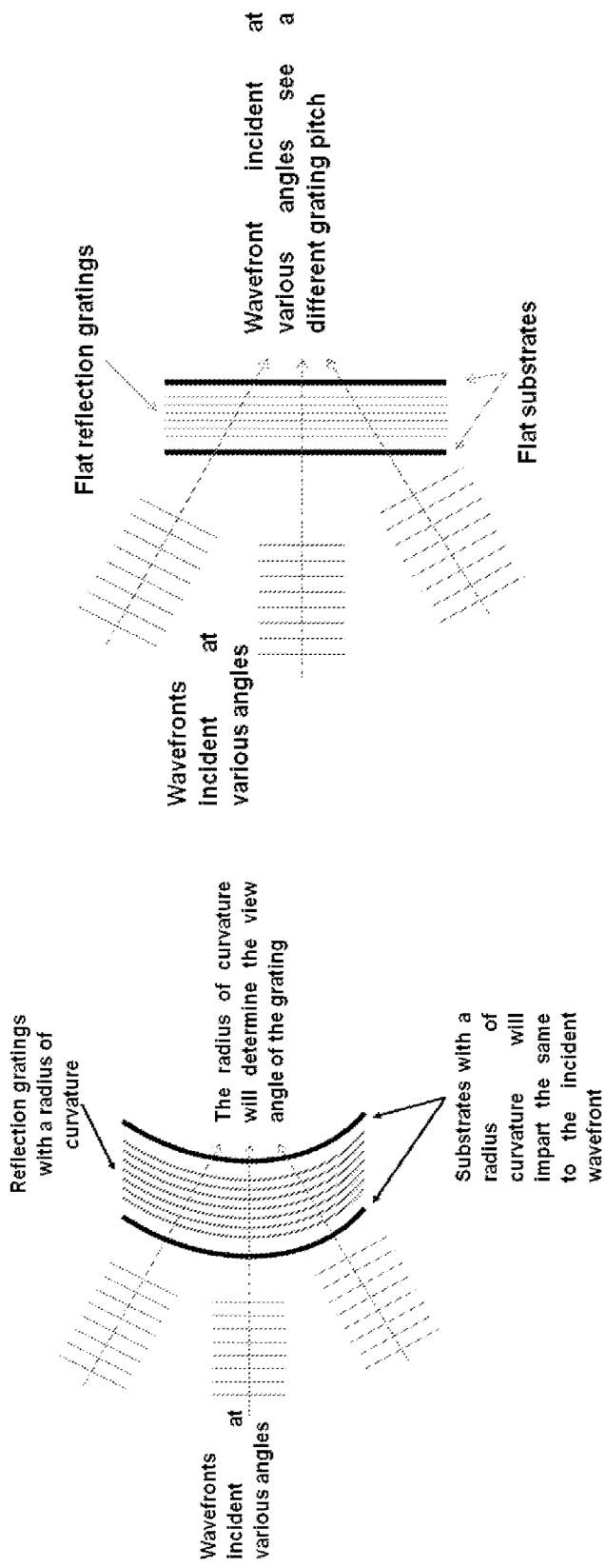
FIG. 13 depicts techniques for enhancing the viewing angle of HPDLC elements during fabrication.

Various techniques can enhance the viewing angle of HPDLC elements and mitigate blue shift in the reflected wavelength observed at angles of incidence other than normal to the grating vector. For example, as depicted in FIG. 13, this limitation can bypassed by adding a curvature to the grating, where the degree of curvature controls the view angle of the HPDLC element. This technique is akin to concentric spheres where the distance between the surfaces of two consecutive spheres is equivalent to the grating pitch and the light incident from any direction on such a structure sees a constant grating pitch rather than a variable one as in case of conventional gratings. Fabricating HPDLC elements using curved substrates can help to impart the grating curvature to the incident wavefront, and thus minimize any path length mismatch.

Switching response times and/or the switching voltage of HPDLC elements can be reduced by improving the electro-optic properties of the polymer layers of HPDLC elements, for instance by introducing dopants into the prepolymer mixture. For example, in an example embodiment, switching times can be reduced and response times can be reduced by adding predetermined amounts of carbon based nanoparticles to the HPDLC prepolymer mixture before hologram recording. During the process of phase separation carbon based nanoparticles can become trapped in the polymer matrix and act as physical barriers to the counter diffusing LC's, preventing coalesce, thereby reducing the droplet size, and imparting conductivity to the polymer matrix. The equation below explains the reduction in switching voltage.

$$V_c = \frac{d_o}{3a}\left(\frac{\sigma_{LC}}{\sigma_{polymer+mwnt}} + 2\right)\left(\frac{K(1^2+1)}{\varepsilon_o \Delta \varepsilon}\right)^{1/2} \quad (6)$$

A change in conductivity enhances the E-field across the LC droplet in accordance with:

$$E_{LC} = E_{appl}\left(\frac{3\sigma_{polymer+mwnt}}{2\sigma_{polymer+mwnt} + \sigma_{LC}}\right) \quad (7)$$

Moreover, addition of optimal amounts of a conductive polymer such as the commercially available PEDOT:PSS, can reduce the switching voltages of HPDLC elements, and can improve the switching response of HPDLC elements in accordance with the above equations.

Figure 14:
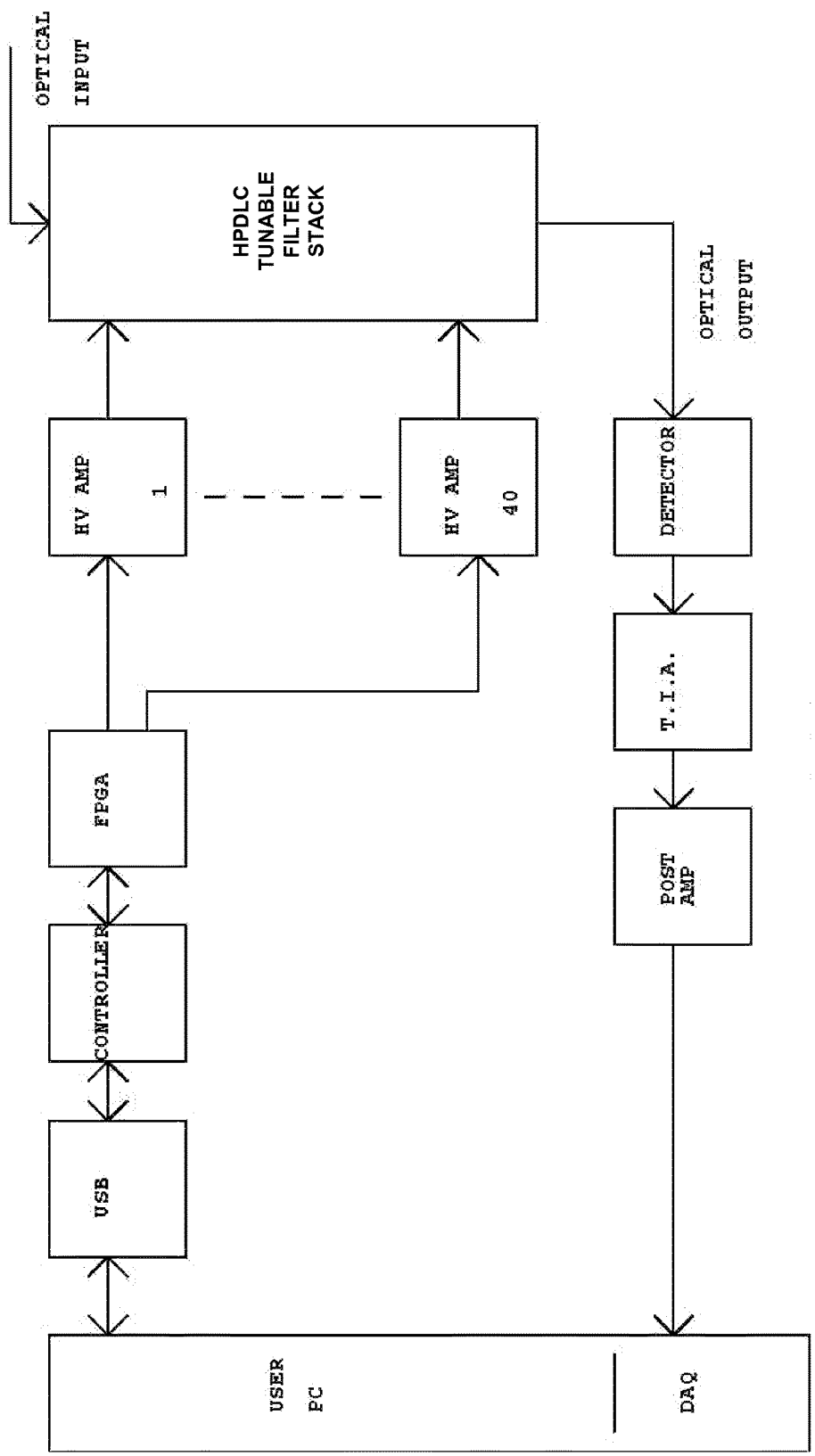
FIG. 14 is a block diagram of an example optical filter system into which an HPDLC tunable filter stack can be incorporated.

FIG. 14 is a block diagram of an example optical filter system into which an HPDLC tunable filter stack can be incorporated. In an example embodiment the system depicted in FIG. 14 can comprise four operating modes: unipolar mode (simultaneous mode), step mode, bipolar mode, and external mode. In unipolar mode, HPDLC element can be switched on and off at a unique frequency. Spectral amplitude data can be extracted from the detected digitized signal using a fast Fourier transform (FFT). In step mode, each HPDLC element can be switched on sequentially. Spectral amplitude can be extracted by storing the detected signal at the end of the on time pulse. The step pulse width can be determined by the optical filter characteristics. In an example configuration, the step pulse is 100 µs. In bipolar mode, an HPDLC element can be driven with a bipolar square wave, resulting in the HPDLC element being turned on continuously (DC). Detected data can be processed by averaging the digitized output. In the external mode all enabled HPDLC elements can be driven by an external frequency applied to a connector. Each of the HPDLC elements in the HPDLC tunable filter stack can have separate enable commands.

In an example embodiment, the controller depicted in the optical filter system shown in FIG. 14 can receive commands from and send data to a user pc via a USB port. The controller can reformat commands and send data to a field programmable gate array (FPGA). The controller can comprise any appropriate controller, such as a microcontroller design based on the TI TMS320F2812, for example.

The FPGA can receive commands from the controller, and send commands to at least one, such as a plurality of high voltage amplifiers. In the example system depicted in FIG. 14, there are 40 high voltage amplifiers corresponding, respectively, to 40 HPDLC elements. A high frequency clock can be divided to create forty unique frequencies for the unipolar mode. The frequency values can be determined by system analysis. In an example configuration, the FPGA generates ten frequencies between 1 kHz and 2 kHz. A parallel bus can be used to receive commands from, and send data to the controller.

A data acquisition card can be used to acquire an analog signal from an amplified silicon photodiode and to extract spectral data using various techniques such as fast Fourier transform for the unipolar mode, or sample and hold for the step mode. A camera can be used for hyperspectral imaging. The image acquisition scheme can comprise any appropriate image acquisition scheme, such as Firewire or USB2 interface, for example.

In an example configuration, the high voltage amplifiers can drive the HPDLC elements (i.e., optical filters) with square waves of 0 to HV (unipolar and step modes), or +/− HV square waves (bipolar mode). The value of HV can be determined by the filter characteristics, and, in an example configuration is about 150 volts. In another example configuration, the amplifier can be replicated in an application specific integrated circuit (ASIC). An ASIC with at least 10 amplifier circuits can meet the long term goal of a compact instrument. The design can use high voltage switching transistors and resistors. Switching voltage can be determined by the high voltage power supply.

Figure 15:
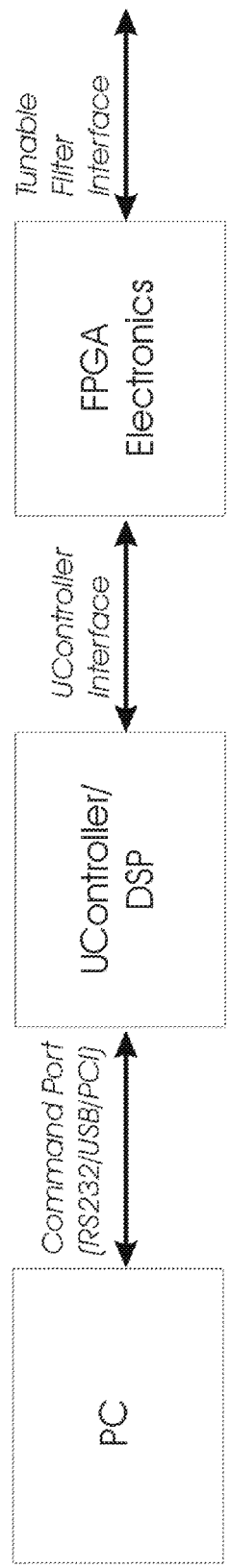
FIG. 15 is a diagram of a TMS320F2812 microController.

A processing architecture of the system can accept system control commands from a PC compatible interface (RS232, PCI, or USB) and can accomplish those commands via an FPGA-controlled HPDLC tunable filter stack. The commands can select the mode of operation (e.g., simultaneous, step, bipolar, or external) and/or which filter, filters, or filter ranges to enable in each mode. An example processing architecture comprises a Texas Instruments TMS320F2812 microController/DSP, as illustrated in FIG. 15. The TMS320F2812 DSP has 32-bit, fixed-point DSP core, up to 150 MIPS operation (millions of instructions per seconds), 1.9V core and 3.3V peripherals, a complete software development package, a C Compiler/Assembler/Linker, real-time debugging, 128 Kbytes of Flash for embedded autonomous operation, 16 Kbytes of RAM for fast execution speeds, standard UART serial port interface for PC communication, 56 Programmable I/O lines for user-defined I/O control/status, and 16 channel, 12.5 MHz A/D data acquisition capability.

Figure 16:
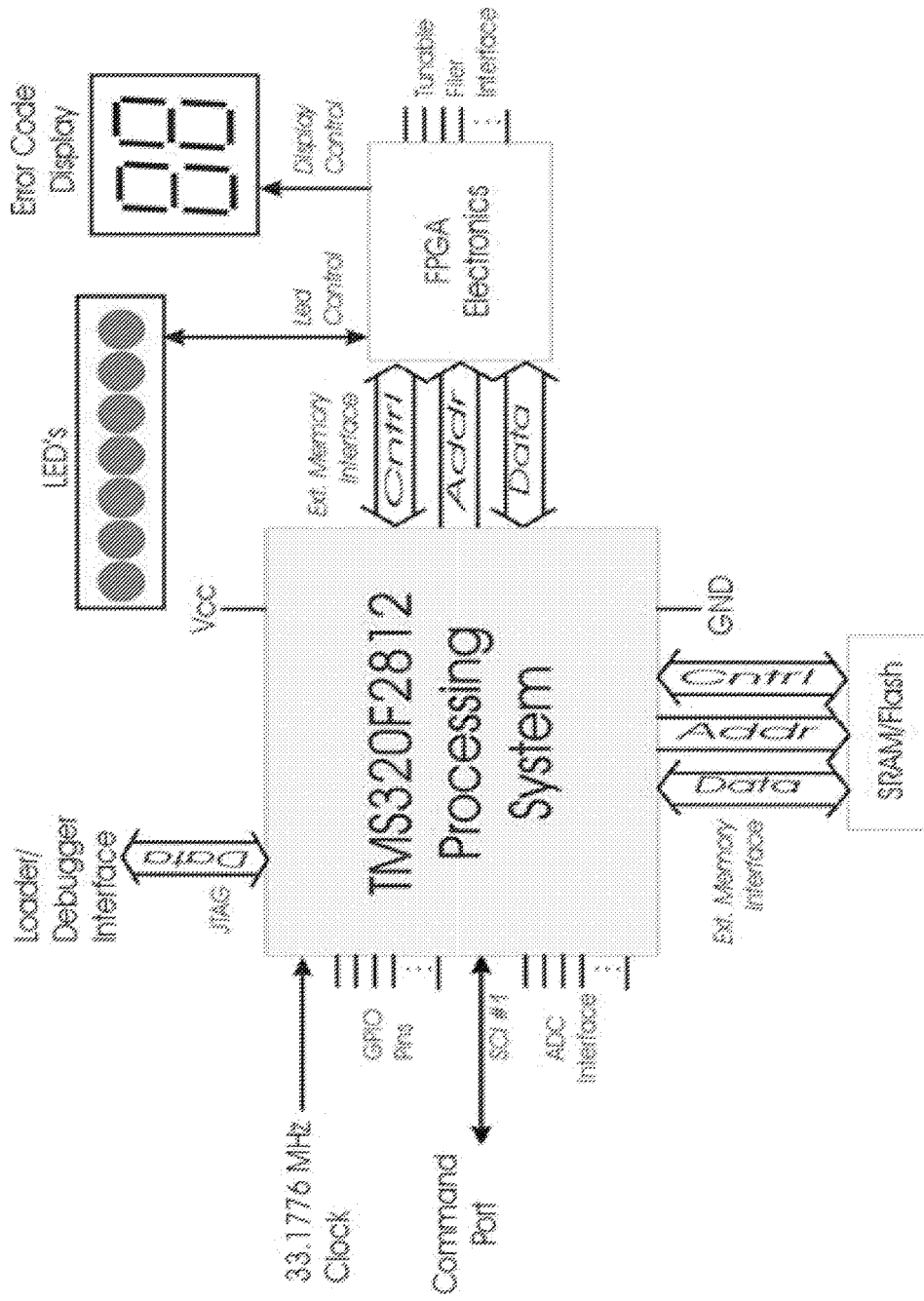
FIG. 16 is a diagram of an example system comprising the TMS320F2812.

FIG. 16 is a diagram of an example implementation of the TMS320F2812 within the above-described system. The system in FIG. 16 illustrates example interconnects between the microController/DSP and external devices (protocol, data components, and rates), defining software components required for the programs, and updating throughput and sizing estimates. The Serial Communication Interface (SCI) can be used to accept mode/filter selection commands from the user. The external interface (XINT) can be used to communicate these commands to the FPGA for implementation using the HPDLC tunable filter stack. During debug and testing, the developed software can be loaded and executed via the JTAG interface to allow for the full suite of debugging/analysis options available from Texas Instruments Integrated Development Environment (IDE) to be utilized. Subsequently, all program code and data can be stored in the on-chip flash memory to be executed autonomously on power up. Any time-critical software identified during development can be transferred from flash to RAM on power up to increase throughput margins. A 33.1776 MHz clock can be used to drive the processor. A bank of LEDs and hex digital display can be made available via an external memory interface with address and data lines for debug purposes.

The HPDLC tunable filter stack can be used in a variety of applications. For example, the HPDLC tunable filter stack can be utilized to form a lightweight mirror with electronically switchable focal points for remote sensing. HPDLC mediums may be stacked in one configuration of such a mirror. Electrically switchable thin-film polymeric mirror stacks exhibit good optical characteristics and typically only weigh several pounds, even when including drive electronics. In an example configuration, each layer of the mirror stack comprises a spherically curved Bragg grating with a focal point independent from the other layers. This configuration enables such applications as electrically refocused virtual mirrors for instrument clustering.

Broadband HPDLC mirror stacks may be constructed by forming, for example, 5 cm diameter broadband HPDLC reflecting mirrors, and laminating them together. One laminating technique that may be used in the construction of a mirror stack comprises gluing the HPDLC mirror films together using optical adhesive. To adhere multiple HPDLC mirror films together using optical adhesive, the HPDLC mirror films may be formed on traditional ITO-coated glass substrates, and may be laminated into a stack using optical adhesive. An example of a suitable adhesive is Norland Optical Adhesive 71, as it possesses several advantageous characteristics, for example UV optical curing that permits precise alignment with no time pressure, very low absorption in the visible wavelength regime resulting in low optical transmission loss, and index of refraction matching the glass substrates, but other adhesives may be used.

Another technique for laminating HPDLC mirror films together to form a mirror stack involves transferring the HPDLC mirror films (after holographic exposure) to index matched polymeric substrates coated with conducting layers, thereby reducing optical losses through the stack. The HPDLC mirror stack laminating techniques disclosed herein are merely examples. Alternative laminating techniques may be obvious to those skilled in the art, and are meant to be included within the scope of this disclosure.

An example application of electrically-switchable thin-film polymeric mirrors lies in the optics systems of satellites. A significant limiting factor for satellite design is overall weight, particularly the relatively heavy optics associated with the primary mirrors typically used in satellites for collecting and focusing light on instrumentation, for example cameras, spectrometers, and the like. Additional design considerations include potential complications and weight associated with mechanically-operated beam steering optics typically necessary to utilize multiple instruments with a single primary collection mirror. Current state-of-the-art satellite optics technology employs polished aluminum mirrors, weighing up to several hundred pounds for a one-meter diameter mirror. Cost per pound of payload launched into low earth orbit typically places severe restrictions on the size and extent of light collection devices that can be included on specific missions. The herein described electrically-switchable thin-film polymeric mirrors may allow clustering of multiple scientific instruments around a single lightweight primary mirror and redirection of the focal point of the mirror to individual instruments, using devices that do not require moving parts.

In another example application, an HPDLC tunable filter stack can be used to perform hyperspectral imaging. A shortcoming of known hyperspectral imagers is that typically each spectral resolution element is acquired in series, with the integration time associated with the acquisition of each spectral resolution comprising only a small fraction of the total hyperspectral cube acquisition time. Because the herein described HPDLC elements exhibit rapid switching response times, imaging data can be collected through the HPDLC elements of the HPDLC filter stack in a spectrally multiplexed fashion. In other words, imaging data can be collected through each of the HPDLC elements simultaneously. The capability to rapidly tune between and/or through the spectral bands enables the HPDLC tunable filter stack to be deployed in circumstances where known hyperspectral imaging devices exhibit limited capabilities, for instance hyperspectral imaging from a moving platform such as an aircraft. The HPDLC tunable filter stack can overcome these limitations. For example, the ability of the HPDLC tunable filter stack to rapidly acquire the hyperspectral cube minimizes artifacts due to the motion of an object during the acquisition. An ideal switching rate between spectral bands for such an application is less than 1 ms.

Hyperspectral imaging systems can produce a continuous spectrum of light which can define the chemical composition of the scene elements via their spectral signatures. Example applications of hyperspectral imaging using the HPDLC tunable filter stack include, but are not limited to: surveillance and/or remote sensing from a moving platform including airborne, for instance the airborne detection of activities associated with the production of weapons of mass destruction; time resolved biological measurements; ranging (e.g., photon-counting MCP/CDL imager); particle scattering measurements; mine detection; defeating camouflage, concealment, and deception (CC&D); agricultural assessment and mapping, oil, gas, and mineral exploration; natural hazard detection (e.g., oil spills, floods, forest fires, volcanoes); coastal mapping (e.g., phytoplankton detection, ocean color, river deltas, iceberg tracking); and environmental detection (e.g., air pollution, opacity monitoring).

FIG. 17 is a table depicting performance characteristics of an example HPDLC tunable filter stack fabricated in accordance with the herein described methods and techniques. Acceptance angles beyond 45 degrees are supported by the HPDLC tunable filter stack. An example HPDLC tunable filter stack spanning approximately the 500 to 800 nm spectral range exhibits a switching speed of 20 µs, an ability to modulate at frequencies up to 40 kHz, an ability to perform synchronous detection with ten separate spectral channels, a spectral resolution of better than 10 nm, a reflection efficiency (equating to throughput) of 60%, and an electro-optic response time of 20 µs, with a filter aperture of about 20 mm to 30 mm. The example HPDLC tunable filter stack can be fabricated using acrylate materials, thiolene materials, or the like.

The HPDLC tunable filter stack can support different modes of operation depending, for instance, upon the filter driving electronics employed to drive the HPDLC tunable filter stack. A first mode of operation of the HPDLC tunable filter stack can be a unipolar mode that comprises a 0-100V, 50% duty cycle square wave at selectable drive frequency across 1-2 kHz. This operation mode can provide parallel collection of spectral data (i.e., spectral multiplexing where synchronous detection can be provided for each channel). A field programmable gate array (FPGA) can be used to provide square wave inputs to the synchronous detection circuits that are in phase or quadrature with the drive signal, allowing in phase or quadrature components of the detected signal to be measured. The synchronous detection outputs can be filtered by a 2 pole low pass filter with a bandwidth of 50 Hz.

A second mode of operation of the HPDLC tunable filter stack can be a bipolar mode that comprises a ±100V, 50% duty cycle square wave at selectable drive frequency across 1-2 kHz. This operation mode can provide DC operation (full transparency) of an individual HPDLC filter element. DC operation can enable analysis of HPDLC filter characteristics (transmission, resolution) with a conventional COTS spectrometer.

A third mode of operation of the HPDLC tunable filter stack can be a step mode that comprises a 100V, 500 microsecond pulse applied sequentially to each HPDLC filter element. This operation mode can provide operation with a high bandwidth detector such as the single photon detection RULLI sensor system technology. Sample and hold circuits can provide a triggered output for each channel. The pulse duration can be modified to accommodate slower or faster requirements.

A fourth mode of operation of the HPDLC tunable filter stack can be an external mode comprising a TTL square wave input. This operation mode can provide the ability to externally drive an HPDLC filter with a function generator.

Figure 18:
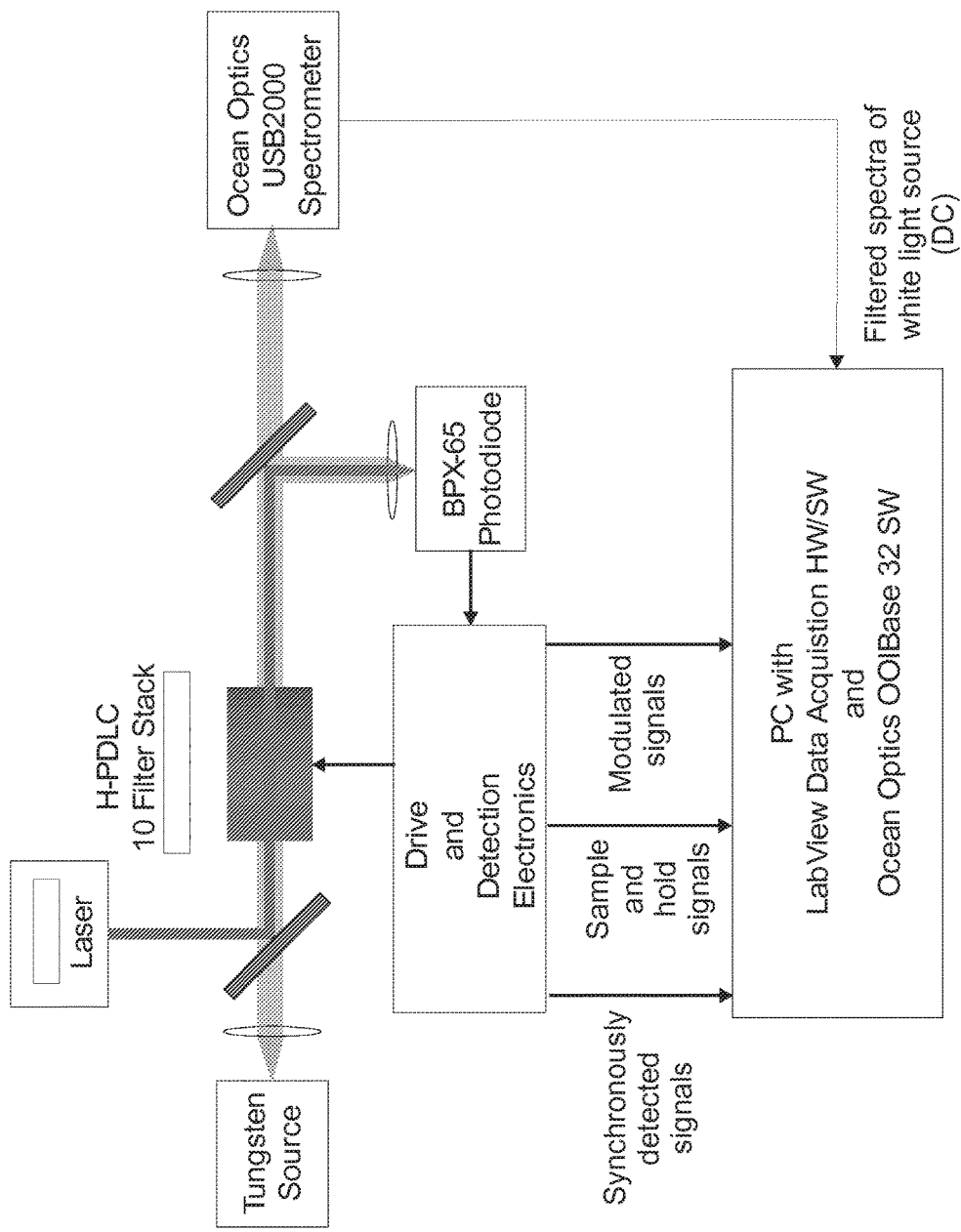
FIG. 18 is a block diagram of the breadboard system used to evaluate an example HPDLC tunable filter stack.

FIG. 18 depicts a breadboard system that can be used to evaluate the HPDLC tunable filter stack. Various light sources can be used to test the HPDLC tunable filter stack, for instance a monochromatic laser operating at 532 nm or a polychromatic tungsten lamp. The light sources can be directed through the HPDLC filters and then separated for analysis using a pair of beam splitters. The sources can be operated independently. The laser can be used to measure the frequency response of the HPDLC tunable filter stack and crosstalk between HPDLC filter elements. The white light source can be used to measure the resolution and transmission of the HPDLC tunable filter stack.

A silicon photodiode, such as a Siemens BPX65, 1 mm square active area, can be used for light detection. The photodiode can be installed on an electronics pre-amplifier board that includes a transimpedance amplifier for converting the diode current signal to a voltage. This board can be integrated with the above-described drive and detection electronics custom controller. The drive and electronics board can support the above-described modes of operation and can provide a number of outputs, including but not limited to: synchronous detection wherein the outputs of up to ten HPDLC filter channels after synchronous detection can be provided on a separate connector, the signals sampled in unipolar mode; sample and hold wherein sampled outputs of up to ten HPDLC filter channels can be provided on a separate connector, the signals sampled in the step mode; and modulated signals wherein the photodiode signal after amplification can be provided on a separate connector, the signal containing the multiplexed output of the HPDLC filter elements. In an example embodiment, modulated signals mode can acquire data via a data acquisition system and perform a fast Fourier transform to extract the spectral information.

A spectrometer, such as an Ocean Optics USB2000 COTS grating spectrometer, can be used for spectral analysis in the static bipolar mode. The spectrometer software can provide both data acquisition and analysis of the spectra via a USB port. The spectrometer operates from 350 to 850 nm (50% average efficiency in the visible) and has a 25 µm slit that provides a 1.23 nm spectral resolution.

The breadboard hardware can be used to make a variety of measurements including but not limited to response time, transmission, reflection efficiency, wavelength range, and spectral resolution. The laser can be used as the light source. A filter matching the laser wavelength can be driven with a 1 kHz square wave and the modulated light can be detected with the photodiode. The resulting voltage waveform can be sampled using a digital oscilloscope or standard data acquisition system. The 10-90% rise and fall times can be measured to determine the response time of the HPDLC tunable filter stack.

An ideal hyper spectral imaging filter would achieve a reflection efficiency of 1. However, this is not feasible in practice. Fresnel reflection losses occur at each filter interface surface, lowering the maximum obtainable transmission at transparency. Scattering of light throughout the filter can further reduce transmission. The amount of reflection can be dependent on a number of factors, including materials used and number of Bragg layers. The type of liquid crystal can also impact the maximum transmission due to any residual index mismatch with the polymer. The reflection efficiency can also vary as a function of modulation frequency given different relaxation processes in the filter.

The DC reflection efficiency can be measured for each channel using the tungsten light source and the spectrometer. The spectral magnitude (in counts) can be measured for both OFF and BIASED (bipolar mode) states and the efficiency can be calculated as the difference between the on and off magnitude divided by the on (transparent or semitransparent) magnitude.

The AC reflection efficiency can be measured for the resonant channel using the laser light source and the photodiode. In a manner similar to the response time measurement, a fixed frequency can be used to drive the resonant filter and a waveform can be acquired digitally. The reflection efficiency can be measured as the peak to peak difference divided by the peak value.

The wavelength range can be measured using the white light source and the spectrometer. Spectra can be acquired for two cases: 1) No bias to any filter, and 2) All filters biased on. These two spectral measurements can be subtracted from each other. The full width half maximum of the residual non-zero signal can be measured to determine the full wavelength range.

The spectral resolution for each HPDLC filter element can be measured using the white light source and the spectrometer. This is effectively the same measurement as the wavelength range except only a single filter element can be biased on at a time.

Figure 20:
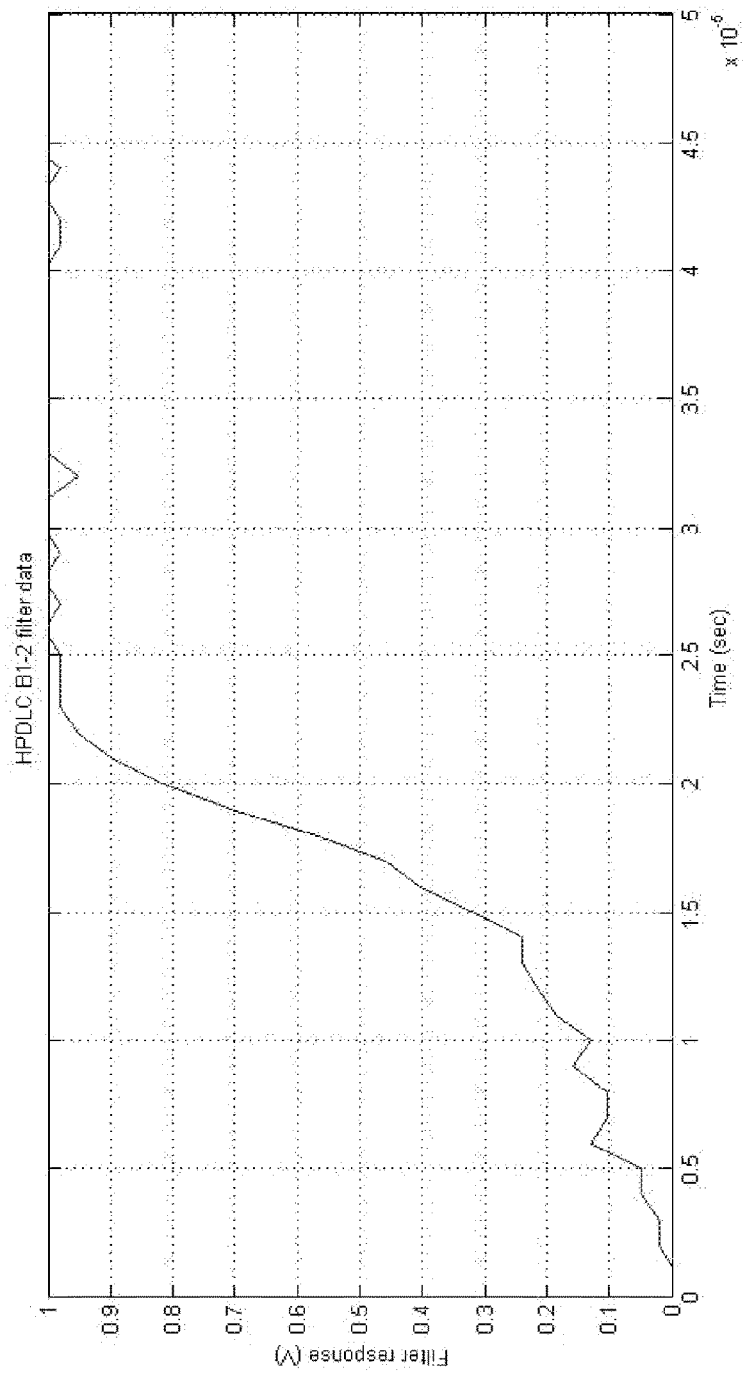
FIG. 20 illustrates a graph depicting a resulting filter response time of an example acrylate based HPDLC filter element.
Figure 21:
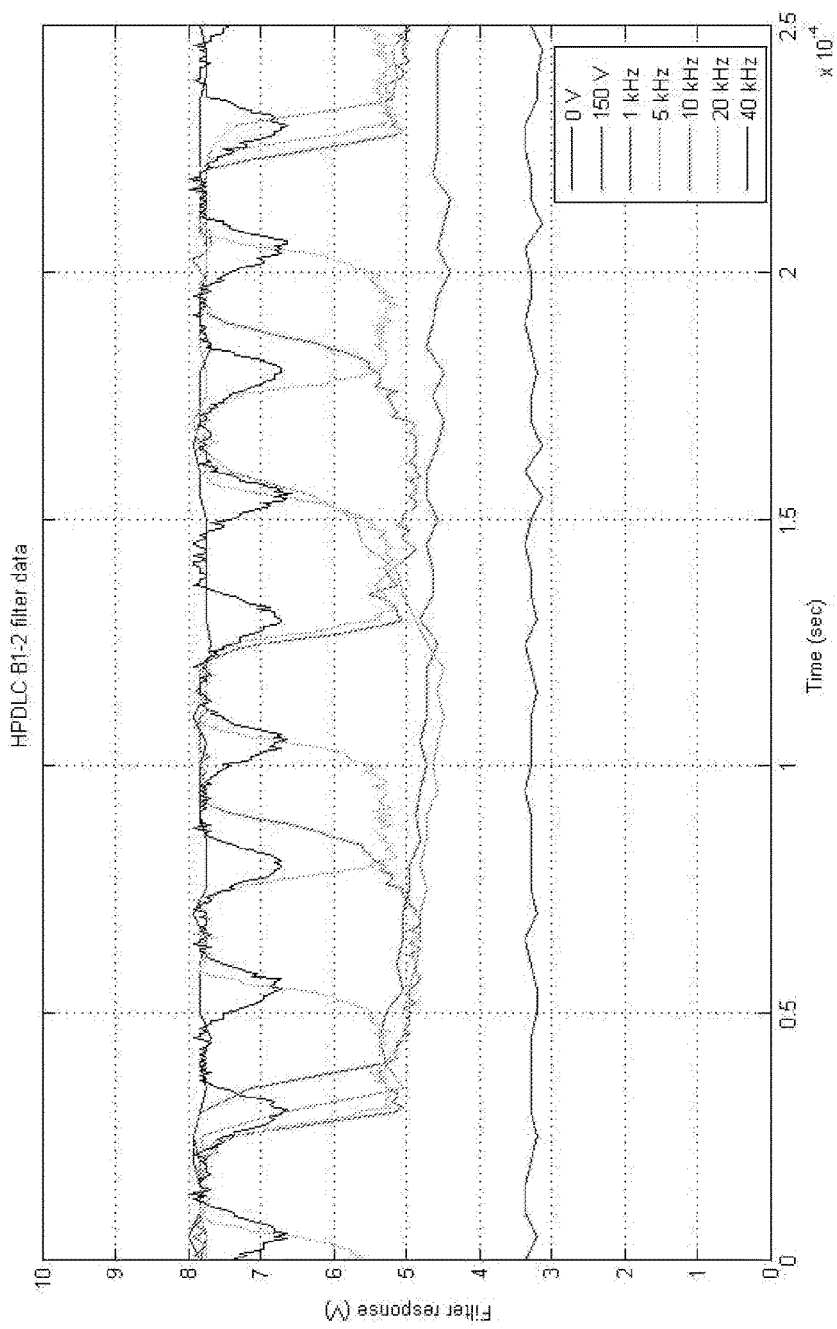
FIG. 21 illustrates a graph depicting resulting dynamic reflection efficiency exhibited by an example acrylate based HPDLC filter element.

FIG. 19 is a table containing parameters and metrics associated with a plurality of example acrylate based HPDLC filter elements. Each HPDLC filter element was tested individually to determine its respective performance characteristics. FIG. 20 illustrates a graph depicting a resulting filter response time of about 20 microseconds for an example of the plurality of acrylate based HPDLC filter elements. FIG. 21 illustrates a graph depicting resulting dynamic reflection efficiency indicating a dynamic filter throughput of about 37% for modulation frequencies up to 40 kHz, exhibited by an example of the plurality of acrylate based HPDLC filter elements.

Figure 23:
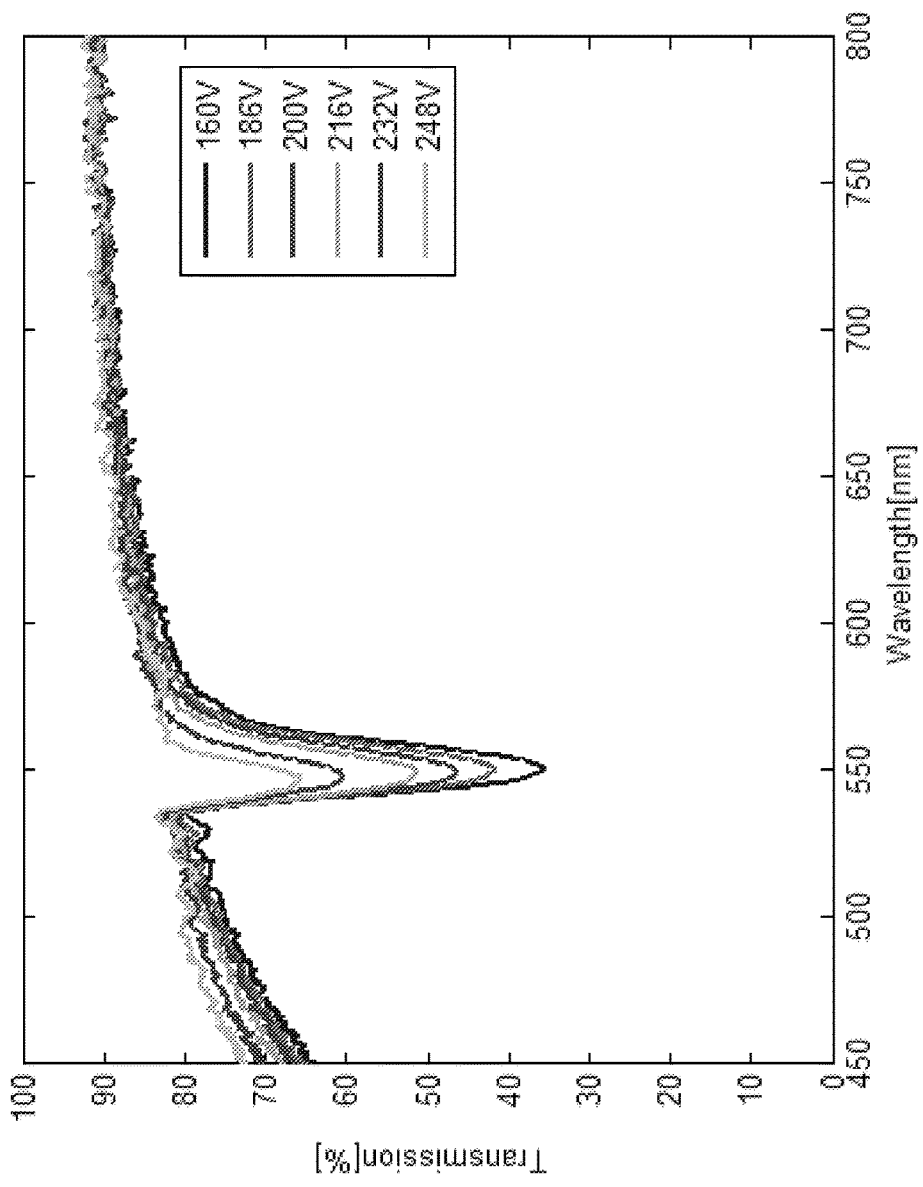
FIG. 23 illustrates a graph depicting the filter reflection efficiency of an example acrylate based HPDLC tunable filter stack as a function of switching voltage.
Figure 24:
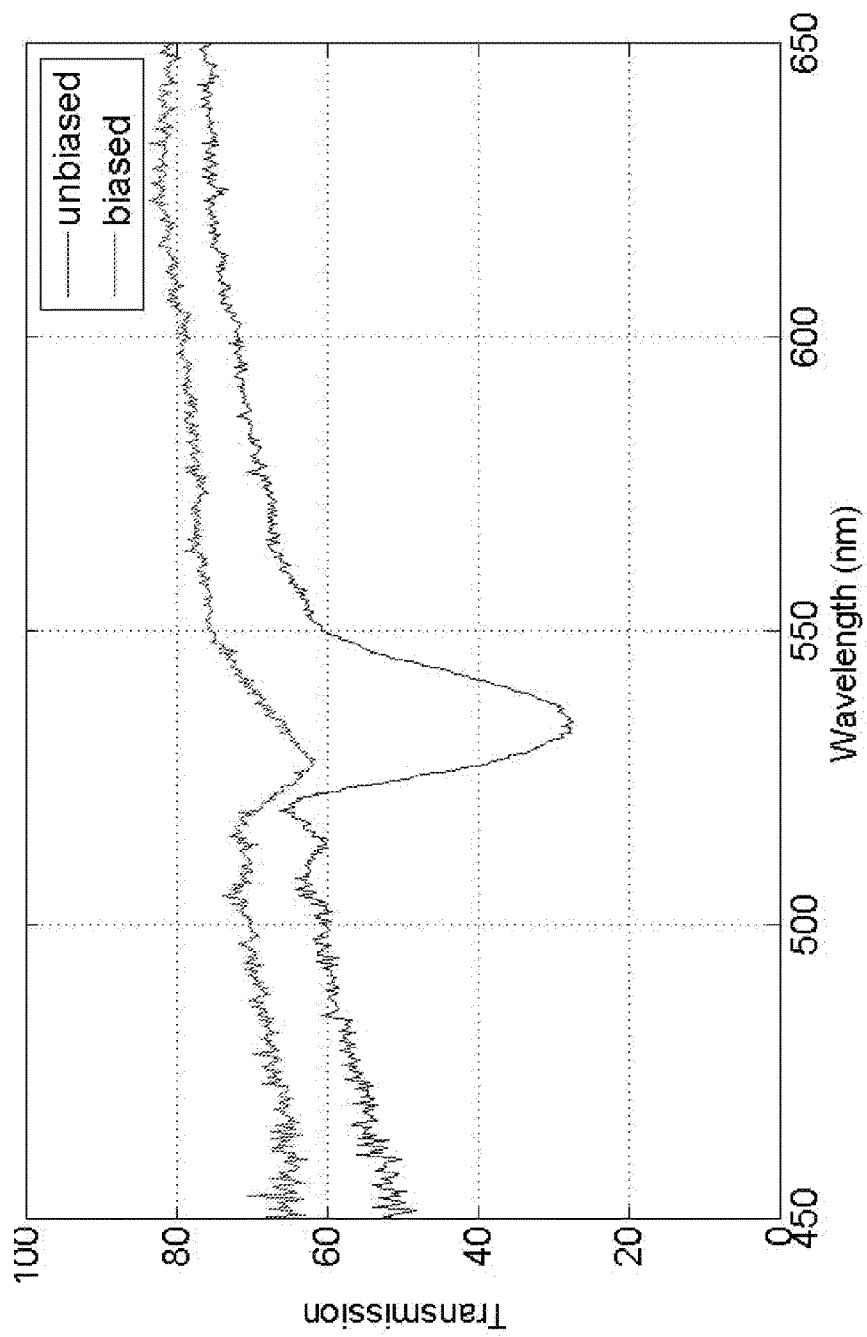
FIG. 24 illustrates a graph depicting transmission curves for an example acrylate based HPDLC tunable filter stack in unbiased and biased states.

FIG. 22 is a table containing parameters and metrics of an example acrylate based HPDLC tunable filter stack. FIG. 23 illustrates a graph depicting the filter reflection efficiency of the example acrylate based HPDLC tunable filter stack as a function of switching voltage. FIG. 24 illustrates a graph depicting the transmission curves for the example acrylate based HPDLC tunable filter stack in unbiased and biased states.

Figure 26:
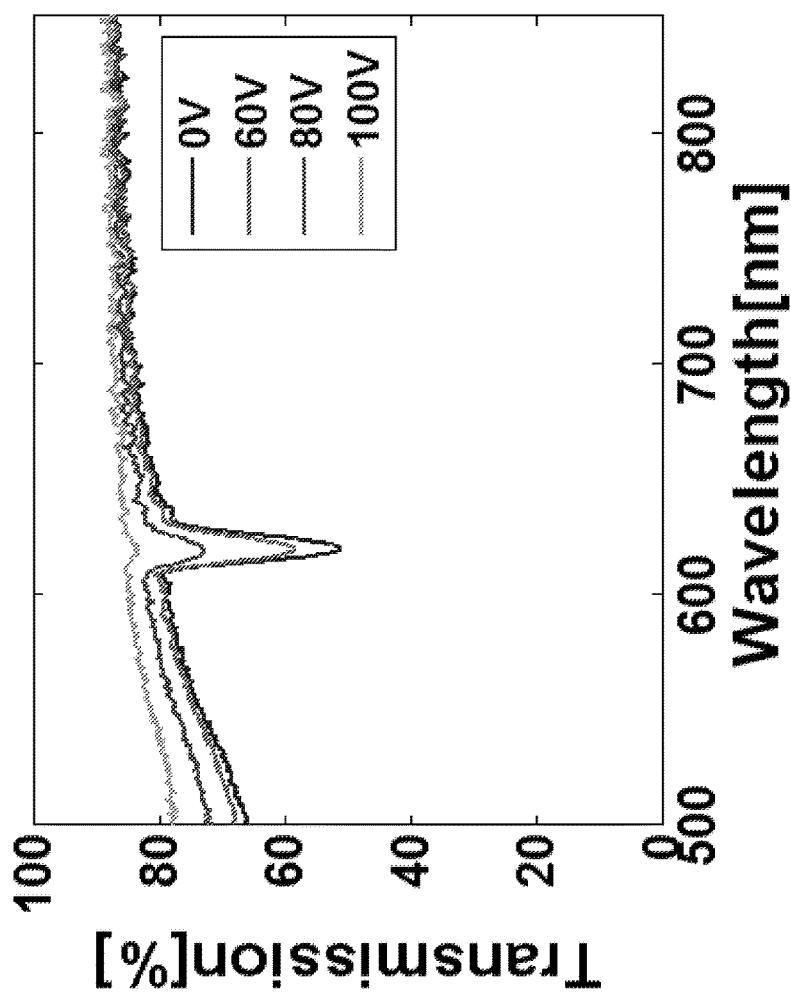
FIG. 26 illustrates a graph depicting a comparison of reflection efficiency as a function of switching voltage for an example thiolene based HPDLC tunable filter stack.

FIG. 25 is a table containing parameters and metrics associated with an example thiolene based HPDLC tunable filter stack. An example thiolene based HPDLC tunable filter stack can exhibit lower scattering and decreased switching voltage relative to a respective example acrylate based HPDLC tunable filter stack, but can exhibit decreased overall reflection efficiency relative to a respective example acrylate based HPDLC tunable filter stack. FIG. 26 illustrates a graph depicting a comparison of reflection efficiency as a function of switching voltage for an example thiolene based HPDLC tunable filter stack.

Figure 28:
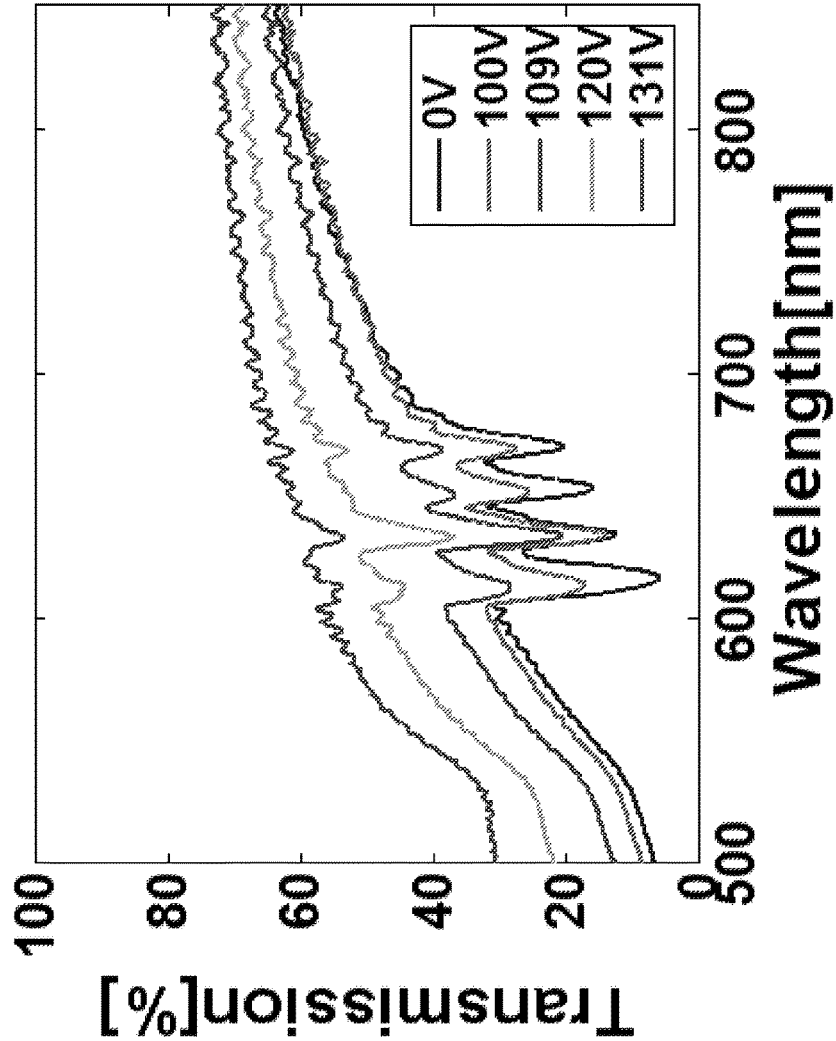
FIG. 28 illustrates a graph depicting the response of an example HPDLC tunable filter stack as a function of switching voltage.

FIG. 27 is a table containing parameters and metrics associated with an example thiolene based HPDLC tunable filter stack comprising HPDLC filter elements having filter lengths of 20 microns. An HPDLC tunable filter stack comprising HPDLC filter elements with 20 micron filter lengths exhibits improved reflection efficiency and resolution, but require increased switching voltage relative to an HPDLC tunable filter stack comprising HPDLC filter elements having 5 micron filter lengths. FIG. 28 illustrates a graph depicting the response of an example HPDLC tunable filter stack comprising HPDLC filter elements with 20 micron filter lengths as a function of switching voltage and indicates the performance of high-speed tunable filtering of light. Only four distinct notches are seen since the 610 and 616 filter passbands overlap.

Figure 30:
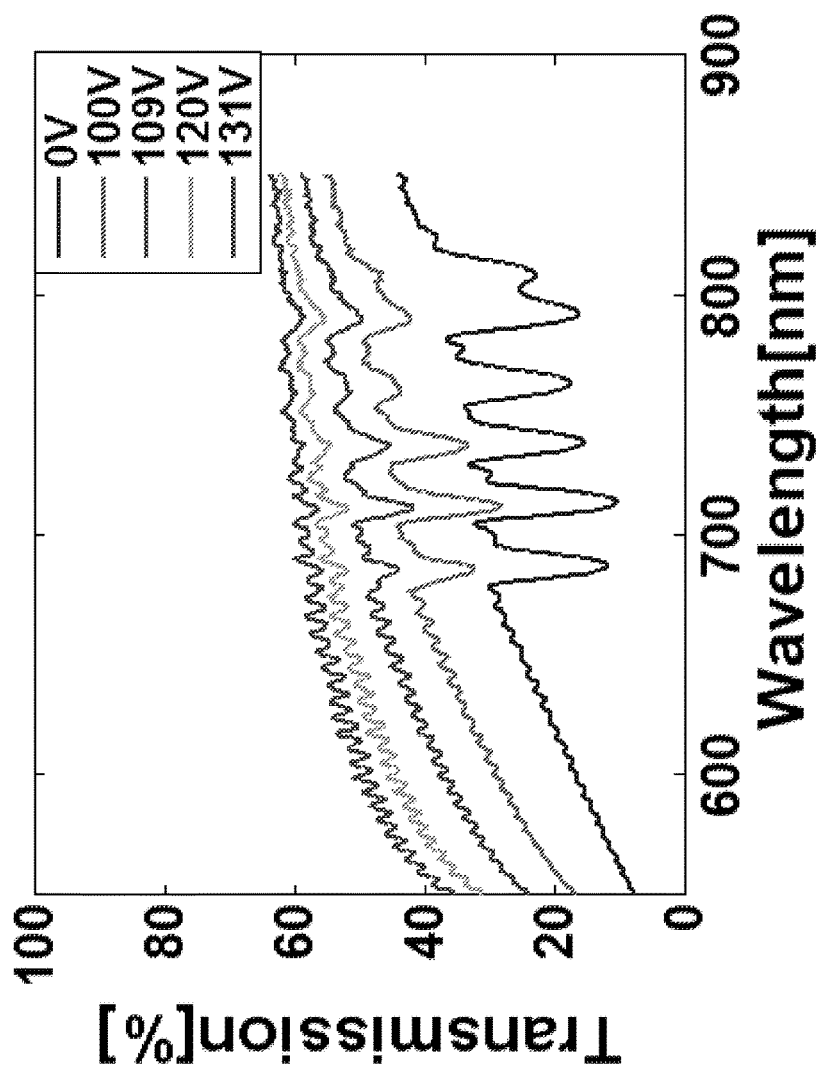
FIG. 30 illustrates a graph depicting the response of the thiolene based HPDLC filter stack as a function of switching voltage.

FIG. 29 is a table illustrating the performance of an example thiolene based HPDLC tunable filter stack operating in the near-IR portion of the spectrum. Similarly to the visible region, good performance is exhibited for resolution, reflection efficiency and switching voltage. FIG. 30 illustrates a graph depicting the response of the thiolene based HPDLC filter stack as a function of switching voltage, indicating good performance is obtained across the near-IR region.

Figure 31:
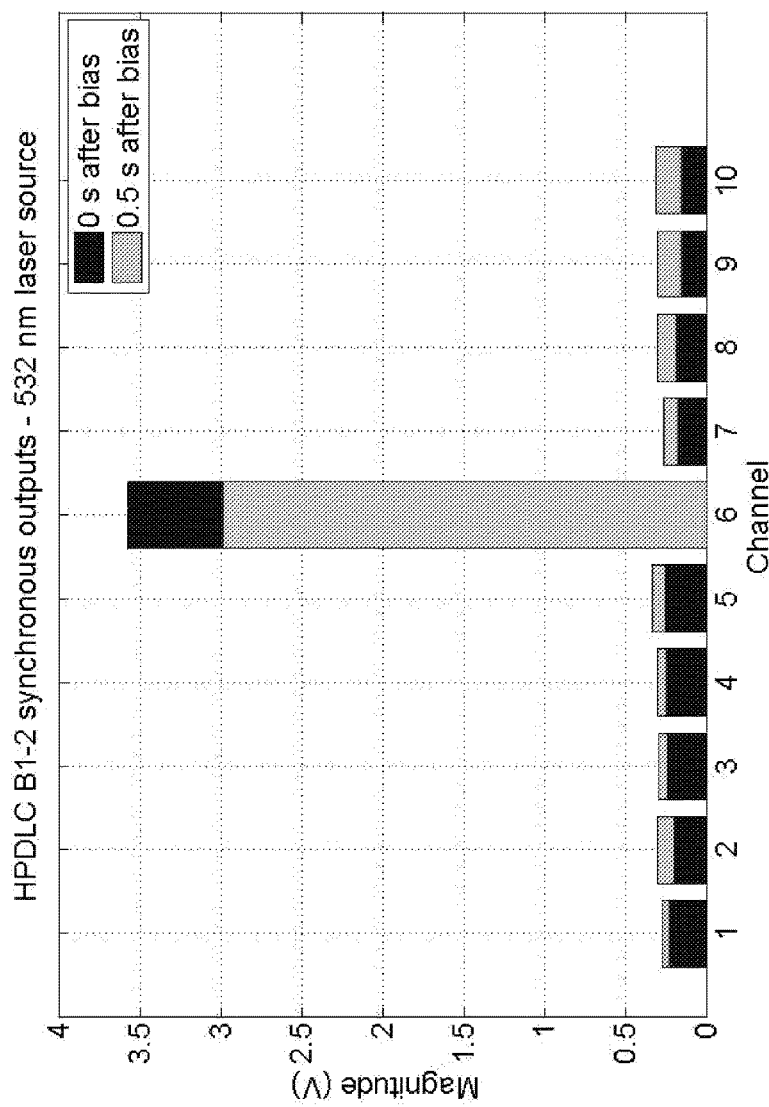
FIG. 31 depicts demodulated signals for an example HPDLC tunable filter stack comprising ten filters when the HPDLC tunable filter stack is subjected to a monochromatic light source.

Each HPDLC element within an HPDLC tunable filter stack can be modulated at a different frequency on the order of tens of kHz due to the extremely fast filter switching time, thereby supporting the ability to synchronously detect and demodulate each wavelength, in other words to spectrally multiplex imaging data. FIG. 31 depicts the demodulated signals for an example HPDLC tunable filter stack comprising ten filters when the HPDLC tunable filter stack is subjected to a monochromatic light source resonant with the HPDLC tunable filter stack operating at channel 6. Two effects can be observed: a 20% decay in the inband signal after initial bias; and non-zero out of band signals. The cause of the inband decay is believed to be relaxation process in the LC material. The out of band signal is believed to be due to high-frequency noise in the frequency doubled Nd:Yag laser source and not a property of the HPDLC tunable filter stack.

Figure 32:
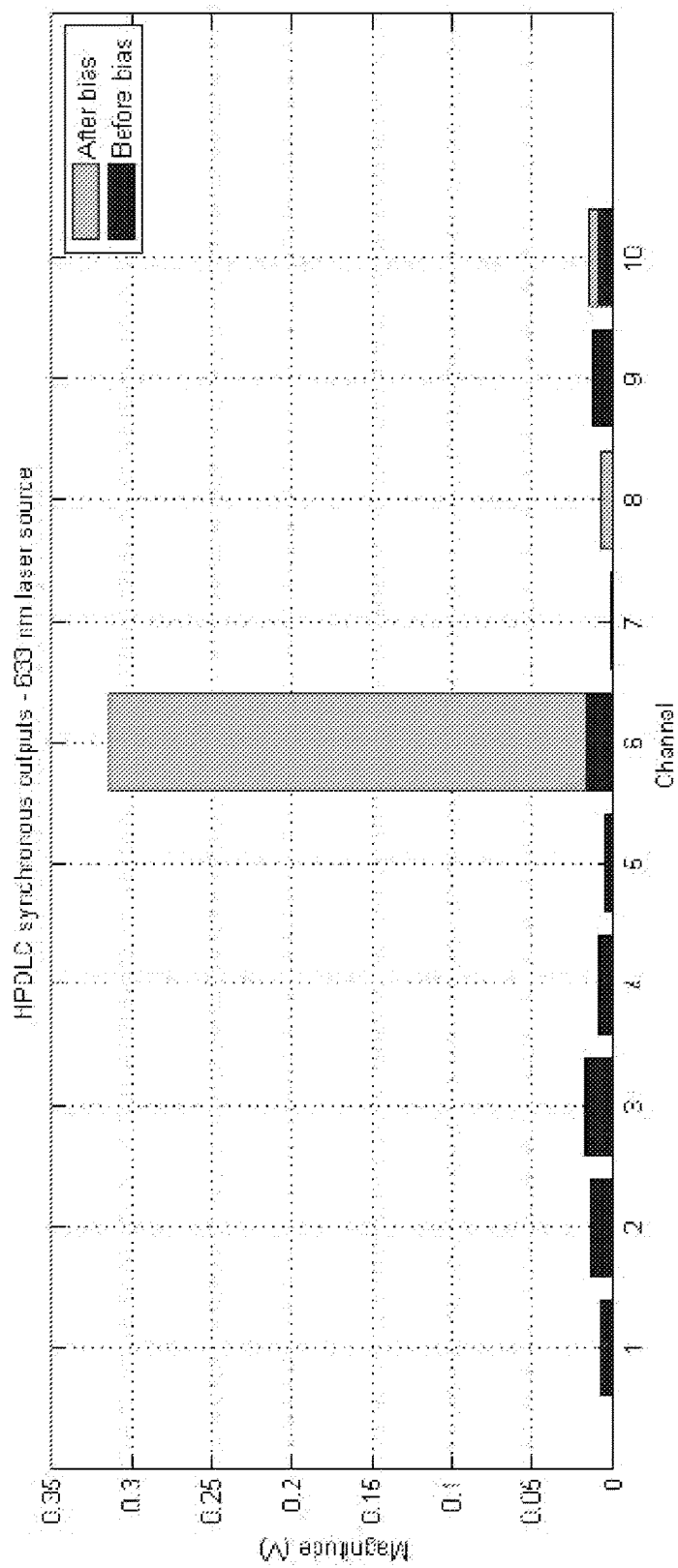
FIG. 32 depicts demodulated signals for an example HPDLC tunable filter stack comprising ten filters when the HPDLC tunable filter stack is subjected to a He:Ne gas laser.

FIG. 32 shows the synchronous outputs for a He:Ne gas laser. Although the decay is still present as expected (not shown in the figure), the out of band signal is gone for the gas laser as FIG. 32 shows no increase in out of band signal after biasing the filter.

It should be appreciated that HPDLC filter elements can be constructed using various materials, for instance the above-described acrylate based and thiolene based HPDLC filter elements. Example HPDLC tunable filter stacks can exhibit differing electro-optic performance characteristics, for instance based upon the materials used to construct the respective HPDLC filter elements of the HPDLC tunable filter stacks. The electro-optic performance of HPDLC tunable filter stacks constructed using different materials can differ in terms of long term stability reflection efficiency, switching efficiency, switching voltages, polarization sensitivity, scattering and switching speed, primarily due to the difference in the morphology of the HPDLC elements as they are formed. For instance, thiolene based HPDLC elements can exhibit a lower switching voltage, narrower full width at half maximum (FWHM), and lower scattering relative to acrylate based HPDLC elements. Additionally, thiolene based HPDLC elements can exhibit a lack of polarization dependence, while acrylate based HPDLC elements can exhibit diffraction efficiency of P polarization that is higher than for S polarization.

Described below is an example HPDLC tunable filter stack that can be utilized for hyperspectral imaging (HSI). The example HPDLC tunable filter stack is capable of gathering hyperspectral imaging data within the visible wavelength range, more specifically in the visible wavelength range of 600-800 nm. Alternatively, the HPDLC tunable filter stack can be constructed to operate within any desired portion of the electromagnetic spectrum, for instance within any portion, such as the entire range, of the spectrum of visible light, the near infrared range, the thermal infrared range, the far infrared range, or any combination thereof. An HPDLC tunable filter stack utilized in an HSI system can comprise a plurality of HPDLC elements. For instance, the example HPDLC tunable filter stack comprises twenty HPDLC elements, each with a FWHM of approximately 10 nm.

The HPDLC elements of the example HPDLC tunable filter stack exhibit a number of properties useful for HSI applications, including uniform reflection efficiency of approximately 80% across a 35 mm optical aperture, polarization insensitivity for normal incidence, spectral resolution of 10 nm, and fast switching times on the order of microseconds. Moreover, the ability to modulate each HPDLC element in the HPDLC tunable filter stack at a different frequency allows for spectral multiplexing, thus enabling synchronous detection and demodulation of imaging data. The example HPDLC tunable filter stack can be integrated into the drive and detection system of a hyperspectral imaging system, for instance the above-described drive and detection system.

Figure 33:
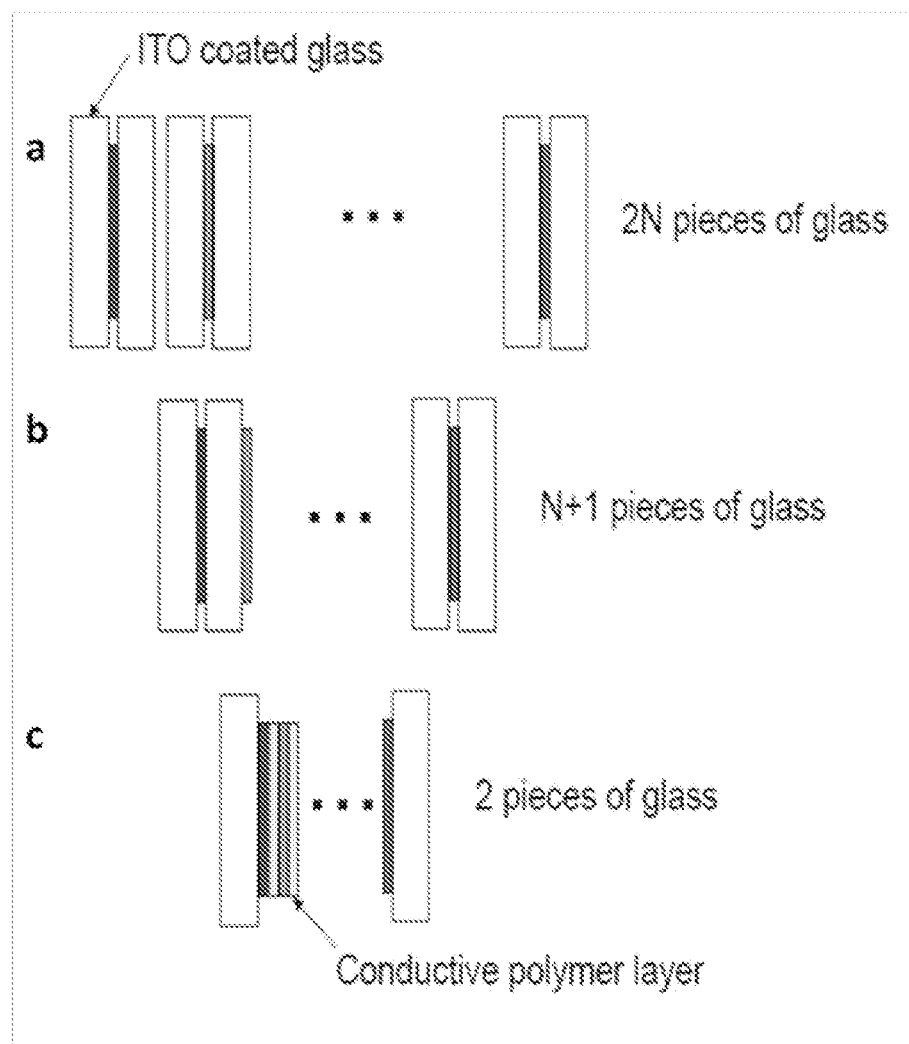
FIG. 33 depicts example techniques that can be used to assemble the HPDLC elements of an example HPDLC tunable filter stack.

FIG. 33 depicts a number of example techniques that can be used to assemble the HPDLC elements of the example HPDLC tunable filter stack, wherein N equals the number of HPDLC elements in the stack. In accordance with technique a), each of the HPDLC elements can be individually fabricated, sandwiched between a respective pair of ITO coated glass substrates. Therefore, an HPDLC tunable filter stack fabricated in accordance with technique a) requires 2N substrates, for instance 2N pieces of ITO glass. The individual HPDLC elements can then be affixed to one another to comprise the HPDLC tunable filter stack.

Figure 34:
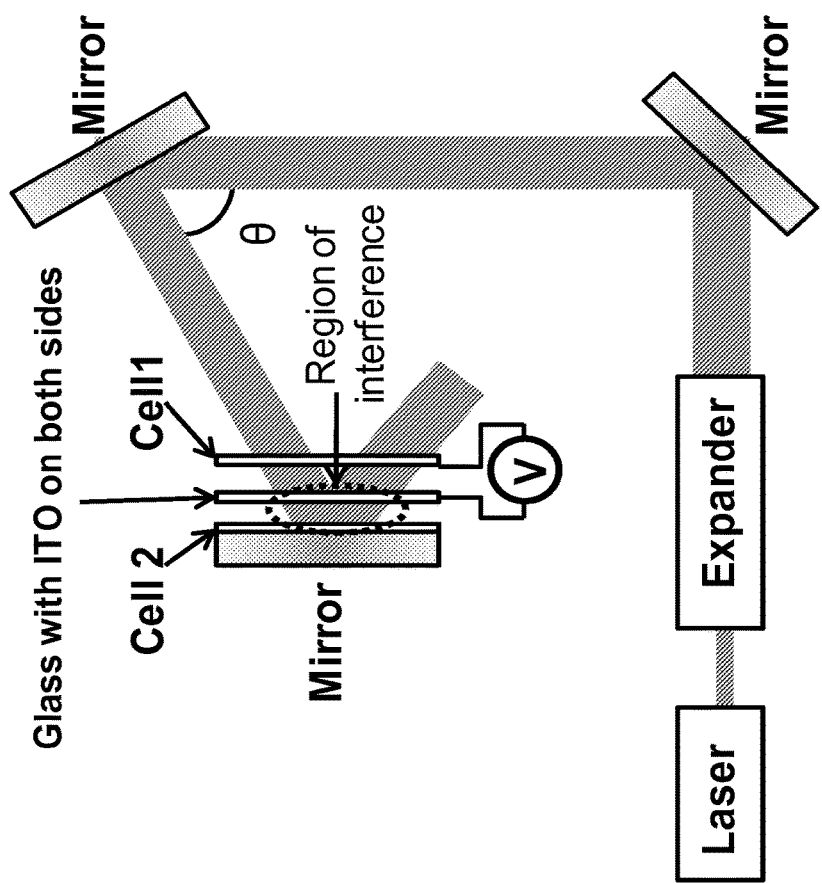
FIG. 34 illustrates an example apparatus that can be used to fabricate an HPDLC tunable filter stack in accordance with one of the techniques illustrated in FIG. 33.
Figure 37:
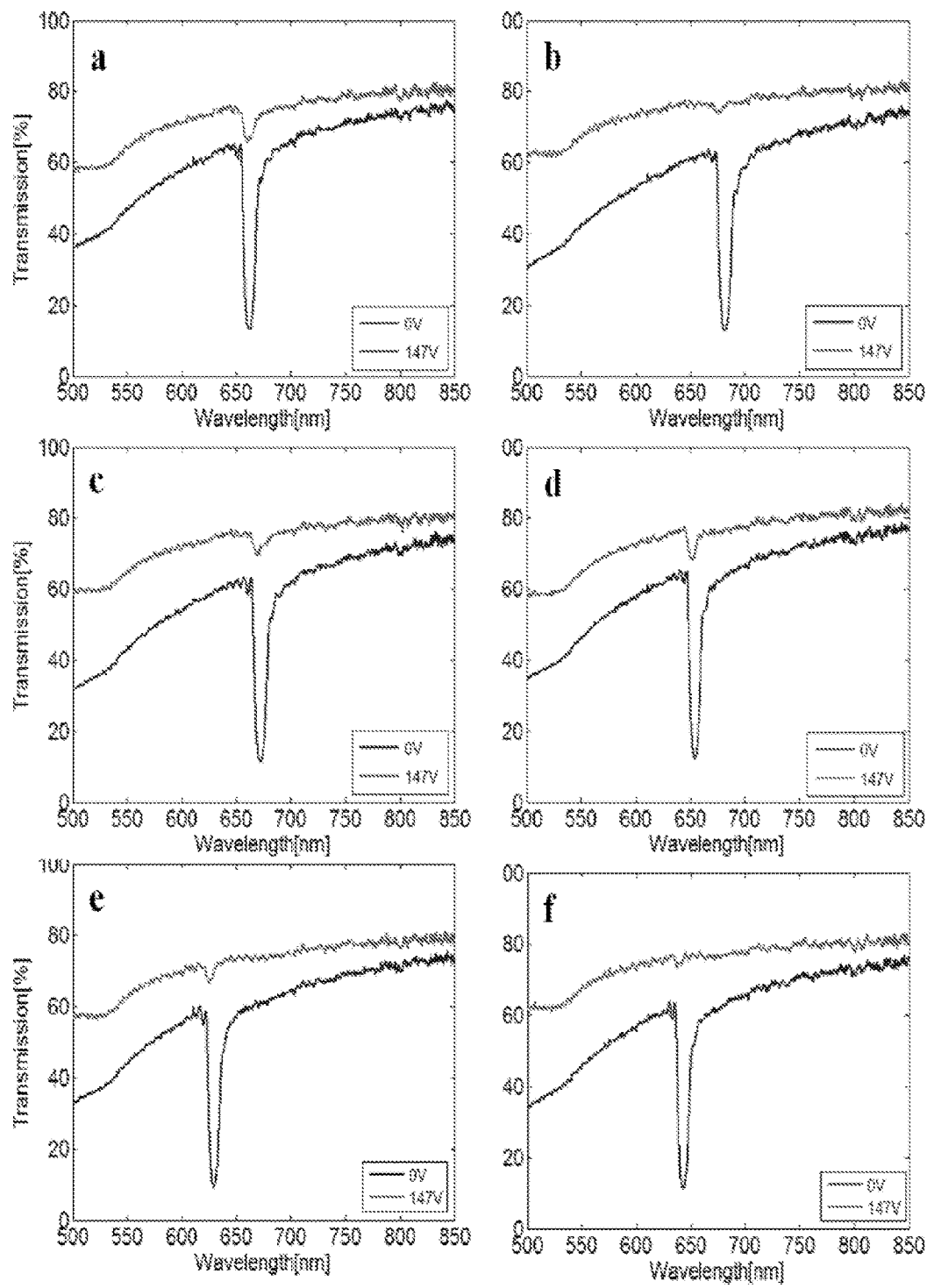
FIGS. 37a-j illustrate respective transmission spectra of example thiolene based HPDLC filter elements from the table illustrated in FIG. 35.
Figure 37:
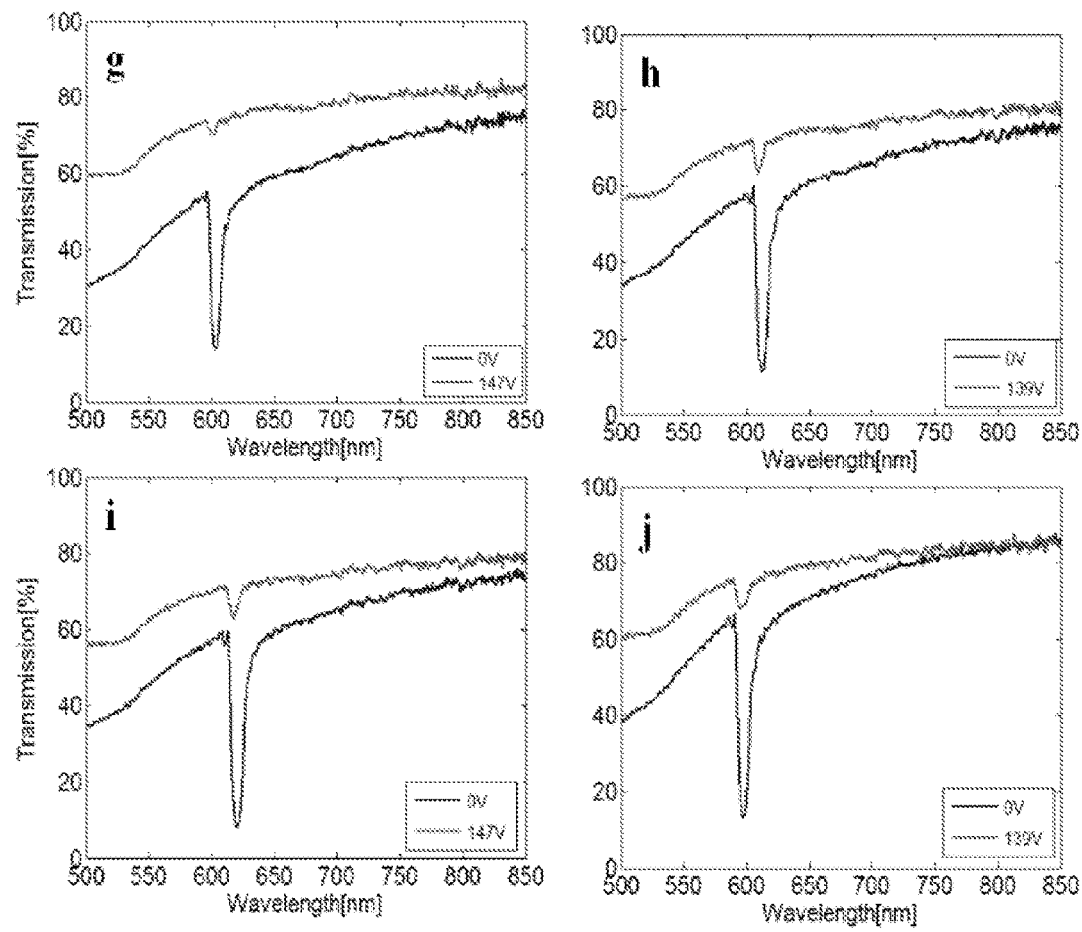
Figure 38:
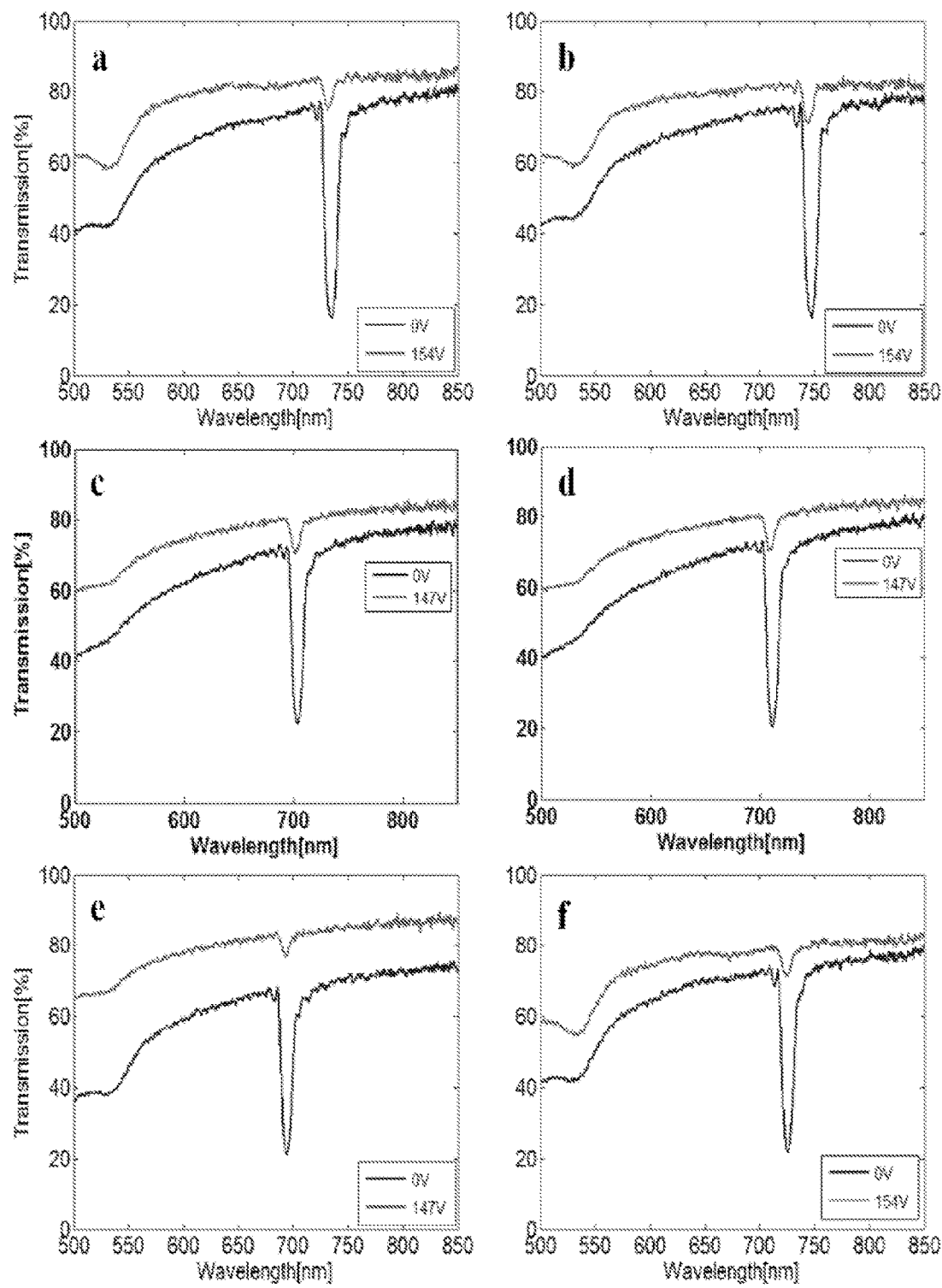
FIGS. 38a-j illustrate respective transmission spectra of example thiolene based HPDLC filter elements from the table illustrated in FIG. 36.
Figure 38:
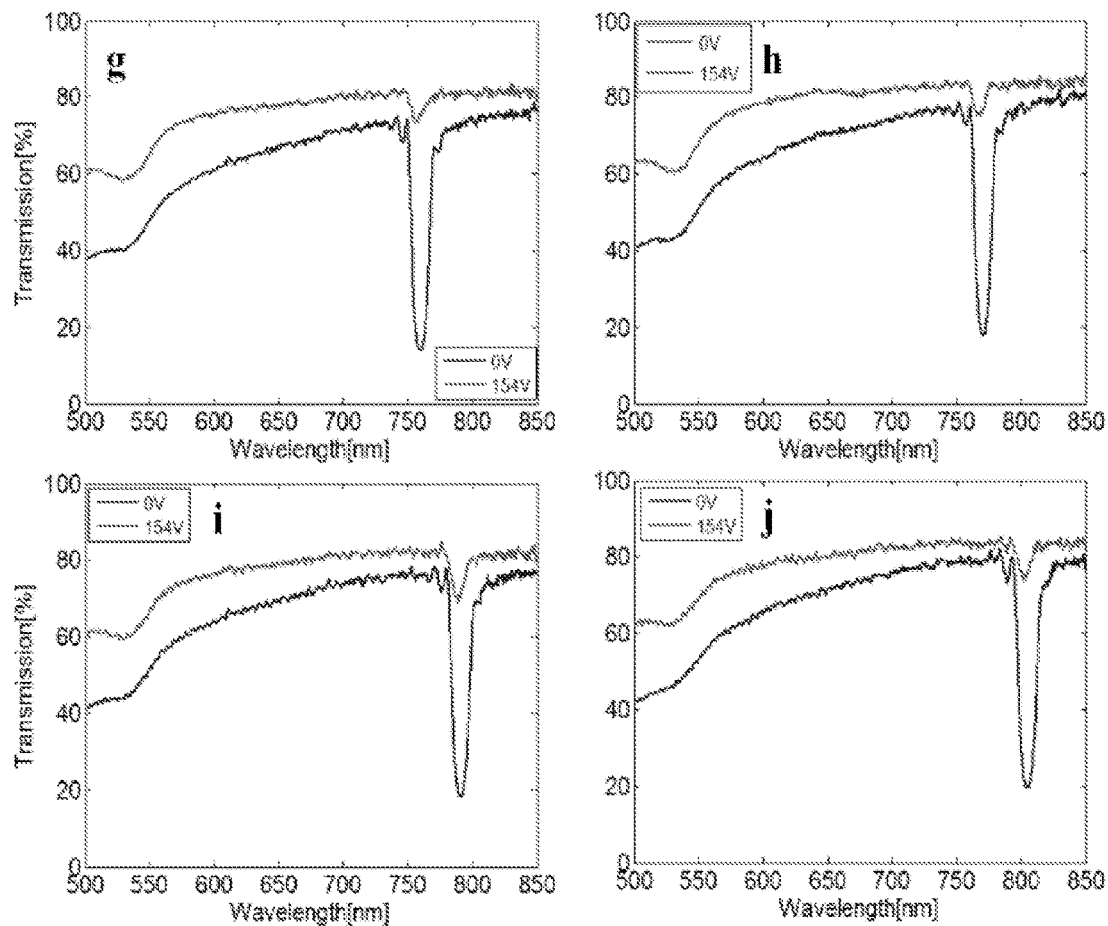

In accordance with technique b), individual HPDLC filter elements are formed on glass substrates coated with indium tin oxide (ITO) on both sides, allowing independent switching of each HPDLC element in the HPDLC tunable filter stack. Successive layers of the HPDLC tunable filter stack can be formed with the existing layers of the stack unbiased or biased, while exposing the subsequent layer to an interference pattern. For example, as illustrated in FIG. 34, the first HPDLC element of the stack is formed by the one beam method using a reflecting mirror behind the HPDLC element so that the incident and the reflected beams self-interfere to form an interference pattern within the HPDLC element. The first HPDLC element comprises a glass substrate which can be coated with ITO on both sides. The second HPDLC element layer of the stack can be formed directly behind the first HPDLC element, sandwiched between the ITO coated side of the first HPDLC element and another ITO coated glass slide as shown in FIG. 34. Therefore, an HPDLC tunable filter stack fabricated in accordance with technique b) requires N+1 substrates, for instance N+1 pieces of double-sided ITO glass.

Switching one or more of the existing HPDLC element layers of the stack during interference pattern exposure of subsequent layers can improve the reflection efficiency of HPDLC element layers in the stack. Additionally, the optical path length of the HPDLC tunable filter stack can be reduced due to elimination of substrate layers relative to an HPDLC tunable filter stack constructed in accordance with technique a). Moreover, stacking HPDLC elements in accordance with technique b) can eliminate the use of index matching materials between HPDLC elements, hence reducing parallax and wavefront errors.

Referring again to FIG. 33, in accordance with technique c), the first HPDLC filter element of the HPDLC tunable filter stack can be formed on a glass substrate, and subsequent HPDLC filter elements can be formed on top of the preceding HPDLC element in the stack, the HPDLC elements spaced by intervening conductive layers. Therefore, an HPDLC tunable filter stack fabricated in accordance with technique c) requires only two substrates, for instance two pieces of ITO glass. An HPDLC tunable filter stack in accordance with technique c) can be fabricated by utilizing the above-described spin coating apparatus and methods.

The example HPDLC tunable filter stack utilized for HSI was fabricated using technique a). The example HPDLC tunable filter stack comprises twenty individually formed HPDLC filter elements, each with a FWHM of approximately 10 nm, fabricated in the 600-800 nm range. The individual HPDLC filter elements were glued together one behind the other using the UV curable photopolymer NOA65 to provide index matching between the stacked filter elements and to minimize transmission loss due to any index mismatch. It should be appreciated that the example HPDLC tunable filter stack is not limited to fabrication using technique a), and that the example HPDLC tunable filter stack can be alternatively fabricated using any other suitable technique, for instance techniques b) or c), as desired.

As described above, a typical hyperspectral imaging system comprises fore optics, a wavelength dispersing element, and an array of detectors. However known wavelength filtering or dispersing elements typically do not offer the ability to simultaneously access and rapidly tune the wavelength to obtain a spectral multiplex, or support high speed hyperspectral imaging from a moving platform such as an aircraft. The example HPDLC tunable filter stack can be employed as a high speed wavelength filtering element in the optical front end of a hyperspectral imaging system. The ability to modulate each HPDLC filter element in the stack at a different frequency can allow spectral multiplexing of imaging data. Synchronous detection and demodulation can be performed on a monochromatic wavelength passing through the HPDLC tunable filter.

Example HPDLC filter elements of the HPDLC tunable filter stack can be holographically fabricated over a circular optical aperture of 35 mm in diameter having a narrow spectral bandwidth using techniques discussed herein. High speed electro-optic switching on the order of microseconds with polarization insensitivity can be achieved using the example HPDLC tunable filter stack.

FIG. 35-36 are tables containing parameters and metrics associated with respective individual example thiolene based, 30 mm aperture HPDLC filter elements of the example HPDLC tunable filter stack in the 600-700 nm, and 700-800 nm wavelength ranges, respectively. FIGS. 37*a-j* and 38*a-j* illustrate individual transmission spectra of the individual example thiolene based, 30 mm aperture HPDLC filter elements of the example HPDLC tunable filter stack in the 600-700 nm, and 700-800 nm wavelength ranges, respectively. Slight differences in reflection efficiencies of the HPDLC filter elements can cause the HPDLC filter elements to exhibit differences in switching voltage.

Figure 39:
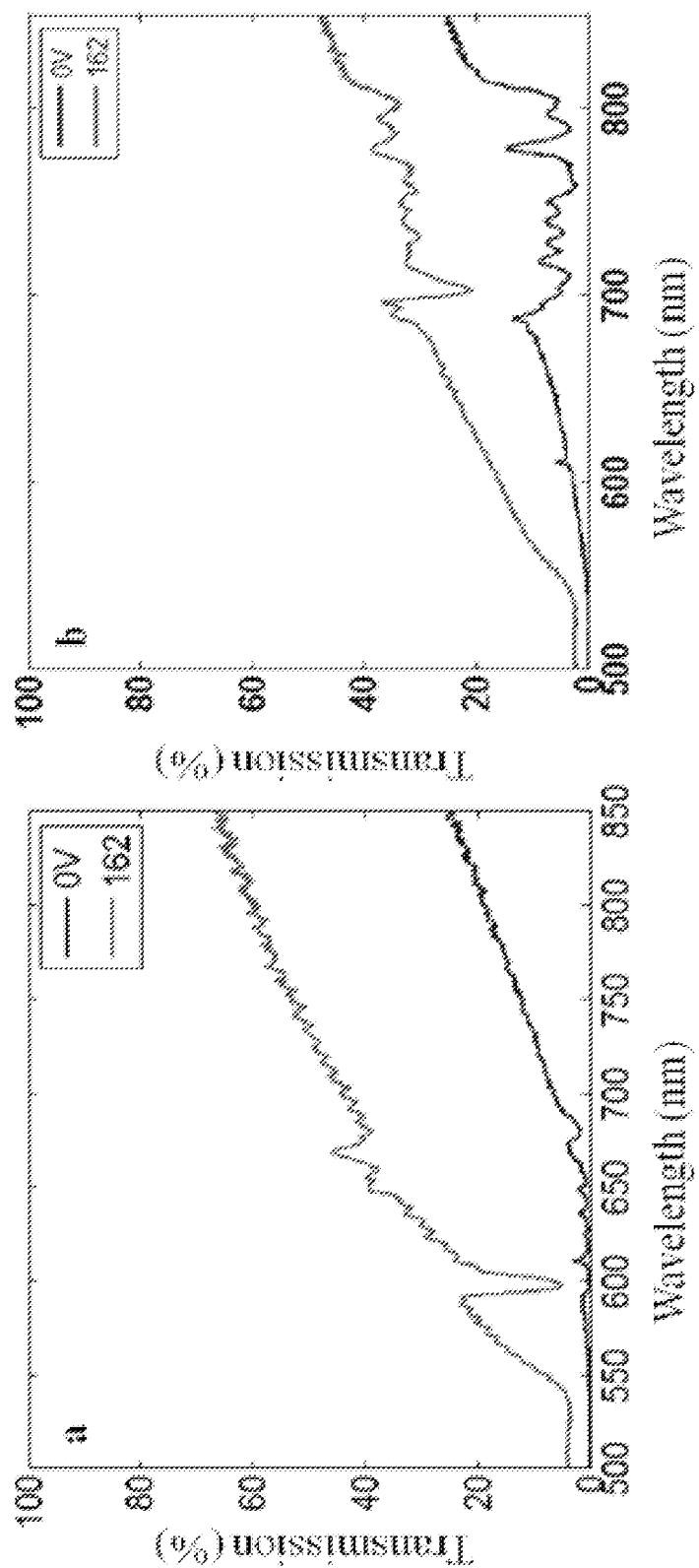
FIGS. 39a-b illustrate the spectra, both switched and unswitched of a pair of thiolene based HPDLC tunable filter stacks in the 600-700 nm range and 700-800 nm range, respectively.

FIGS. 39*a-b* illustrate the spectra, both biased and unbiased (i.e., switched and unswitched), of a pair of thiolene based HPDLC tunable filter stacks in the 600-700 nm range and 700-800 nm range, respectively, each filter stack comprising ten HPDLC filter elements. Because scattering is more dominant at lower wavelengths, the transmission throughput in the unswitched state (0V) is higher in the 700-800 nm range than in the 600-700 nm range. The example HPDLC tunable filter stacks demonstrate the ability to access wavelengths with a resolution of 10 nm with polarization insensitivity and microsecond switching in a given optical band. Transmission throughput for the HPDLC tunable filter stacks can be diminished due to random wavelength dependent scattering losses arising from the size of the LC droplets trapped in the polymer matrix. Additionally, transmission throughput for the example HPDLC tunable filter stack can be attributed to the fact that the presence of index matched ITO glass substrates within the stack can reduce the overall transmission throughput, for instance by approximately 40%. Of course transmission throughput loss attributable to the presence of glass substrates can be mitigated by fabricating the example HPDLC tunable filter stack utilizing a reduced number of glass substrates, for instance by fabricating the example HPDLC tunable filter stack in accordance with techniques b) or c).

Figure 40:
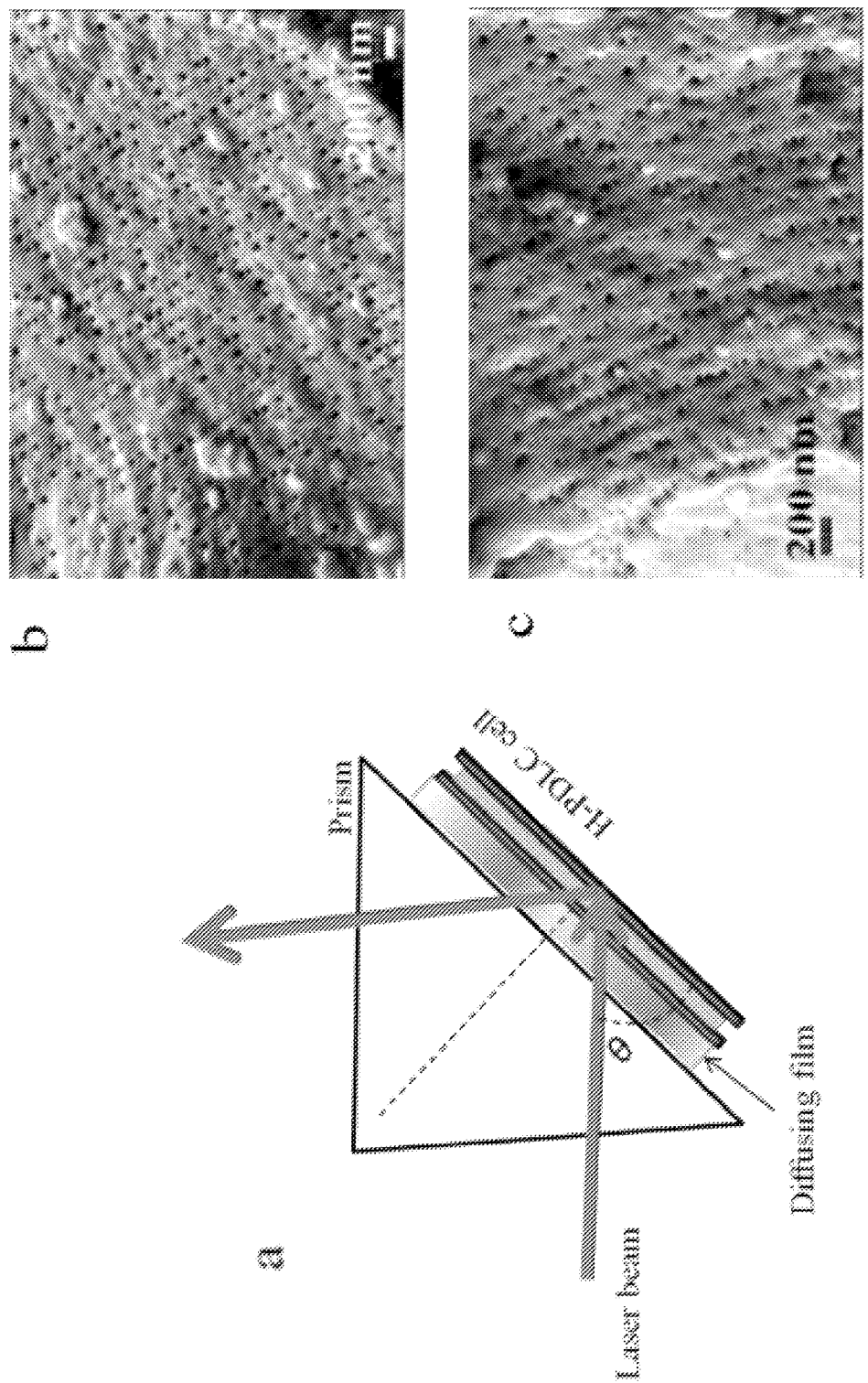
FIG. 40a illustrates an apparatus, including a diffusing film, that can be used to fabricate a diffused HPDLC filter element.
FIGS. 40b and 40c depict respective morphologies of example non-diffuse and diffuse HPDLC filter elements, respectively.

A filtering element comprising a wider view angle c an enable a wider field of view within the hyperspectral imaging system, thus reducing the physical size of the wavelength filters and eliminating the need for a large area CCD. In order to improve the view angle of the example HPDLC filter elements, diffusing films, such as those with diffusing angles of 5° and 30°, can be introduced into the path of the recording beam, for instance between the prism and the thiolene based HPDLC filter element, as illustrated in FIG. 40a. The diffuser can act to diffuse the incoming beam. While introducing a diffuser can reduce the coherency of the recording beam, enough coherency can be maintained to record the respective Bragg structures. Additionally, introducing a diffuser can reduce the reflection efficiency and/or increase the FWHM of the HP DLC filter elements, as is evident from the morphology of the non-diffuse and diffuse HPDLC filter elements illustrated in FIGS. 40b and 40c, respectively.

Figure 41:
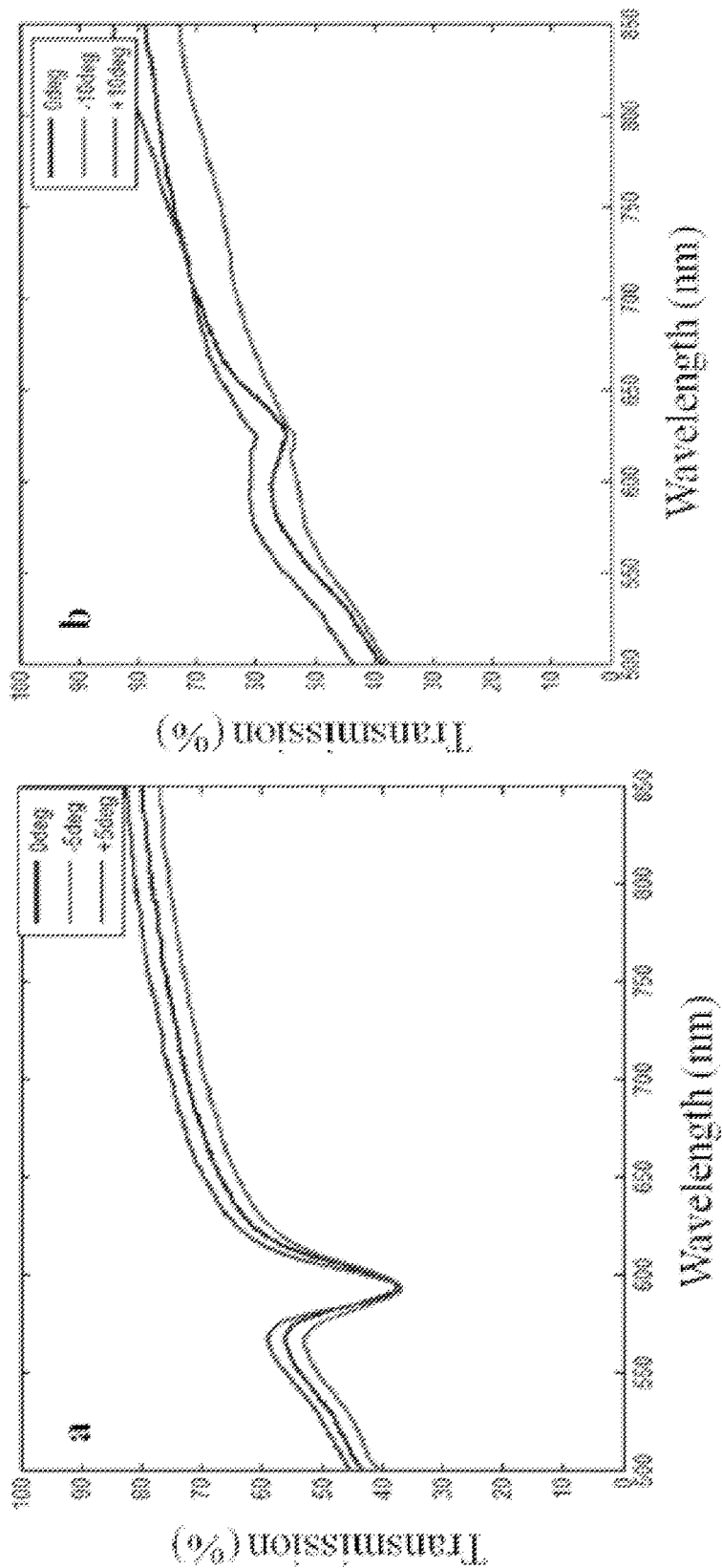
FIG. 41a illustrates a graph depicting performance characteristics of an example HPDLC filter element with a viewing angle expanded by 10° using a 5° diffusing film.
FIG. 41b illustrates a graph depicting performance characteristics of an example HPDLC filter element with a 20° viewing angle.

FIG. 41a illustrates the expansion of the view angle of an example HPDLC filter element by 10° using a 5° diffusing film. The example HPDLC filter element was rotated +/−5° with respect to the normal incident white light source and no blue shift was observed in the transmission spectra, suggesting a widening of the view angle. A similar result can be seen in FIG. 41b for an example HPDLC filter element with a 20° view angle, but in this case the reflection efficiency is dramatically decreased and a widening of the FWHM is exhibited.

The example HPDLC tunable filter stack can be utilized in an example hyperspectral imaging system, with the above-described drive and detection electronics, to spectrally multiplex acquired hyperspectral imaging data. The electro-optic performance of the example HPDLC tunable filter stack in this application can be and be tested and analyzed using the above-described equipment and techniques. In an example testing scenario, a 633 nm He—Ne laser was transmitted through an example thiolene based HPDLC tunable filter stack operating in the 600-700 nm wavelength range and comprising ten HPDLC filter elements. The HPDLC filter elements were modulated at different respective frequencies. One of the HPDLC filter elements comprises a notch at 633 nm wavelength. The multiplexed output of the each HPDLC element of the example HPDLC tunable filter stack was collected on the photodiode and was made available on a respective one of ten different channels for synchronous detection and demodulation.

Figure 42:
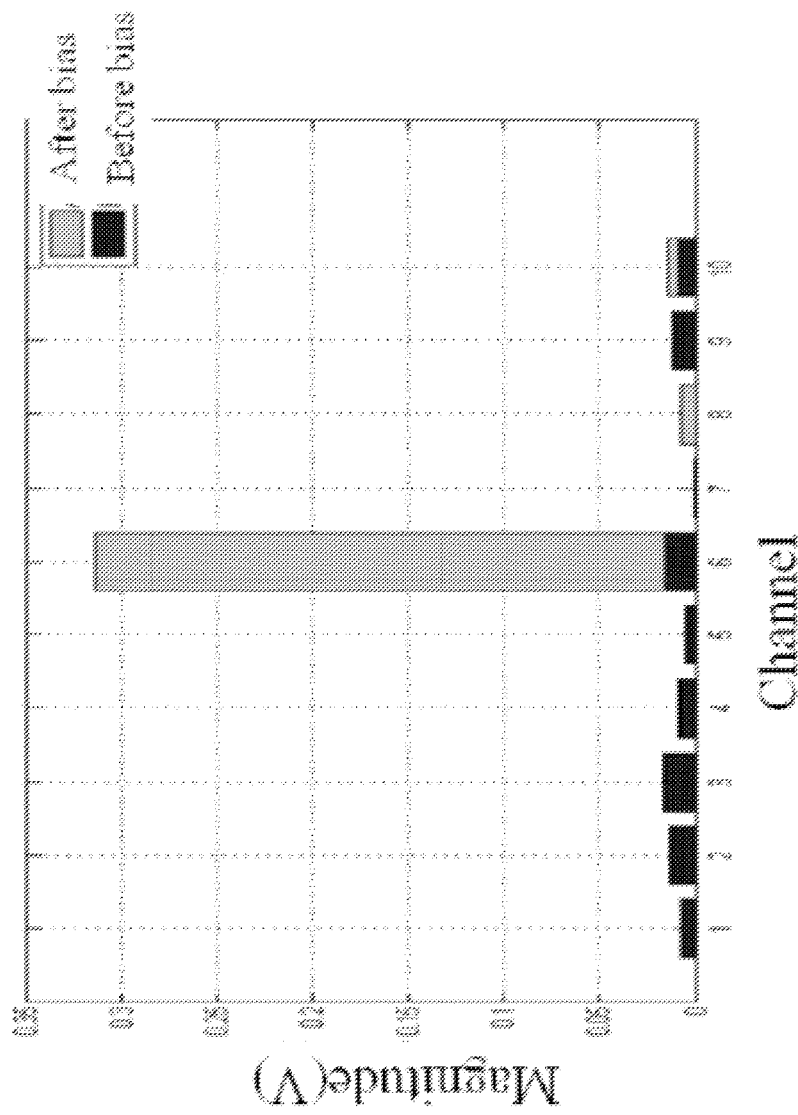
FIG. 42 illustrates demodulated signals for ten HPDLC element filters when subjected to a monochromatic light source.

FIG. 42 illustrates the demodulated signal for all ten HPDLC element filters when subjected to the monochromatic light source resonant with the HPDLC tunable filter operating at channel 6. A distinct rise in the channel 6 signal is exhibited, suggesting detection of the transmitted 633 nm He—Ne wavelength, while little signal is seen on the non-resonant channels. This demonstrates the ability of the example HPDLC tunable filter stack to detect the incoming wavelength signal while remaining unaffected by the other modulating filters. The hyperspectral cube can be extracted from the modulated image.

Figure 43:
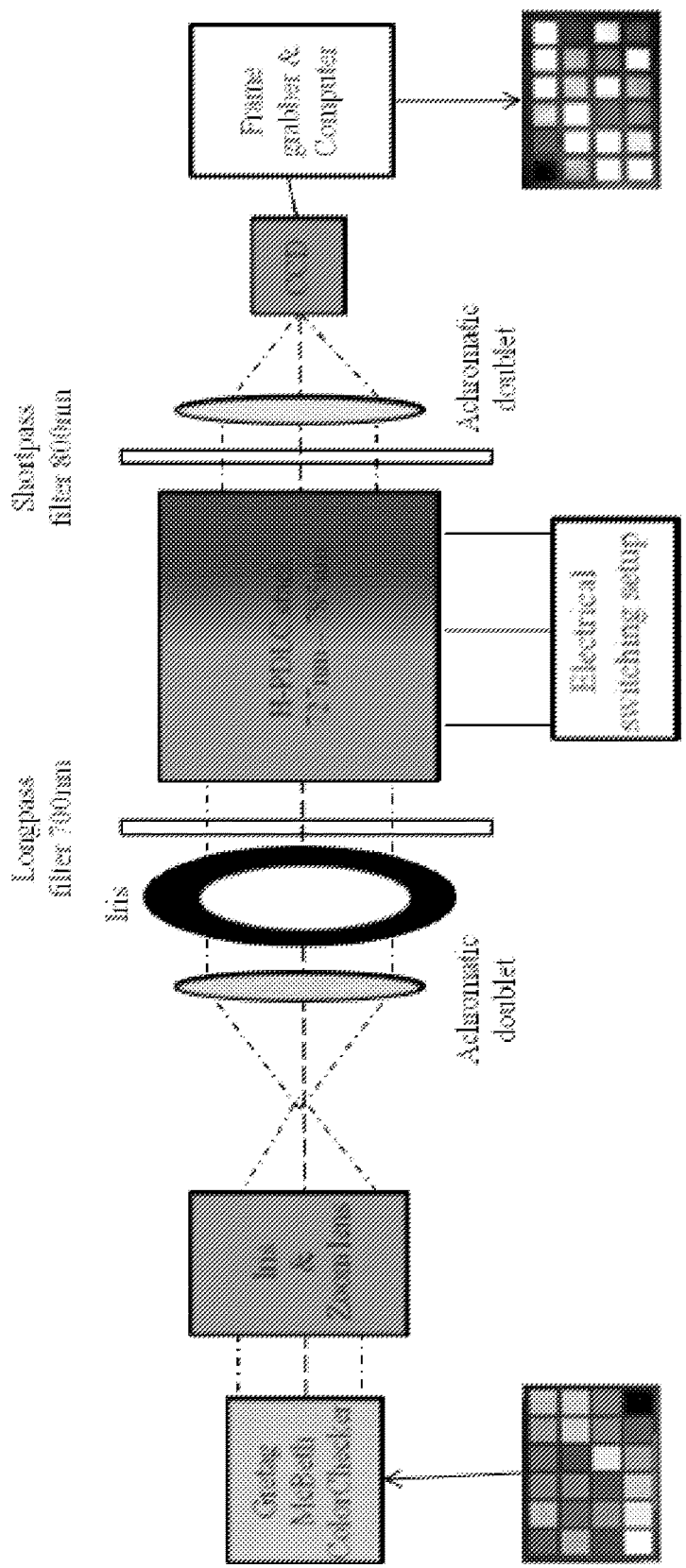
FIG. 43 illustrates an hyperspectral imaging system using an example HPDLC tunable filter stack in conjunction with a McBeth color chart and short pass and long pass filters.
Figure 44:
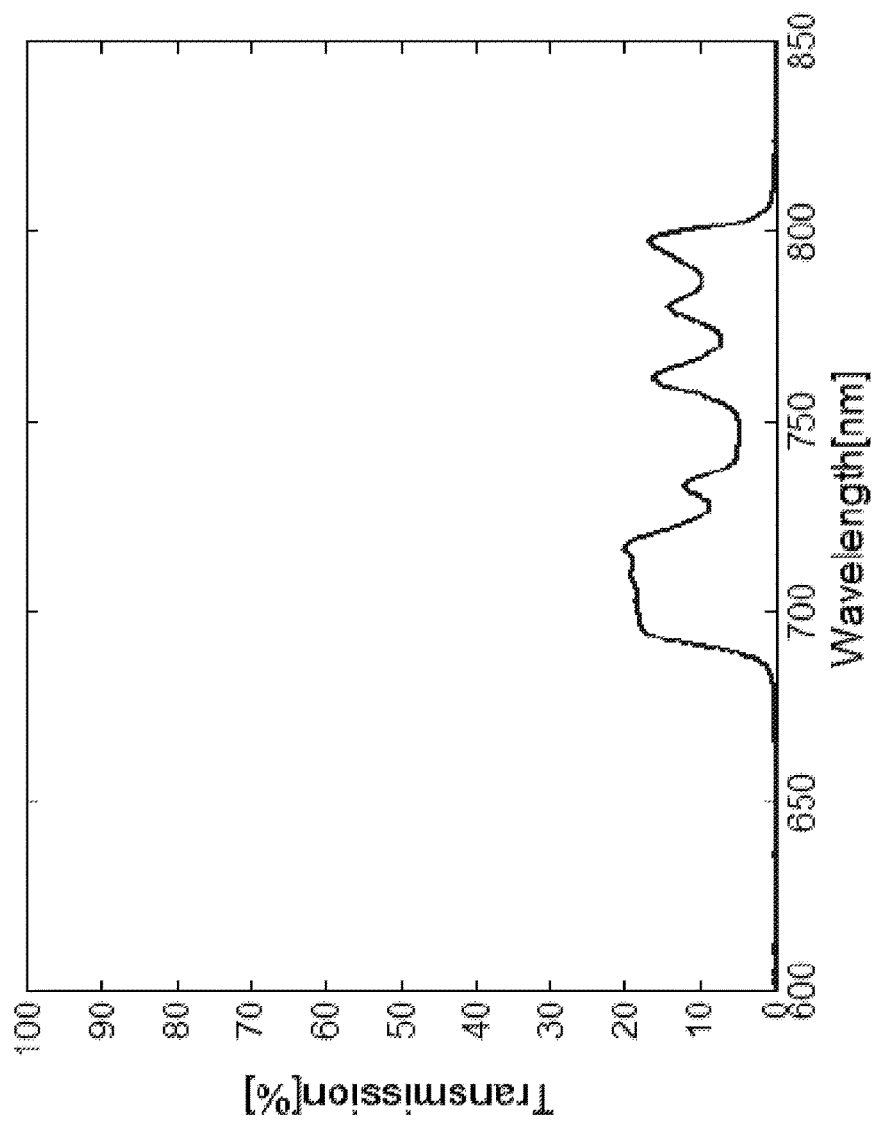
FIG. 44 illustrates a graph depicting composite transmission spectra of an example HPDLC tunable filter stack comprising five HPDLC filter elements, in conjunction with short and long pass filters.

In another example testing scenario, the HPDLC filter elements of the example HPDLC tunable filter stack can be sequentially switched during acquisition of hyperspectral imaging data. To facilitate sequential switching and acquisition of hyperspectral imaging data, the hyperspectral imaging system can be modified to incorporate the McBeth color chart and short pass and long pass filters with cut offs at 800 nm and 700 nm, respectively. A schematic of this system is depicted in FIG. 43. FIG. 44 illustrates a composite transmission spectra of an example HPDLC tunable filter stack comprising five HPDLC filter elements, along with the short and long pass filters.

The McBeth color checker chart is an industry standard that provides a non-subjective comparison with a test pattern of 24 scientifically prepared colored squares. Each color square represents a natural object, such as human skin, foliage, blue sky, etc., thereby providing a qualitative reference to quantifiable values. Each color will reflect light in the same way in all parts of the visible spectrum, thus maintaining color consistency over different illumination options.

Figure 45:
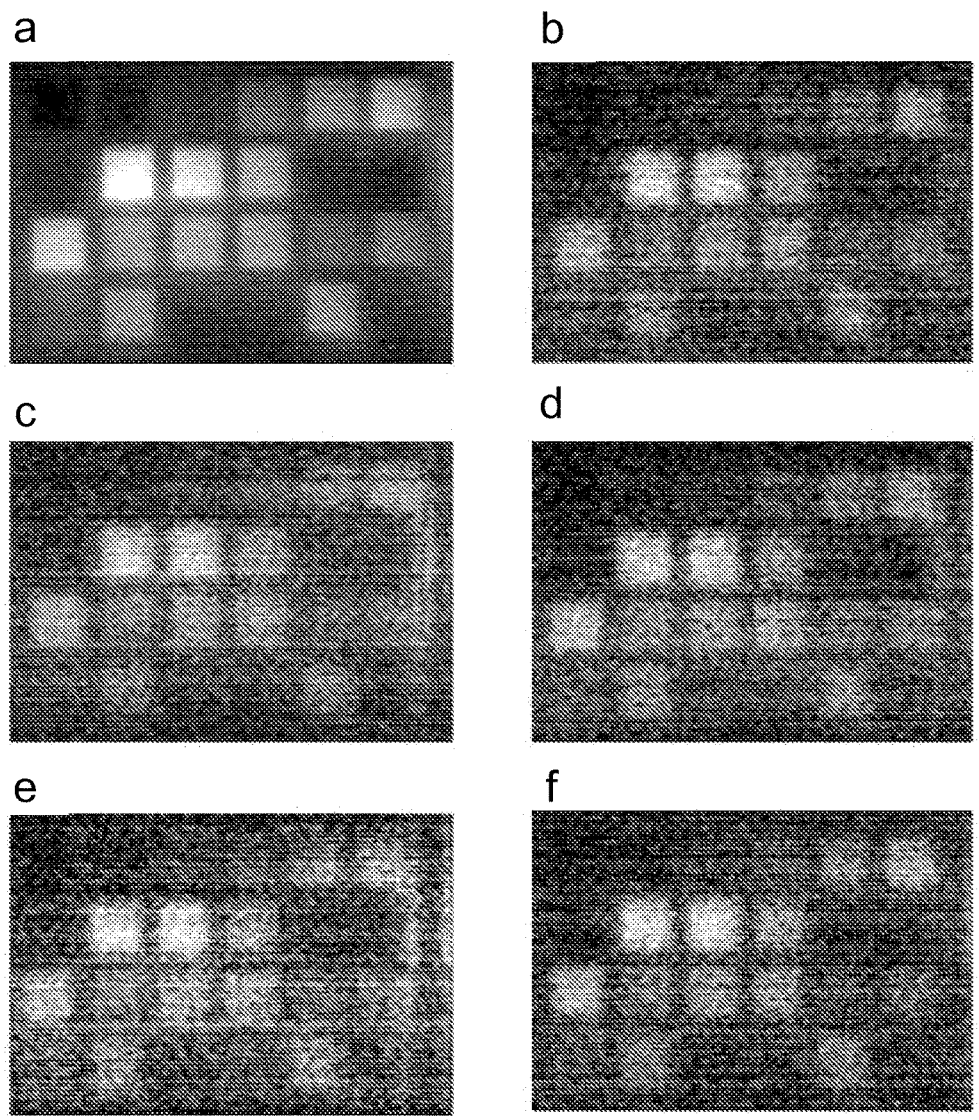
FIGS. 45a-f illustrate images of the McBeth color chart acquired at different wavelengths.

During testing, each HPDLC filter element in the stack was sequentially switched in order to acquire an image of the color checker chart at that respective wavelength. FIGS. 45a-f illustrate images of the McBeth chart acquired at different wavelengths. More specifically, FIG. 45a depicts an image of the color checker in the 700 nm-800 nm visible range, FIG. 45b depicts an image of the color checker at 727 nm, FIG. 45c depicts an image of the color checker at 741 nm, FIG. 45d depicts an image of the color checker at 751 nm, FIG. 45e depicts an image of the color checker at 769 nm, and FIG. 45f depicts an image of the color checker at 785 nm. These images form the basis of a hyper spectral cube which allows plotting of the spectra of a particular entity in the images at various wavelengths.

Figure 46:
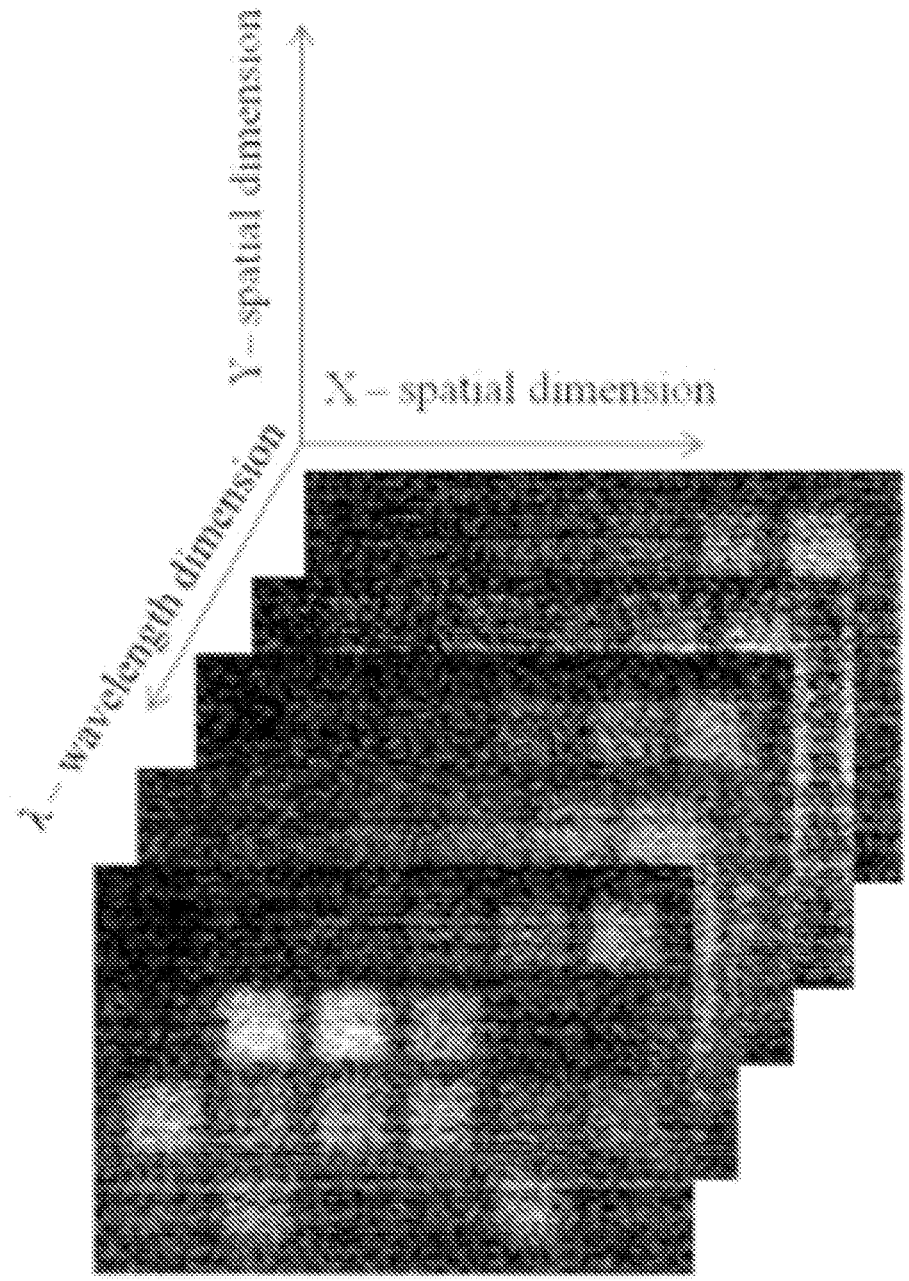
FIG. 46 illustrates a hyperspectral cube formed from hyperspectral imaging data acquired through an example HPDLC tunable filter stack via sequential switching.
Figure 47:
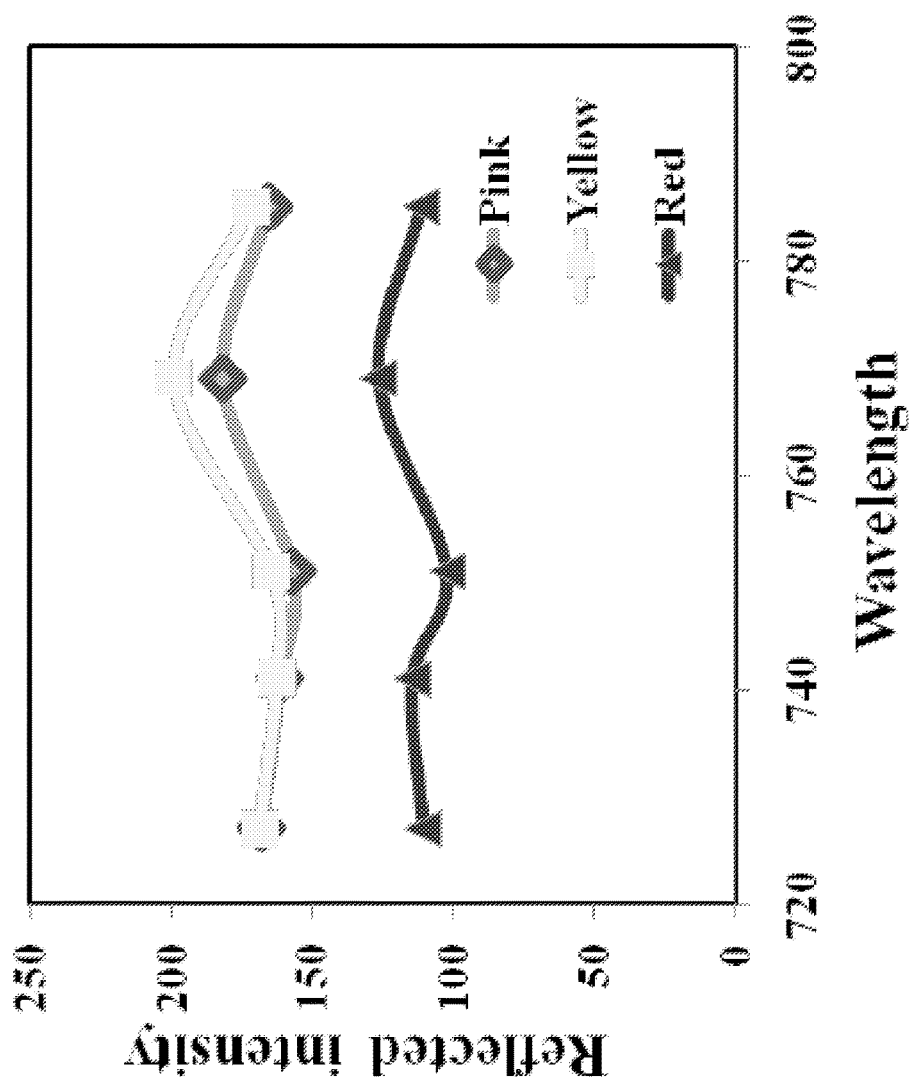
FIG. 47 depicts reflectance extracted from the hyperspectral cube for three different colors pink, red and yellow at varying wavelengths.

FIG. 46 illustrates a hyperspectral cube formed from hyperspectral imaging data acquired through the example HPDLC tunable filter stack via sequential switching. This figure illustrates three dimensions where x and y are the spatial dimensions and λ is the wavelength dimension. FIG. 47 depicts reflectance extracted from the hyperspectral cube for three different colors pink, red and yellow at 727 nm, 741 nm, 751 nm, 769 nm, and 785 nm. This kind of reflectance spectra enables identification of specific materials in the image. Of course in a real world application, reflectance due to atmosphere has to be accounted for while plotting the actual reflectance spectra of the desired object in the image.

Undesirable characteristics exhibited by an HPDLC tunable filter stack, for instance wavelength dependent scattering, especially at lower wavelengths, and/or out of band increase in transmission after switching needs, can be mitigated by fabricating HPDLC filter elements with close to 100% reflection efficiencies, in which case the LC droplet size in the polymer matrix can be well below the critical limit for scattering. HPDLC filter elements with close to 100% reflection efficiencies may exhibit increased switching voltage and/or faster switching times, while maintaining polarization insensitivity.

Figure 48:
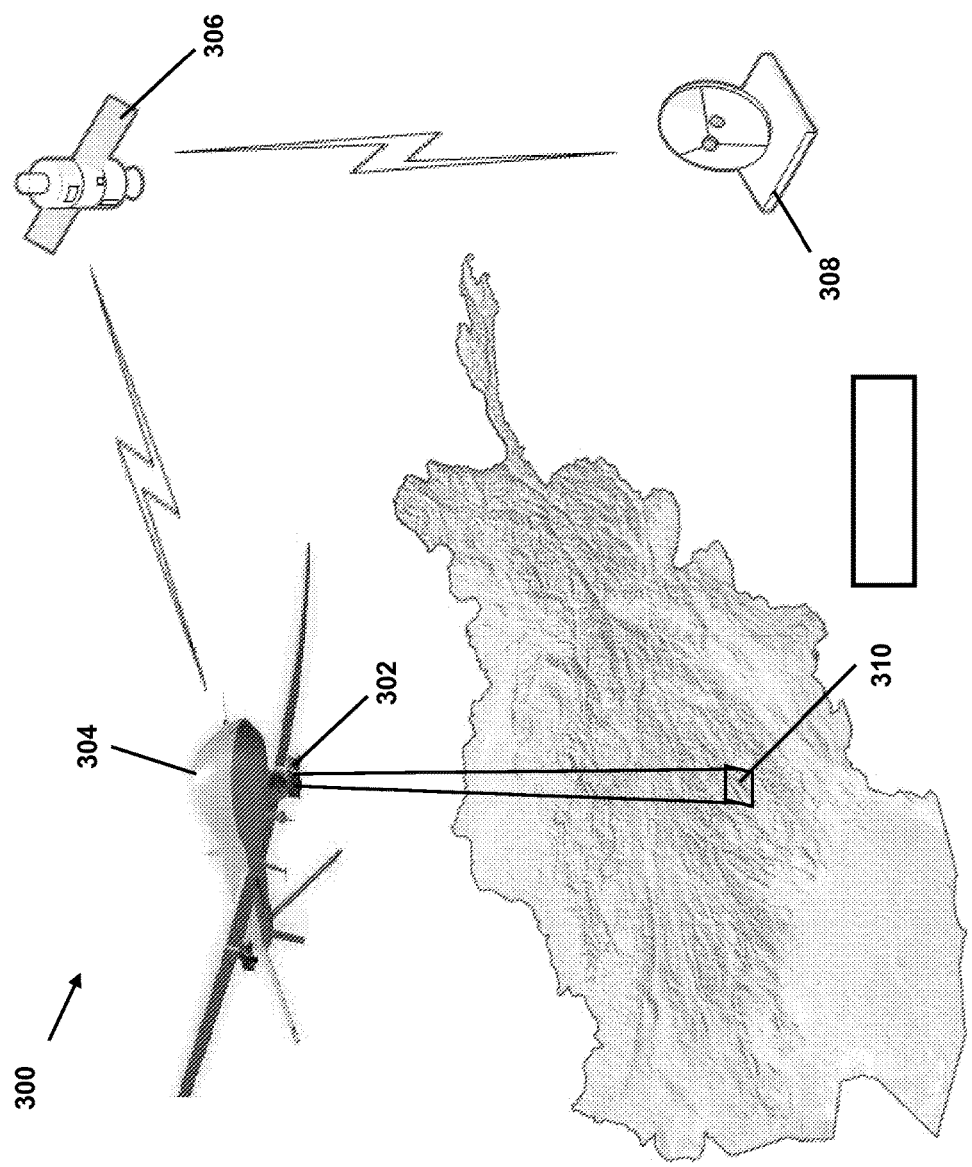
FIG. 48 depicts a hyperspectral imaging system that includes a hyper spectral imager comprising an HPDLC tunable filter stack, the hyper spectral imager mounted to a moving platform.

In an example application of the HPDLC tunable filter stack utilized for hyperspectral imaging (HSI), a hyperspectral imager comprising an HPDLC tunable filter stack can be mounted to a moving platform. FIG. 48 depicts a hyperspectral imaging system 300 that includes a hyper spectral imager 302 mounted to a moving platform 304. The hyperspectral imager 302 can be configured to be carried by the platform 304, for instance to facilitate remote acquisition of hyperspectral imaging data. For example, in accordance with the illustrated embodiment, the hyper spectral imager 302 can be mounted to a moving platform 304 configured to facilitate airborne acquisition of hyperspectral imaging data, such as the depicted moving platform 304 in the form of unmanned aerial vehicle (UAV). The hyper spectral imager 302 can comprise at least one HPDLC tunable filter stack. That is, the hyper spectral imager 302 can comprise a single HPDLC tunable filter stack. Alternatively, the hyper spectral imager 302 can comprise an HPDLC tunable filter comprising a plurality of HPDLC tunable filter stacks, such as discrete HPDLC tunable filter stacks, each stack configured to facilitate acquisition of hyperspectral imaging data throughout a discrete spectrum of wavelengths.

The example HPDLC tunable filter stack of the hyperspectral imager 302 can be fabricated to facilitate the acquisition of hyperspectral imaging data, for instance pertaining to a scene of interest 310, throughout the near infrared wavelength range (e.g., approximately 780 nm to approximately 3 µm), but the HPDLC tunable filter stack can alternatively be fabricated to facilitate the acquisition of hyperspectral imaging data pertaining to a scene of interest 310 in and/or throughout frequency bands in the visible wavelength range (e.g., approximately 390 nm to approximately 780 nm), the near infrared range (e.g., approximately 780 nm to approximately 3 µm), and at least a portion of the mid infrared wavelength range (e.g., approximately 3 µm to approximately 12 µm) in any combination. It should be appreciated that the HPDLC tunable filter stack can be fabricated to facilitate the acquisition of hyperspectral imaging data pertaining to a scene of interest 310 within the mid infrared range (e.g., approximately 12 µm to approximately 50 µm), and/or the far infrared range (e.g., approximately 50 µm to approximately 1000 µm), however absorption characteristics attributable to the chemical composition of the polymer layers may at least partially hinder performance of the HPDLC tunable filter stack.

The hyperspectral imaging system 300 can further comprise one or more communication relay devices, for instance the satellite 306 and/or the ground based antenna 308. In accordance with the illustrated embodiment, the hyperspectral imager 302 can be mounted to the moving platform 304 such that the hyperspectral imager 302 can acquire imaging data from a scene of interest 310, such as a portion of terrain over which the UAV is flying. The hyperspectral imager 302 can be attached to the moving platform 304 such that the hyperspectral imager 302 can maintain focus on a particular scene of interest 310, for instance by enabling rotation along multiple axes of the hyperspectral imager 302 relative to the moving platform 304.

Hyperspectral imaging data acquired by the hyperspectral imager 302 can be analyzed and transmitted to interested parties via communication relay devices such as the satellite 306 and/or the ground based antenna 308. For instance, hyperspectral imaging data can be acquired by the hyperspectral imager 302 and transmitted directly by the moving platform 304 to the ground based antenna 308 for subsequent analysis. Alternatively, the hyperspectral imaging data can be acquired by the hyperspectral imager 302 and transmitted to the ground based antenna 308 via the satellite 306. It should be appreciated that the hyperspectral imaging system 300 is not limited to the illustrated configuration, and that the hyperspectral imaging system 300 can be differently configured as desired. For instance, the acquired hyperspectral imaging data can be analyzed by the moving platform 304, and can be transmitted using different communication relay devices, etc. It should further be appreciated that the hyperspectral imaging system 300 is not limited to the illustrated moving platform 304, and that the hyperspectral imaging system 300 can alternatively be configured with any other suitable moving platform 304, or any suitable stationary platform, as desired.

Figure 49:
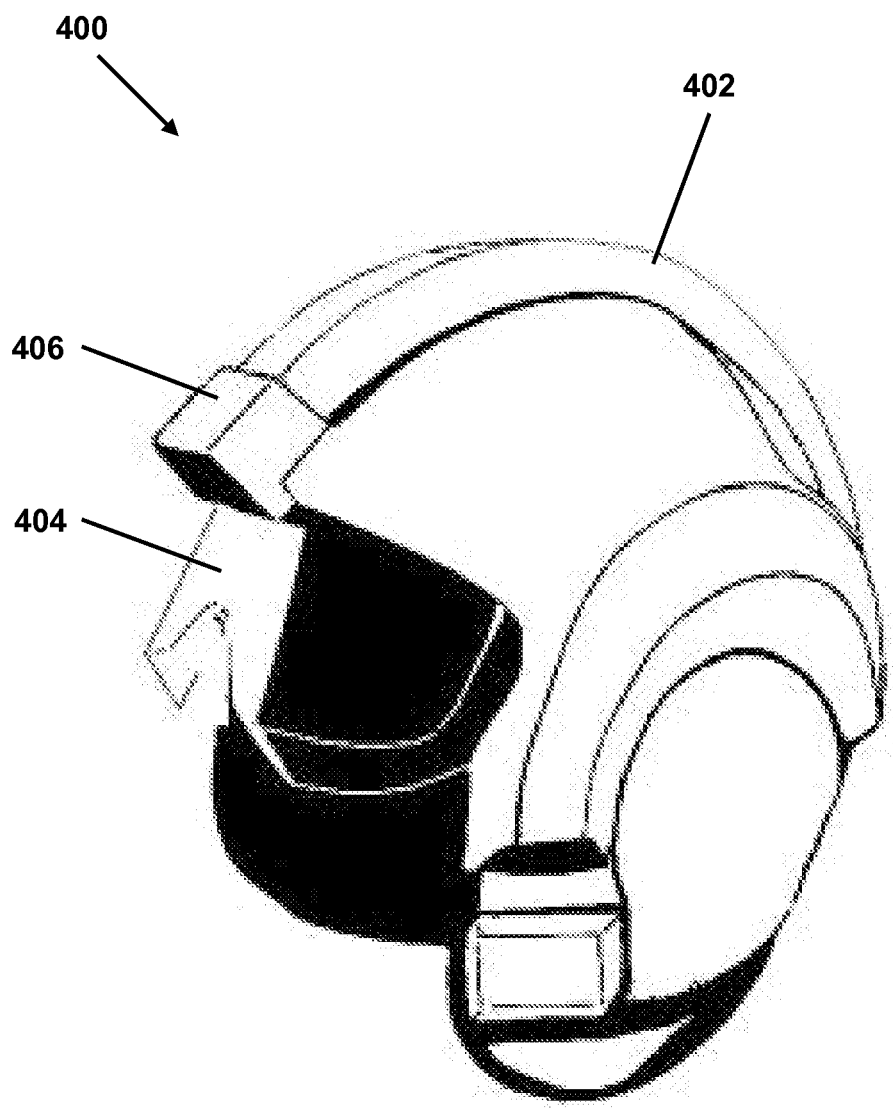
FIG. 49 depicts a switchable optical shielding system comprising an aviator helmet and a visor that utilizes at least one HPDLC tunable filter stack, in accordance with an embodiment.

In another example application, an HPDLC tunable filter stack can be fabricated as a high-speed switchable optical shield. For example, FIG. 49 depicts a switchable optical shielding system 400 comprising an aviator helmet 402 and a visor 404 that utilizes an HPDLC tunable filter stack. In an alternative embodiment, the aviator helmet 402 can be omitted from the switchable optical shielding system 400. The visor 404 can comprise at least one, such as a plurality of HPDLC tunable filter stacks integrated with the visor 404. For instance, the at least one HPDLC tunable filter stack can be applied (e.g., adhered) to a portion, such as an entirety of a surface of the visor 404, for instance a portion, such as the entirety of the inner surface of the visor 404, a portion, such as the entirety of the outer surface of the visor 404, or any combination thereof. The at least one HPDLC tunable filter stack can be adhered to a respective surface of the visor 404 as a coating. The at least one HPDLC tunable filter stack can comprise a single HPDLC tunable filter stack sized and shaped to coat a respective surface of the visor 404. Alternatively, the at least one HPDLC tunable filter stack can comprise a plurality of HPDLC tunable filter stacks adhered to respective portions of a surface of the visor 404, thereby covering discrete portions of, or the entirety of, the respective surface of the visor 404. For example the at least one HPDLC tunable filter stack can comprise a plurality of HPDLC tunable filter stacks disposed adjacent to one another along a surface of the visor 404. The at least one HPDLC tunable filter stack can be fabricated to conform to the respective surface geometries of the visor 404. For instance, the HPDLC filter elements of the stack can be fabricated with curved Bragg gratings, as described herein elsewhere.

In accordance with the illustrated embodiment, the at least one HPDLC tunable filter stack of the switchable optical shielding system 400 is switchable between transparent and reflective states, as described in more detail below. When the at least one HPDLC tunable filter stack is switched into the reflective state, the HPDLC tunable filter stack can reflect light incident on the visor 404 throughout the visible wavelength range (e.g., approximately 390 nm to approximately 780 nm) and the near infrared wavelength range (e.g., approximately 780 nm to approximately 1.2 µm), that is through an effective wavelength range of approximately 390 nm to approximately 1.2 µm, but the at least one HPDLC tunable filter stack can alternatively be fabricated to reflect incident light in and/or throughout the visible wavelength range (e.g., approximately 390 nm to approximately 780 nm), the near infrared range (e.g., approximately 780 nm to approximately 3 µm), and at least a portion of the mid infrared wavelength range (e.g., approximately 3 µm to approximately 12 µm) in any combination. It should be appreciated that the at least one HPDLC tunable filter stack can be fabricated to reflect incident light within the mid infrared range (e.g., approximately 12 µm to approximately 50 µm) and/or the far infrared range (e.g., approximately 50 µm to approximately 1000 µm), however absorption characteristics attributable to the chemical composition of the polymer layers may at least partially hinder performance of the at least one HPDLC tunable filter stack.

The at least one HPDLC tunable filter stack exhibits switching response times of approximately 20 µs. In other words, the at least one HPDLC tunable filter stack can be switched from the transparent state to the reflective state in approximately 20 µs, and from the reflective state to the transparent state in approximately 20 µs. It should be appreciated that the switchable optical shielding system 400 is not limited to switching response times of approximately 20 µs, and that the at least one HPDLC tunable filter stack can alternatively be fabricated to exhibit faster switching times. For example, switching times of approximately 1 µs to 2 µs can be achieved by doping the prepolymer mixture of the HPDLC filter elements with carbon based nanoparticles during fabrication.

The at least one HPDLC tunable filter stack can be placed in electrical communication with a power source, for instance a power source provided to the helmet 402. The power source can be configured to simultaneously apply respective switching voltages to each of the respective HPDLC filter elements comprising the HPDLC tunable filter stack, such that the at least one HPDLC tunable filter stack can be maintained in the transparent, completely biased state, so as to allow light incident on the visor 404 to pass through to a wearer of the helmet 402. The switchable optical shielding system 400 can be configured to receive a switching signal, for example a switching signal generated by a sensor 406 communicatively coupled to the visor 404, and in particular to the at least one HPDLC tunable filter stack. In accordance with the illustrated embodiment, the sensor 406 can be attached to or integral to the helmet 402. Upon receiving the switching signal, the switchable optical shielding system 400 can at least temporarily interrupt the delivery of power to one or more HPDLC filter elements of the at least one HPDLC tunable filter stack, thereby causing the at least one, such as all of the HPDLC filter elements of the HPDLC tunable filter stack to switch from the transparent state to the reflective state and to reflect respective wavelengths of light incident upon the visor 404.

The power to the HPDLC tunable filter stack can be interrupted for a predetermined amount of time, for instance an interval of time adequate to allow a sudden high intensity flash of light to mitigate, thereby causing the at least one HPDLC tunable filter stack to switch from the transparent state to the reflective state and to act as an optical shield relative to the wearer of the helmet 402. It should be appreciated that the sensor 406 need not be attached to or integral to the helmet 402, and that the sensor 406 can alternatively be attached to or integral to an aircraft associated with the helmet 402, can be attached to or integral to the visor 404, or can be located remotely and can transmit the switching signal to the switchable optical shielding system 400. It should further be appreciated that the switchable optical shielding system 400 is not limited to a single sensor 406. For instance, the switchable optical shielding system 400 can comprise a plurality of sensors 406, such as an array of redundant sensors, wherein sensors of the array can be attached to or integral to the helmet 402, attached to or integral to an aircraft associated with the helmet 402, attached to or integral to the visor 404, located remotely, or any combination thereof.

Figure 50:
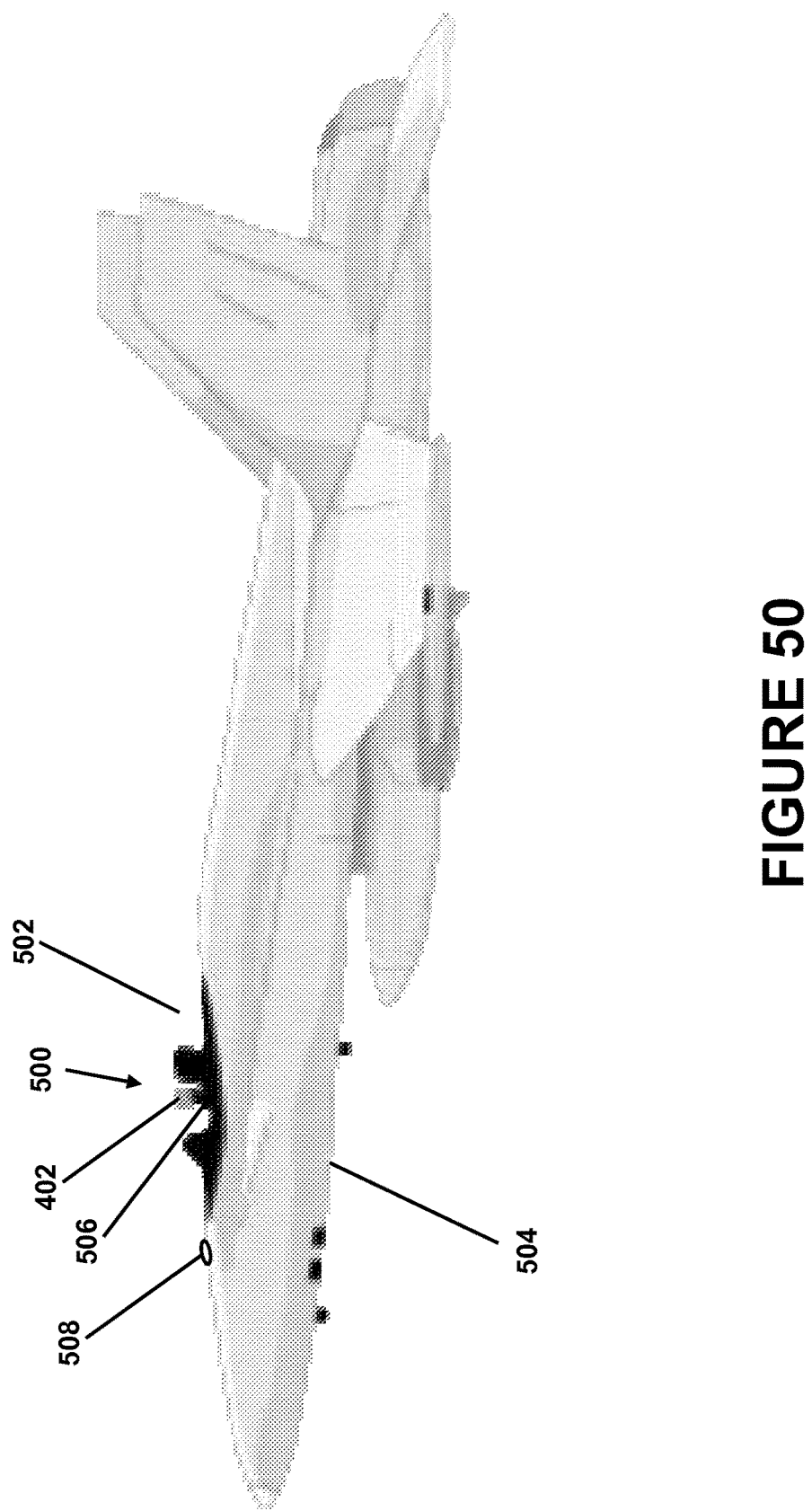
FIG. 50 depicts a switchable optical shielding system comprising an aircraft canopy that utilizes at least one HPDLC tunable filter stack, in accordance with another embodiment.

FIG. 50 illustrates another example embodiment of a high-speed switchable optical shielding system 500 comprising an aircraft canopy 502 that utilizes at least one HPDLC tunable filter stack. The aircraft canopy 502 can be mounted to an aircraft 504 and operate as a transparent enclosure over the cockpit of the aircraft 504. Typically, the function of an aircraft canopy is to provide a weatherproof and reasonably quiet environment for the aircraft's occupants, such as the pilot, co-pilot, and the like. FIG. 50 depicts an example canopy 502 shaped for use with the military aircraft 504, but it should be appreciated that the canopy 502 can be alternatively sized and/or shaped for use with any other type of aircraft as desired. The illustrated canopy 502 can comprise at least one, such as a plurality of HPDLC tunable filter stacks integrated with the canopy 502. For instance, the at least one HPDLC tunable filter stack can be applied (e.g., adhered) to a portion, such as an entirety of a surface of the canopy 502, for instance a portion, such as the entirety of the inner surface of the canopy 502, a portion, such as the entirety of the outer surface of the canopy 502, or any combination thereof. The at least one HPDLC tunable filter stack can be adhered to a respective surface of the canopy 502 as a coating. The at least one HPDLC tunable filter stack can comprise a single HPDLC tunable filter stack sized and shaped to coat a respective surface of the canopy 502. Alternatively, the at least one HPDLC tunable filter stack can comprise a plurality of HPDLC tunable filter stacks adhered to respective portions of a surface of the canopy 502, thereby covering discrete portions of, or the entirety of, the respective surface of the canopy 502. For example the at least one HPDLC tunable filter stack can comprise a plurality of HPDLC tunable filter stacks disposed adjacent to one another along a surface of the canopy 502. The at least one HPDLC tunable filter stack can be fabricated to conform to the respective surface geometries of the canopy 502. For instance, the HPDLC filter elements of the stack can be fabricated with curved Bragg gratings, as described herein elsewhere.

In accordance with the illustrated embodiment, the at least one HPDLC tunable filter stack of the switchable optical shielding system 500 is switchable between transparent and reflective states, as described in more detail below. When the at least one HPDLC tunable filter stack is switched into the reflective state, the HPDLC tunable filter stack can reflect light incident on the canopy 502 throughout the visible wavelength range (e.g., approximately 390 nm to approximately 780 nm), the near infrared wavelength range (e.g., approximately 780 nm to approximately 3 µm), and at least a portion of the mid infrared wavelength range (e.g., approximately 3 µm to approximately 12 µm), that is through an effective wavelength range of approximately 390 nm to approximately 12 µm, but the at least one HPDLC tunable filter stack can alternatively be fabricated to reflect incident light in and/or throughout the visible wavelength range (e.g., approximately 390 nm to approximately 780 nm), the near infrared range (e.g., approximately 780 nm to 3 µm), and at least a portion of the mid infrared wavelength range (e.g., approximately 3 µm to approximately 12 µm) in any combination. It should be appreciated that the at least one HPDLC tunable filter stack can be fabricated to reflect incident light within the mid infrared range (e.g., approximately 12 µm to approximately 50 µm), and/or the far infrared range (e.g., approximately 50 µm to approximately 1000 µm) however absorption characteristics attributable to the chemical composition of the polymer layers may at least partially hinder performance of the at least one HPDLC tunable filter stack.

The at least one HPDLC tunable filter stack exhibits switching response times of approximately 20 µs. In other words, the at least one HPDLC tunable filter stack can be switched from the transparent state to the reflective state in approximately 20 µs, and from the reflective state to the transparent state in approximately 20 µs. It should be appreciated that the switchable optical shielding system 500 is not limited to switching response times of approximately 20 μs, and that the at least one HPDLC tunable filter stack can alternatively be fabricated to exhibit faster switching times. For example, switching times of approximately 1 μs to 2 μs can be achieved by doping the prepolymer mixture of the HPDLC filter elements with carbon based nanoparticles during fabrication.

The at least one HPDLC tunable filter stack can be placed in electrical communication with a power source, for instance a power source provided to the canopy 502 by the aircraft 504. The power source can be configured to simultaneously apply respective switching voltages to each of the respective HPDLC filter elements comprising the HPDLC tunable filter stack, such that the at least one HPDLC tunable filter stack can be maintained in the transparent, completely biased state, so as to allow light incident on the canopy 502 to pass through to occupants, such as a pilot 506 of the aircraft 504. The switchable optical shielding system 500 can be configured to receive a switching signal, for example a switching signal generated by a sensor 508, for instance a sensor communicatively coupled to the canopy 502, and in particular to the at least one HPDLC tunable filter stack. In accordance with the illustrated embodiment, the sensor 508 can be attached to or integral to the aircraft 504. The sensor 508 can be configured to transmit a switching signal to the at least one HPDLC tunable filter stack in response to a trigger. For example, the sensor 508 can be triggered to transmit a switching signal to the at least one HPDLC tunable filter stack when light of a particular wavelength is sensed by the sensor 508. Upon receiving the switching signal, the switchable optical shielding system 500 can at least temporarily interrupt the delivery of power to one or more HPDLC filter elements of the at least one HPDLC tunable filter stack, thereby causing the at least one, such as all of the HPDLC filter elements of the HPDLC tunable filter stack to switch from the transparent state to the reflective state and to reflect respective wavelengths of light incident upon the canopy 502.

The power to the HPDLC tunable filter stack can be interrupted for a predetermined amount of time, for instance an interval of time adequate to allow a sudden high intensity flash of light to mitigate, thereby causing the at least one HPDLC tunable filter stack to switch from the transparent state to the reflective state and to act as an optical shield relative to occupants of the aircraft 504, such as the pilot 506. It should be appreciated that the sensor 508 need not be attached to or integral with the aircraft 504, and that the sensor 508 can alternatively be attached to or integral to an article supported by an occupant of the aircraft, such as a helmet 402 worn by the pilot 506, or can be located remotely and can transmit the switching signal to the switchable optical shielding system 500. It should further be appreciated that the switchable optical shielding system 500 is not limited to a single sensor 508. For instance, the switchable optical shielding system 500 can comprise a plurality of sensors, such as an array of redundant sensors, wherein sensors of the array can be attached to or integral with the aircraft 504, attached to or integral with an article supported by an occupant, located remotely, or any combination thereof. It should further still be appreciated that one or more components of the switchable optical shielding systems 400, 500 can be configured to operate in concert with one another. For instance, HPDLC tunable filter stacks attached to the visor 404 and the canopy 502 can be switched simultaneously, for instance in response to a common switching signal, thereby providing redundant optical shielding to occupants in the aircraft wearing the helmet 402 and at least partially surrounded by the canopy 502.

Although the tunable electro-optic filter stack has been described herein with reference to preferred embodiments and/or preferred methods, it should be understood that the words which have been used herein are words of description and illustration, rather than words of limitation, and that the scope of the instant disclosure is not intended to be limited to those particulars, but rather is meant to extend to all structures, methods, and/or uses of the herein described tunable electro-optic filter stack. Those skilled in the relevant art, having the benefit of the teachings of this specification, may effect numerous modifications to the tunable electro-optic filter stack as described herein, and changes may be made without departing from the scope and spirit of the instant disclosure, for instance as recited in the appended claims.

What is claimed:

1. A hyperspectral imaging system comprising:
a hyperspectral imager that includes a holographic polymer dispersed liquid crystal (HPDLC) tunable optical filter through which light passes, the hyperspectral imager configured to acquire and spectrally multiplex hyperspectral imaging data, wherein:
the HPDLC tunable optical filter comprises a stacked assembly of two or more HPDLC thin film elements, each HPDLC thin film element being switchable between a light reflecting state and a transparent or semitransparent state with a switching time of no more than twenty microseconds; and
each HPDLC thin film element, when in its light reflecting state, reflects a different Bragg wavelength than the other HPDLC thin film elements such that when exposed to incident light and in its respective reflecting state, each HPDLC thin film element allows a different spectrum of incident light to be transmitted through the stack,
the collective sets of spectra of incident light from the plurality of HPDLC thin film elements being the hyperspectral imaging data.

2. The hyperspectral imaging system of claim 1, wherein a first holographic polymer dispersed liquid crystal thin film of the plurality abuts a first surface of an intervening conductive layer and a second holographic polymer dispersed liquid crystal thin film of the plurality abuts an opposed second surface of the intervening conductive layer.

3. The hyperspectral imaging system of claim 1, wherein each of the plurality of holographic polymer dispersed liquid crystal thin films abuts a surface of a conductive element disposed adjacent to the holographic polymer dispersed liquid crystal thin film element.

4. The hyperspectral imaging system of claim 1, wherein the holographic polymer dispersed liquid crystal tunable filter comprises a stack of alternating holographic polymer dispersed liquid crystal thin film elements and conductive elements.

5. The hyperspectral imaging system of claim 4, wherein the conductive elements comprise respective discrete layers of PEDOT:PSS.

6. The hyperspectral imaging system of claim 1, wherein each of the holographic polymer dispersed liquid crystal thin film elements comprises a film thickness of no more than twenty microns.

7. The hyperspectral imaging system of claim 1, wherein the holographic polymer dispersed liquid crystal tunable filter is capable of facilitating the acquisition of hyperspectral imaging data throughout a wavelength range of approximately 780 nm to approximately 3 μm.

8. The hyperspectral imaging system of claim 1, further comprising a transmitter configured to transmit the acquired hyperspectral imaging data.

9. The hyperspectral imaging system of claim 1, further comprising a platform configured to carry the hyperspectral imager, the platform configured to facilitate airborne collection of the hyperspectral imaging data.

10. The operating hyperspectral imaging system of claim 1, wherein each HPDLC thin film element is individually biased between its respective light reflecting and transparent or semitransparent states.

11. The hyperspectral imaging system of claim 1, wherein each HPDLC thin film element, when in its light reflecting state, reflects a different Bragg wavelength with a resolution of less than 10nm.

12. The hyperspectral imaging system of claim 1, wherein the reflection wavelength of each HPDLC thin film element has a full width at half maximum (FWHM) in a range of from 5 to 20nm.

13. An operating hyperspectral imaging system comprising:
   a hyperspectral imager that includes a holographic polymer dispersed liquid crystal (HPDLC) tunable filter, the hyperspectral imager acquiring and spectrally multiplexing hyperspectral imaging data from the tunable filter, wherein:
   the HPDLC tunable filter comprises a stacked assembly of two or more HPDLC thin film elements, each HPDLC thin film element being switched during operation between a light reflecting state and a transparent or semitransparent state with a switching time of no more than twenty microseconds;
   each HPDLC thin film element is designed to reflect a different Bragg wavelength across an operating bandwidth; and
   when exposed to incident light and in its respective light reflecting state, each HPDLC thin film element is generating a unique set of spectral data,
   the collective sets of spectral data from the plurality of HPDLC thin film elements being the hyperspectral imaging data.

14. The operating hyperspectral imaging system of claim 13, wherein the holographic polymer dispersed liquid crystal tunable filter comprises a stack of alternating holographic polymer dispersed liquid crystal thin film elements and conductive elements.

15. The operating hyperspectral imaging system of claim 13, wherein each HPDLC thin film element, when in its light reflecting state, is reflecting a different Bragg wavelength with a resolution of less than 10nm.

16. The operating hyperspectral imaging system of claim 13, wherein each HPDLC thin film element is individually biased between its respective light reflecting and transparent or semitransparent states.

17. The operating hyperspectral imaging system of claim 13, further comprising a transmitter that is transmitting the acquired hyperspectral imaging data.

\* \* \* \* \*